(12) United States Patent
Onishi et al.

(10) Patent No.: US 9,087,893 B2
(45) Date of Patent: Jul. 21, 2015

(54) SUPERJUNCTION SEMICONDUCTOR DEVICE WITH REDUCED SWITCHING LOSS

(75) Inventors: Yasuhiko Onishi, Matsumoto (JP); Mutsumi Kitamura, Matsumoto (JP); Akio Sugi, Matsumoto (JP); Manabu Takei, Matsumoto (JP)

(73) Assignee: FUJI ELECTRIC CO., LTD. (JP)

( * ) Notice: Subject to any disclaimer, the term of this patent is extended or adjusted under 35 U.S.C. 154(b) by 0 days.

(21) Appl. No.: 13/575,984

(22) PCT Filed: Jan. 28, 2011

(86) PCT No.: PCT/JP2011/051831
§ 371 (c)(1),
(2), (4) Date: Oct. 16, 2012

(87) PCT Pub. No.: WO2011/093473
PCT Pub. Date: Aug. 4, 2011

(65) Prior Publication Data
US 2013/0026560 A1 Jan. 31, 2013

(30) Foreign Application Priority Data
Jan. 29, 2010 (JP) ................................. 2010-017901

(51) Int. Cl.
*H01L 29/66* (2006.01)
*H01L 29/78* (2006.01)
(Continued)

(52) U.S. Cl.
CPC ........ *H01L 29/7802* (2013.01); *H01L 29/0634* (2013.01); *H01L 29/0878* (2013.01); *H01L 29/66712* (2013.01); *H01L 29/7813* (2013.01); *H01L 29/1095* (2013.01)

(58) Field of Classification Search
CPC ...................................................... H01L 29/78

USPC .................................. 257/329, 341, 328, 401
See application file for complete search history.

(56) References Cited

U.S. PATENT DOCUMENTS

| 5,216,275 A | 6/1993 | Chen |
| 5,438,215 A | 8/1995 | Tihanyi |

(Continued)

FOREIGN PATENT DOCUMENTS

| DE | 102 45 049 A1 | 4/2004 |
| JP | 62-150769 | 7/1987 |

(Continued)

OTHER PUBLICATIONS

International Search Report for PCT/JP2011/051831. Dated Apr. 26, 2011.

(Continued)

*Primary Examiner* — Jarrett Stark
*Assistant Examiner* — Mohammad M Hoque
(74) *Attorney, Agent, or Firm* — Rossi, Kimms & McDowell LLP

(57) ABSTRACT

A parallel p-n layer (20) is provided as a drift layer between an active portion and an n⁺ drain region (11). The parallel p-n layer (20) is formed by an n-type region (1) and a p-type region (2) being repeatedly alternately joined. An n-type high concentration region (21) is provided on a first main surface side of the n-type region (1). The n-type high concentration region (21) has an impurity concentration higher than that of an n-type low concentration region (22) provided on a second main surface side of the n-type region (1). The n-type high concentration region (21) has an impurity concentration 1.2 times or more, 3 times or less, preferably 1.5 times or more, 2.5 times or less, greater than that of the n-type low concentration region (22). Also, the n-type high concentration region (21) has one-third or less, preferably one-eighth or more, one-fourth or less, of the thickness of a region of the n-type region (1) adjacent to the p-type region (2).

19 Claims, 41 Drawing Sheets

(51) Int. Cl.
*H01L 29/06* (2006.01)
*H01L 29/08* (2006.01)
*H01L 29/10* (2006.01)

(56) References Cited

U.S. PATENT DOCUMENTS

| | | | |
|---|---|---|---|
| 6,081,009 A | 6/2000 | Neilson | |
| 6,097,063 A | 8/2000 | Fujihara | |
| 6,551,909 B1 | 4/2003 | Fujihara | |
| 6,586,801 B2* | 7/2003 | Onishi et al. | 257/339 |
| 2001/0052601 A1* | 12/2001 | Onishi et al. | 257/138 |
| 2002/0060330 A1* | 5/2002 | Onishi et al. | 257/262 |
| 2002/0171093 A1* | 11/2002 | Onishi et al. | 257/197 |
| 2003/0176031 A1* | 9/2003 | Onishi et al. | 438/200 |
| 2004/0056306 A1* | 3/2004 | Saito et al. | 257/341 |
| 2004/0108568 A1 | 6/2004 | Qu | |
| 2005/0048701 A1* | 3/2005 | Minato et al. | 438/135 |
| 2005/0082570 A1 | 4/2005 | Sridevan | |
| 2005/0145933 A1* | 7/2005 | Onishi et al. | 257/328 |
| 2006/0006458 A1* | 1/2006 | Motai et al. | 257/330 |
| 2006/0043481 A1* | 3/2006 | Yamashita et al. | 257/341 |
| 2006/0131644 A1 | 6/2006 | Saito et al. | |
| 2006/0197152 A1* | 9/2006 | Tokano et al. | 257/341 |
| 2007/0132012 A1* | 6/2007 | Saito | 257/327 |
| 2007/0158740 A1 | 7/2007 | Yoshikawa et al. | |
| 2008/0017897 A1* | 1/2008 | Saito et al. | 257/288 |
| 2008/0237774 A1 | 10/2008 | Ono et al. | |

FOREIGN PATENT DOCUMENTS

| | | |
|---|---|---|
| JP | 9-266311 A | 10/1997 |
| JP | 2000-040822 A | 2/2000 |
| JP | 2004-072068 A | 3/2004 |
| JP | 2004-119611 A | 4/2004 |
| JP | 2006-066421 A | 3/2006 |
| JP | 2006-179598 A | 7/2006 |
| JP | 2006-245082 A | 9/2006 |
| JP | 2007-019146 A | 1/2007 |
| JP | 2007-150142 A | 6/2007 |
| JP | 2008-091450 A | 4/2008 |
| JP | 2008-159601 A | 7/2008 |
| JP | 4263787 B2 | 2/2009 |
| JP | 4304433 B2 | 5/2009 |

OTHER PUBLICATIONS

Notice of the First Office Action issued in corresponding Chinese Patent Application No. 2011800075765 dated Aug. 1, 2014. English translation of the text provided.

* cited by examiner

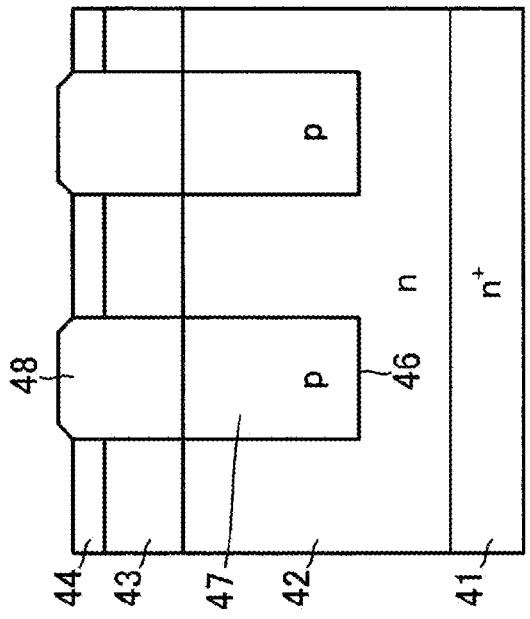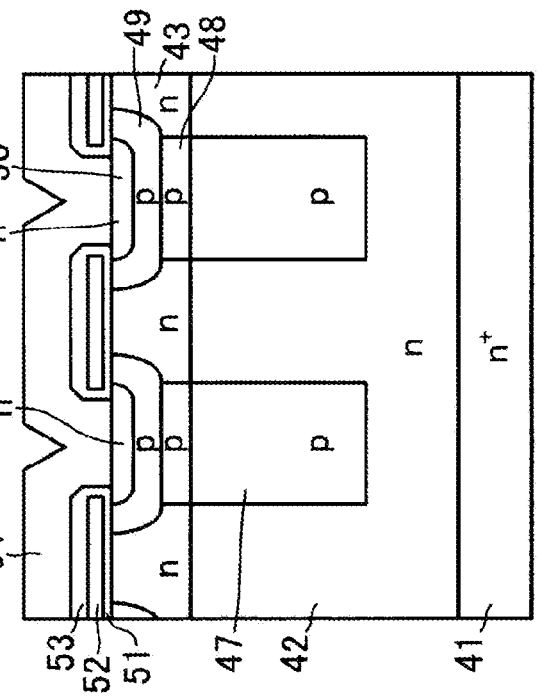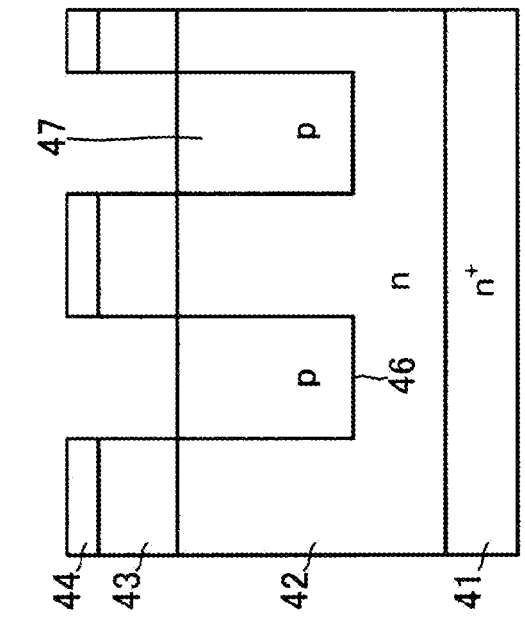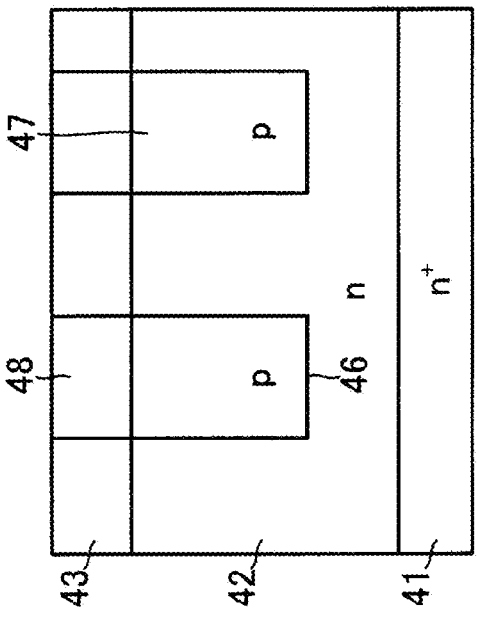
FIG. 32 (a)  FIG. 32 (b)  FIG. 32 (c)  FIG. 32 (d)

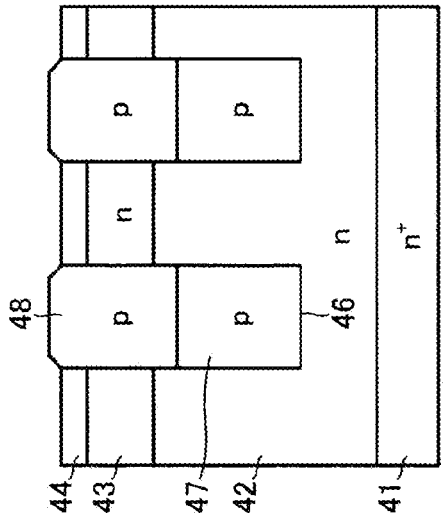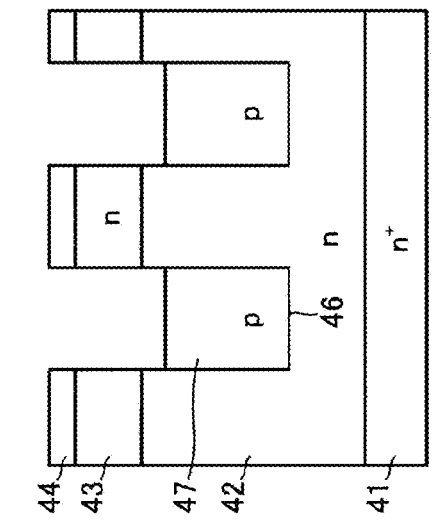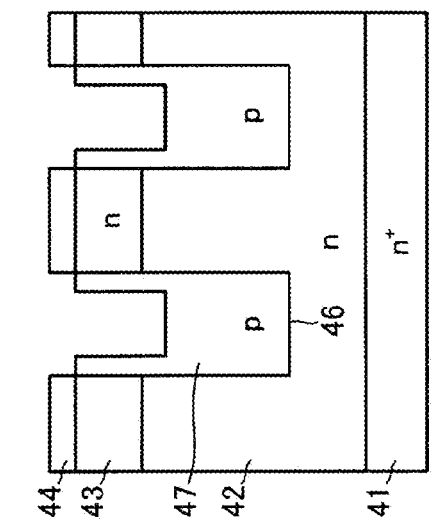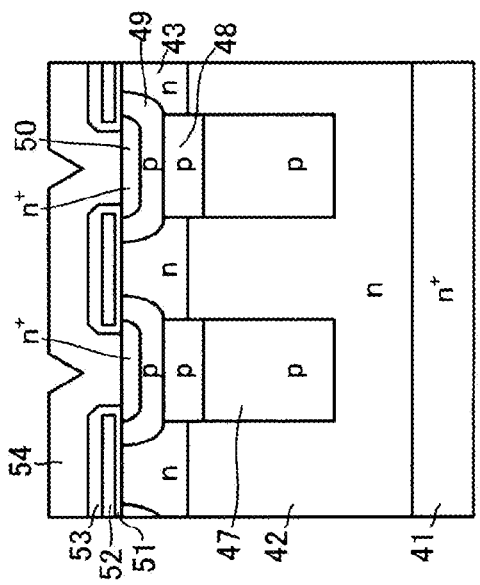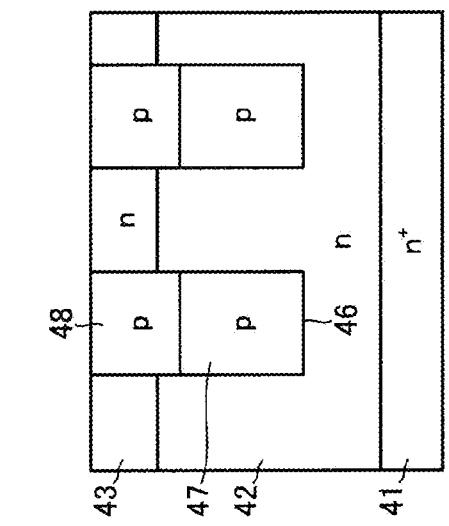
FIG. 34 (a) FIG. 34 (b) FIG. 34 (c) FIG. 34 (d) FIG. 34 (e)

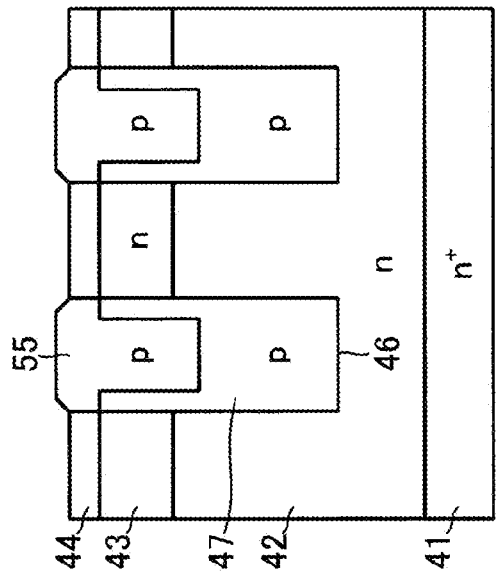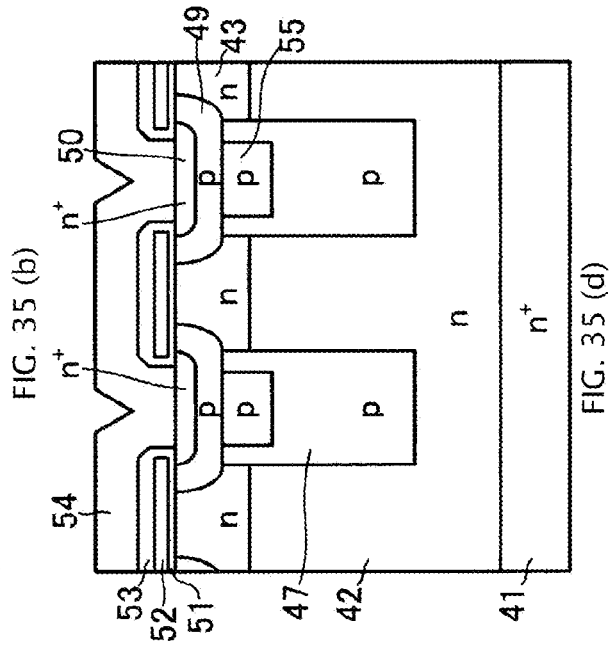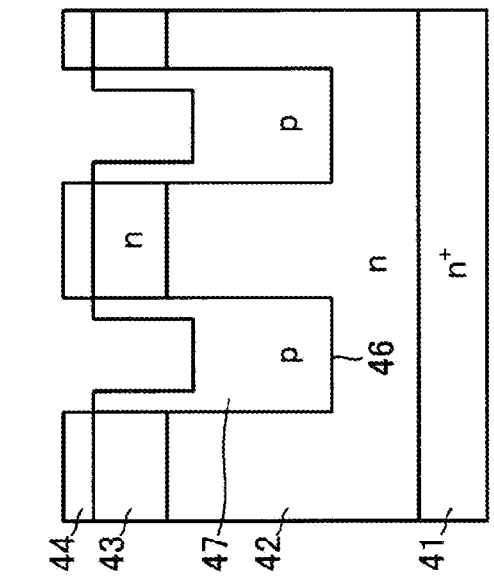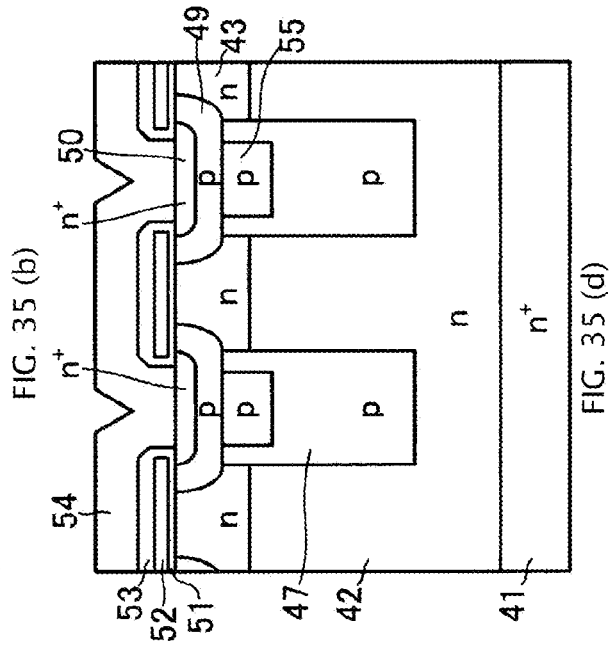

SUPERJUNCTION SEMICONDUCTOR DEVICE WITH REDUCED SWITCHING LOSS

This application is a U.S. National Phase Application of PCT International Application PCT/JP2011/051831 filed on Jan. 28, 2011, which is based on and claims priority from JP 2010-017901 filed on Jan. 29, 2010, the contents of which is incorporated herein in its entirety by reference.

TECHNICAL FIELD

The present invention relates to a semiconductor device.

BACKGROUND ART

In general, semiconductor devices are classified into lateral semiconductor devices, wherein electrodes are formed on one surface of a semiconductor substrate, and vertical semiconductor devices, which have electrodes on both surfaces of a semiconductor substrate. In the vertical semiconductor device, a direction in which a drift current flows in an on-state, and a direction in which a depletion layer caused by a reverse bias voltage extends in an off-state, are the same. In a conventional planar n-channel vertical MOSFET (MOSFET: metal oxide semiconductor field effect transistor), a high resistivity n$^-$ drift layer works as a region that makes a drift current flow in the vertical direction in the on-state. Consequently, as the drift resistance is reduced by shortening the current path of the n$^-$ drift layer, an advantage lowering the on-resistance of the MOSFET is obtained.

Meanwhile, the high resistivity n$^-$ drift layer is depleted in an off-state in order to increase a breakdown voltage. Therefore, when the n$^-$ drift layer becomes thinner, the width of a drain-to-base depletion layer spreading from a p-n junction between a p-base region and the n$^-$ drift layer becomes smaller, and the breakdown voltage decreases. Conversely, as the n$^-$ drift layer is thick in a semiconductor device with high breakdown voltage, the on-resistance increases and the conduction loss increases. In this way, there is a trade-off relationship between on-resistance and breakdown voltage.

It is known that this trade-off relationship is also established in the same way in a semiconductor device such as an IGBT (insulated gate bipolar transistor), bipolar transistor, or diode. Also, the trade-off relationship is also the same in a lateral semiconductor device, wherein a direction in which a drift current flows in the on-state, and a direction in which a depletion layer caused by a reverse bias extends in the off-state, are different.

In the specification and attached drawings, a layer or region being prefixed by n or p means that a large number of electrons or positive holes respectively are carriers. Also, + or − appended to n or p means that there is a higher impurity concentration or lower impurity concentration than in a layer or region to which + or − is not appended.

FIG. 39 is a sectional view showing a heretofore known superjunction semiconductor device. As a method of solving, the problem caused by the heretofore described trade-off relationship, a superjunction (SJ) semiconductor device is commonly known, wherein the drift layer is a parallel p-n layer 120 with an n-type region 101, with an increased impurity concentration, and a p-type region 102 are repeatedly alternately joined. A p-base region 103, an n-type surface region 104, a p contact region 105, an n source region 106, a gate insulating film 107, a gate electrode 108, an interlayer insulating film 109, and a source electrode 110 are provided as a surface structure in an active portion. A drain electrode 112 in contact with an n$^+$ drain region 111 is provided on a second main surface (for example, refer to Patent Document 1, Patent Document 2, and Patent Document 3). The parallel p-n layer 120 is provided between the surface structure and the n$^+$ drain region 111.

FIG. 40 is a diagram showing impurity concentration distributions of the superjunction semiconductor device shown in FIG. 39. FIG. 40 shows an n-type impurity concentration distribution (along a cut line AA-AA') in the second main surface side direction (hereafter referred to as the depth direction) from an end portion (hereafter referred to as the upper end) on the first main surface side of the n-type surface region 104, and a p-type impurity concentration distribution (along a cut line of BR-RW) in the depth direction from the upper end of the p$^+$ contact region 105. A first depth $d_0$ is the depth from the upper end of the p-base region 103 to an end portion (hereafter referred to as the lower end) on the second main surface side of the p-base region 103. A second depth $d_{10}$ is the depth from the lower end of the p-base region 103 to the lower end of the p-type region 102. In FIG. 39, the impurity concentrations of the n-type region 101 and p-type region 102 are even in the depth direction.

In a semiconductor device with this kind of structure, as a depletion layer spreads in a lateral direction from each p-n junction extending in the vertical direction of the parallel p-n layer when in an off-state, depleting the whole drift layer, even when the impurity concentration of the parallel p-n layer is high, it is possible to achieve a high breakdown voltage.

Also, the following kind of device is proposed as another superjunction semiconductor device that achieves an improvement in breakdown voltage and a reduction in on-resistance. The device has a superjunction structure formed by cyclically and alternately disposing a first n-type pillar layer, a p-type pillar layer, and a second n-type pillar layer on an n$^+$ type drain layer. The p-type pillar layer and second n-type pillar layer are such that the impurity concentration on a source electrode side is higher than that on a drain electrode side (for example, refer to Patent Document 4).

Also, as another device, the following kind of device is proposed. The device has a first conductivity type first semiconductor pillar layer formed on a main surface of a first conductivity type first semiconductor substrate, a second conductivity type second semiconductor pillar layer adjacent to the first semiconductor pillar layer, a first conductivity type third semiconductor pillar layer adjacent to the second semiconductor pillar layer, and a second conductivity type semiconductor base layer provided on an upper surface of the second semiconductor pillar layer, and a MOS transistor is formed on the semiconductor base layer. The carrier concentration in an upper side region of the first to third semiconductor pillar layers is set to be higher than the carrier concentration in a lower side region (for example, refer to Patent Document 5).

Also, as another device, the following kind of device is proposed. There is a parallel p-n structure portion wherein an n-type drift region and a p-type partition region are alternately disposed on an n$^+$ drain region, a p-base region is formed on the p-type partition region, and an n$^+$ source region and p$^+$ contact region are formed selectively on a surface layer of the p-base region. A surface n-type drift region with a high impurity concentration is formed above the n-type drift region. A gate electrode is provided across a gate insulating film on the front surface of a p-base region sandwiched by the surface n-type drift region and source region. A source electrode is provided in contact with the front surfaces of both the n$^+$ source region and p$^+$ contact region, and a drain electrode is provided in contact with the backside surface of the n$^+$ drain region. An insulating film is provided in order to isolate the gate electrode and source electrode (for example, refer to Patent Document 6).

Also, as another device, the following kind of device is proposed. A vertical power MOSFET includes a) a drain contact provided on one surface of the MOSFET, including a first conductivity type substrate doped to a high level on the drain contact, b) a blocking layer provided on the opposite side of the substrate to the drain contact, including i) a first plural vertical sections, being parallel hexahedrons having six quadrilateral surfaces, that have a horizontal direction thickness shorter than a vertical direction thickness of the blocking layer, wherein ii) P-conductivity type vertical sections and N-conductivity type vertical sections are alternately disposed on the first plural vertical sections, c) a second plural well regions of a second conductivity type opposite to the first conductivity type provided on one surface of the blocking layer on the side opposite to the substrate, d) a first conductivity type third plural source regions doped to a high level, wherein two of the source regions are disposed inside each of the second plural well regions, e) a fourth plural regions of the first conductivity type provided on one surface of the blocking layer on the side opposite to the substrate, wherein each region extends between two well regions of the second plural well regions, and f) a fifth plural gate poly regions, wherein each gate poly region stretches over one source region inside two adjacent well regions and one of the fourth plural regions (for example, refer to Patent Document 7).

Also, as another device, the following kind of device is proposed. The device includes a first conductivity type first semiconductor layer, a first main electrode electrically connected to the first semiconductor layer, a second conductivity type second semiconductor layer formed inside the first semiconductor layer, disposed cyclically in a lateral direction, wherein the distribution of an amount of impurity in a vertical direction differs from the distribution of an amount of impurity in the vertical direction inside the first semiconductor layer, a second conductivity type third semiconductor layer formed selectively on the surfaces of the first semiconductor layer and second semiconductor layer, a first conductivity type fourth semiconductor layer formed selectively on the surface of the third semiconductor layer, a second main electrode formed so to be joined to the surfaces of the third semiconductor layer and fourth semiconductor layer, and a control electrode formed across a gate insulating film on the surfaces of the first semiconductor layer, third semiconductor layer, and fourth semiconductor layer. The first semiconductor layer has a distribution such that the impurity concentration increases in a vertical direction from the second main electrode toward the first main electrode, while the second semiconductor layer has a distribution such that the impurity concentration is even in a vertical direction from the second main electrode toward the first main electrode (for example, refer to Patent Document 8).

Also, as another device, the following kind of device is proposed. A semiconductor includes first and second main surfaces, main electrodes provided on each of the first and second main surfaces, a first conductivity type low resistance layer between the first and second main surfaces, and a parallel p-n layer wherein a first conductivity type region and a second conductivity type region are alternately disposed, wherein the impurity concentration in the second conductivity type region on the first main surface side is higher than the impurity concentration in the adjacent first conductivity type region, and the impurity concentration in the second conductivity type region on the second main surface side is lower than the impurity concentration in the adjacent first conductivity type region. The impurity concentration in the second conductivity type region is even in the depth direction, and the impurity concentration in the first conductivity type region on the first main surface side is lower than the impurity concentration in the first conductivity type region on the second main surface side (for example, refer to Patent Document 9).

Also, as another device, the following kind of device is proposed. The device includes first conductivity type second semiconductor layers and second conductivity type third semiconductor layers alternately disposed on a first conductivity type first semiconductor layer. The device further includes second conductivity type fourth semiconductor layers disposed so as to be in contact with an upper portion of each third semiconductor layer between the second semiconductor layers, and first conductivity type fifth semiconductor layers formed on the surface of each fourth semiconductor layer. The first semiconductor layer is such that a first conductivity type impurity concentration is lower than that of the second semiconductor layers. The third semiconductor layers include a base portion, and portions with a high amount of impurity locally formed in such a way that the amount of impurity in the depth direction is greater than that of the base portion (for example, refer to Patent Document 10).

RELATED ART DOCUMENTS

Patent Documents

Patent Document 1: U.S. Pat. No. 5,216,275
Patent Document 2: U.S. Pat. No. 5,438,215
Patent Document 3: JP-A-9-266311
Patent Document 4: JP-A-2007-019146
Patent Document 5: JP-A-2006-066421
Patent Document 6: Japanese Patent No. 4,304,433
Patent Document 7: Japanese Patent No. 4,263,787
Patent Document 8: JP-A-2004-119611
Patent Document 9: JP-A-2004-072068
Patent Document 10: JP-A-2006-170598

OUTLINE OF THE INVENTION

Problems to be Solved by the Invention

As a power MOSFET is used as a switching device, there is a demand to, in addition to reducing conduction loss in an on-state, reduce switching loss during switching. The main factors causing an increase in switching loss include, for example, turn-off loss. In order to reduce turn-off loss, it is sufficient to, for example, increase the drain-to-source voltage time change rate (hereafter referred to as turn-off dv/dt) during turn-off. However, increasing the turn-off dv/dt is a cause of noise occurring. Because of this, it is preferable that turn-off dv/dt is low. In this way, there is a trade-off relationship between the turn-off loss and the turn-off dv/dt.

However, with the heretofore described superjunction semiconductor device, a depletion layer spreads completely through the parallel p-n layer at a low drain-to-source voltage in the range of 50 to 100V. Because of this, the gate-to-drain capacitance (mirror capacitance) becomes extremely low, and the turn-off dv/dt increases. It is possible to lower the turn-off dv/dt by using a gate resistor but, as the gate-to-drain capacitance of the SJ-MOSFET is extremely small, it is necessary to use a bigger gate resistance than in a heretofore known MOSFET. When increasing the size of the gate resistance, the mirror period becomes longer, and turn-off loss increases.

FIG. 41 is a diagram showing electrical characteristics when the heretofore known superjunction semiconductor device is turning off. FIG. 41 is a simulation result showing a trade-off relationship between turn-off loss and turn-off dv/dt. From the results shown in FIG. 41, when the turn-off dv/dt is, for example, 10 kV/μs, meeting power source high frequency regulations, the turn-off loss of the heretofore known SJ-MOSFET is about 0.5 mJ. The turn-off loss of the heretofore known MOSFET is about 0.1 mJ.

That is, with the heretofore known superjunction semiconductor device, the trade-off relationship between turn-off loss and turn-off dv/dt is about five times worse in comparison with the heretofore known semiconductor device. Therefore, although it is possible to reduce on-resistance by one-fifth, that advantage is lost. In this way, while it is possible for the superjunction semiconductor device to improve the trade-off relationship between on-resistance and breakdown voltage, the trade-off relationship between turn-off loss and turn-off dv/dt becomes worse.

Also, with the superjunction semiconductor device, when the charge balance of the parallel p-n layer is a charge balance condition such that the breakdown voltage of the device is the highest, the drain-to-source voltage decreases as the drain current increases. That is, negative resistance appears as an avalanche generation strongly occurs, and avalanche withstanding capability decreases.

The invention, in order to solve the problems with heretofore known technology, has an object of providing a semiconductor device wherein a trade-off relationship between turn-off loss and turn-off dv/dt is improved. Also, the invention has an object of providing a semiconductor device wherein avalanche withstanding capability resistance is improved.

Means for Solving the Problems

In order to solve the heretofore described problems, thus achieving the objects, a semiconductor device according to the invention has the following characteristics. The semiconductor device includes an active portion provided on a first main surface side, a low resistivity layer provided on a second main surface side, a parallel p-n layer, provided between the active portion and low resistivity layer, wherein a first conductivity type region and second conductivity type region are disposed alternately, a second conductivity type base region, provided on the first main surface side of the second conductivity type region, that has an impurity concentration higher than that of the second conductivity type region, and a first conductivity type high concentration region, provided on the first main surface side of the first conductivity type region, that is positioned farther to the second main surface side than an end portion on the second main surface side of the second conductivity type base region, and has an impurity concentration higher than an impurity concentration on the second main surface side of the first conductivity type region.

Also, a semiconductor device according to the invention is characterized in that the first conductivity type high concentration region has an impurity concentration 1.2 times or more, 3 times or less, greater than that of a region, excluding the first conductivity type high concentration region, of the first conductivity type region positioned at a depth from the end portion on the second main surface side of the second conductivity type base region to an end portion on the second main surface side of the second conductivity type region.

Also, a semiconductor device according to the invention is characterized by, further including a first conductivity type surface region, provided on the first main surface side of the first conductivity type region, that is in contact with an end portion on the first main surface side of the first conductivity type high concentration region.

Also, a semiconductor device according to the invention is characterized in that the first conductivity type surface region is provided to the same depth as the second conductivity type base region, or shallower on the first main surface side than the second conductivity type base region.

Also, a semiconductor device according to the invention is characterized in that the first conductivity type surface region has an impurity concentration higher than that of the first conductivity type high concentration region.

Also, a semiconductor device according to the invention is characterized in that the first conductivity type high concentration region, including also the first conductivity type surface region, has an impurity concentration 1.2 times or more, 3 times or less, greater than that of a region, excluding the first conductivity type high concentration region, of the first conductivity type region positioned at a depth from the end portion on the second main surface side of the second conductivity type base region to the end portion on the second main surface side of the second conductivity type region.

Also, a semiconductor device according to the invention is characterized in that the first conductivity type high concentration region has one-third or less the thickness of the first conductivity type region positioned at a depth from the end portion on the second main surface side of the second conductivity type base region to the end portion on the second main surface side of the second conductivity type region.

Also, a semiconductor device according to the invention is characterized in that the first conductivity type high concentration region has one-eighth or more, one-fourth or less, the thickness of the first conductivity type region positioned at a depth from the end portion on the second main surface side of the second conductivity type base region to the end portion on the second main surface side of the second conductivity type region.

Also, a semiconductor device according to the invention is characterized in that the first conductivity type high concentration region has an impurity concentration 1.2 times or more, 3 times or less, greater than that of a region of the second conductivity type region adjacent to the first conductivity type high concentration region.

Also, a semiconductor device according to the invention is characterized by further including a second conductivity type high concentration region on the first main surface side that has an impurity concentration higher than the impurity concentration on the second main surface side of the second conductivity type region.

Also, a semiconductor device according to the invention is characterized in that the first conductivity type high concentration region has an impurity concentration 1.5 times or more, 3 times or less, greater than that of a region, excluding the first conductivity type high concentration region, of the first conductivity type region positioned at a depth from the end portion on the second main surface side of the second conductivity type base region to the end portion on the second main surface side of the second conductivity type region.

Also, a semiconductor device according to the invention is characterized in that the second Conductivity type high concentration region has one-eighth or more, one-half or less, the thickness of the second conductivity type region.

Also, a semiconductor device according to the invention is characterized in that the second conductivity type high concentration region has the same thickness as the first conductivity type high concentration region.

Also, a semiconductor device according to the invention is characterized in that a region of the second conductivity type region excluding the second conductivity type high concentration region has the same impurity concentration as a region of the first conductivity type region excluding the first conductivity type high concentration region.

Also, a semiconductor device according to the invention is characterized in that a region of the second conductivity type region excluding the second conductivity type high concentration region is such that the impurity concentration gradually decreases from the first main surface side to the second main surface side.

Also, a semiconductor device according to the invention is characterized in that the first conductivity type high concentration region and second conductivity type high concentration region are such that the impurity concentration gradually decreases from the first main surface side to the second main surface side.

Also, a semiconductor device according to the invention is characterized in that the second conductivity type high concentration region is provided deeper on the second main surface side than the end portion on the second main surface side of the first conductivity type high concentration region.

Also, a semiconductor device according to the invention is characterized in that the region of the second conductivity type high concentration region provided deeper on the second main surface side than the end portion on the second main surface side of the first conductivity type high concentration region has an impurity concentration higher than that of the first conductivity type region adjacent to the region, and has an impurity concentration lower than that of the second conductivity type high concentration region.

Also, a semiconductor device according to the invention is characterized in that the region of the second conductivity type high concentration region provided deeper on the second main surface side than the end portion on the second main surface side of the first conductivity type high concentration region has an impurity concentration 1.2 times or more greater than that of the first conductivity type region adjacent to the region.

Also, a semiconductor device according to the invention is characterized in that the planar form of the first conductivity type region and second conductivity type region is a striped form, a hexagonal lattice form, or a square form.

According to the invention, by providing the first conductivity type high concentration region on the first main surface side of the first conductivity type region, the first main surface side of the first conductivity type region is of a configuration wherein the amount of n-type impurity is greater than on the second main surface side. Because of this, it is difficult for a depletion layer to spread on the first main surface side of the parallel p-n layer, and it is thus possible to prevent the parallel p-n layer from being completely depleted with a low drain-to-source voltage. Due to this, it is possible to prevent the gate-to-drain capacitance from becoming extremely low, and thus possible to prevent turn-off dv/dt from becoming high. Consequently, as there is no longer any need to increase the size of the gate resistance in order to reduce the turn-off dv/dt, it is possible to prevent turn-off loss from increasing.

Also, according to the invention by providing the second conductivity type high concentration region deeper on the second main surface side than the first conductivity type high concentration region, the amount of p-type impurity on the first main surface side of the parallel p-n layer is greater than the amount of n-type impurity. Due to this, it is possible to prevent negative resistance when an avalanche breakdown occurs, and thus possible to improve avalanche withstanding capability.

Advantage of the Invention

According to the semiconductor device according to the invention, there is achieved an advantage in that it is possible to improve the trade-off relationship between turn-off loss and turn-off dv/dt. Also, there is achieved an advantage in that it is possible to improve avalanche withstanding capability.

BRIEF DESCRIPTION OF THE DRAWINGS

FIG. 27-1 is a diagram showing turn off characteristics in the semiconductor device according to Working Example 6.

FIG. 27-2 is a diagram showing turn off characteristics in the semiconductor device according to Working Example 6.

FIG. 28-1 is a diagram showing electrical characteristics in a semiconductor device according to Working Example 7.

FIG. 28-2 is a diagram showing electrical characteristics in the semiconductor device according to Working Example 7.

FIG. 29-1 is a diagram showing turn off characteristics in the semiconductor device according to Working Example 7.

FIG. 29-2 is a diagram showing turn off characteristics in the semiconductor device according to Working Example 7.

FIG. 32 is sectional views showing manufacturing steps (stage 2) of the semiconductor device according to Embodiment 7.

FIG. 34 is sectional views showing manufacturing steps of a semiconductor device according to Embodiment 9.

FIG. 35 is sectional views showing manufacturing steps of a semiconductor device according to Embodiment 10.

MODES FOR CARRYING OUT THE INVENTION

Figure 1:
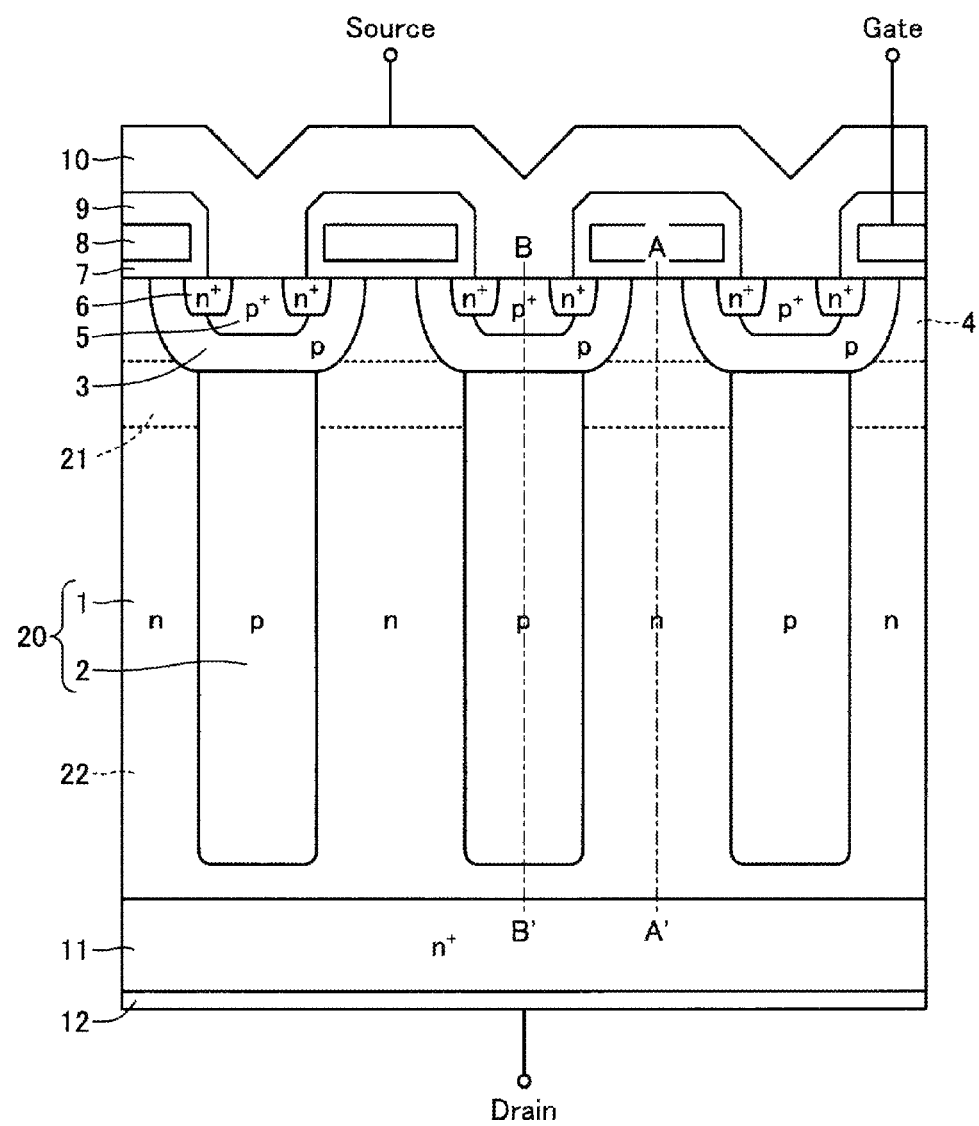
FIG. 1 is a sectional view showing semiconductor device according to Embodiment 1.

Hereafter, referring to the attached drawings, a detailed description will be given of preferred embodiments of a semiconductor device according to the invention. In the following description of the embodiments and attached drawings, the same reference numerals and signs will be given to identical configurations, and a redundant description will be omitted.

Embodiment 1

FIG. 1 is a sectional view showing a semiconductor device according to Embodiment 1. The semiconductor device, shown in FIG. 1 has an active portion on a first main surface side, and has an $n^+$ drain region (a low resistance layer) 11 on a second main surface side. A p-base region (a second conductivity type base region) 3, an n-type surface region (a first conductivity type surface region) 4, a $p^+$ contact region 5, an $n^+$ source region 6, a gate insulating film 7, a gate electrode 8, an interlayer insulating film 9, and a source electrode 10 are provided as, for example, a planar type MOSFET surface structure in the active portion. A drain electrode 12 in contact with the $n^+$ drain region 11 is provided on the second main surface.

A parallel p-n layer 20 is provided as a drift layer between the active portion and the $n^+$ drain region 11. The parallel p-n layer 20 is formed by an n-type region (a first conductivity type region) 1 and a p-type region (a second conductivity type region) 2 being repeatedly alternately joined. The p-type region 2 is provided in such a way that it does not reach the $n^+$ drain region 11. The planar form of the n-type region 1 and p-type region 2 is a striped form, a hexagonal lattice form, or a square form.

The p-base region 3 is provided on the first main surface side of the p-type region 2. Also, the p-base region 3 has a higher impurity concentration than the p-type region 2. The n-type surface region 4 is provided on the first main surface side of the n-type region 1. That is, the n-type surface region 4 is provided between neighboring p-base regions 3, adjoining the p-base regions 3. The n-type surface region 4 may have a higher impurity concentration than an n-type high concentration region 21, to be described hereafter, or may have the same impurity concentration. Also, the n-type surface region 4 may be provided to the same depth as the p-base region 3, or may be provided more shallowly than the p-base region 3. By providing the n-type surface region 4 more shallowly than the p-base region 3, it is possible to arrange that the impurity concentration in the vicinity of a corner on the second main surface side of the p-base region 3 is the same impurity concentration as the impurity concentration on the first main surface side of the p-type region 2. By so doing, it is possible to prevent an electric field from concentrating in the vicinity of a corner on the second main surface side of the p-base region 3, and thus possible to prevent breakdown voltage from decreasing.

The $p^+$ contact region 5 and $n^+$ source region 6 are provided on a surface layer of the p-base region 3, and are in contact with each other. The gate electrode 8 straddles the $n^+$ source region 6, p-base region 3, and n-type region 1 across the gate insulating film 7. The source electrode 10 is in contact with the $p^+$ contact region 5 and $n^+$ source region 6. Also, the source electrode 10 is isolated from the gate electrode 8 by the interlayer insulating film 9.

The n-type high concentration region (first conductivity type high concentration region) 21 is provided on the first main surface side of the n-type region 1. The n-type high concentration region 21 is in contact with an end portion (hereafter referred to as the lower end) on the second main surface side of the n-type surface region 4. Also, the n-type high concentration region 21 has a higher impurity concentration than a region (hereafter referred to as an n-type low concentration region) 22 of the n-type region 1 positioned at a depth from the lower end of the p-base region 3 to the lower end of the p-type region 2, excepting the n-type high concentration region 21.

Also, the n-type high concentration region 21 has one-third or less the thickness (hereafter referred to as the thickness of a region of the n-type region 1 adjoining the p-type region 2) of the n-type region 1 positioned at a depth from the lower end of the p-base region 3 to the lower end of the p-type region 2.

Preferably, the n-type high concentration region 21 has one-eighth or more, one-fourth or less, the thickness of the region of the n-type region 1 adjoining the p-type region 2. By providing the n-type high concentration region 21 with this kind of thickness, the occurrence of a charge imbalance in a junction portion on the first main surface side of the parallel p-n layer 20 is reduced, and a decrease in breakdown voltage is prevented. The thickness of the n-type high concentration region 21 may be, for example, 5.5 μm. The thickness of the p-type region 2 may be, for example, 40 μm. At this time, the thickness of the region of the n-type region 1 adjoining the p-type region 2 is, for example, 40 μm.

Figure 2:
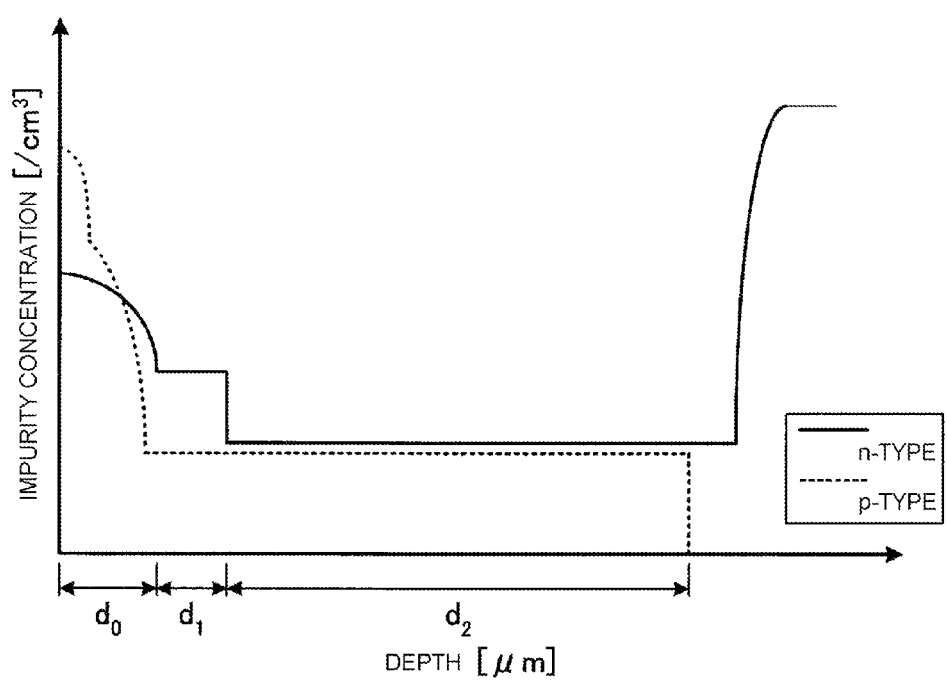
FIG. 2 is a diagram showing impurity concentration distributions of the semiconductor device according to Embodiment 1.

Next, a description will be given of impurity concentration distributions of the n-type region 1 and p-type region 2. FIG. 2 is a diagram showing impurity concentration distributions of the semiconductor device according to Embodiment 1. FIG. 2 shows an n-type impurity concentration distribution along a cut line of A-A' in FIG. 1, and a p-type impurity concentration distribution along a cut line of B-B' in FIG. 1. The n-type impurity concentration distribution is the impurity concentration distribution of the n-type region 1 in the second main surface side direction (hereafter referred to as the depth direction) from an end portion (hereafter referred to as the upper end) on the first main surface side of the n-type surface region 4. The p-type impurity concentration distribution is the impurity concentration distribution of the p-type region 2 in the depth direction from the upper end of the p contact region 5 (hereafter, the same applies in Embodiment 2 to Embodiment 6).

A first depth $d_0$ is the depth from the upper end to the lower end of the p-base region 3. A second depth $d_1$ is the depth from the lower end of the p-base region 3 to the lower end of the n-type high concentration region 21. A third depth $d_2$ is the depth from the lower end of the n-type high concentration region 21 to the lower end of the p-type region 2. Then, the n-type impurity concentration distribution shown in FIG. 2 indicates an impurity concentration distribution wherein the n-type high concentration region 21 (the second depth $d_1$) and the n-type low concentration region 22 (the third depth $d_2$) exist in that order from the Lower end of the p-base region 3 (the first depth $d_0$) to the second main surface side. Also, the p-type impurity concentration distribution shown in FIG. 2 indicates an impurity concentration distribution wherein the p-type region 2 (the second depth $d_1$+the third depth $d_2$) exists from the lower end of the p-base region 3 to the second main surface side.

As shown in FIG. 2, the n-type region 1 has two differing stages of impurity concentration distribution, formed of the n-type high concentration region 21 and n-type low concentration region 22, in a region on the second main surface side from the lower end of the p-base region 3. It is good when the n-type high concentration region 21 has an impurity concentration 1.2 times or more, 3 times or less, preferably 2.5 times or less, that of the n-type low concentration region 22. That is, the n-type region 1 is of a configuration wherein the amount of the n-type impurity is greater on the first main surface side. The impurity concentration of the n-type high concentration region 21 may be, for example, $4.8 \times 10^{15}/cm^3$. The impurity concentration of the n-type low concentration region 22 may be, for example, $3.0 \times 10^{15}/cm^3$.

Also, the n-type region 1 may have three differing stages of impurity concentration distribution, formed of the n-type surface region 4, n-type high concentration region 21, and n-type low concentration region 22. That is, the n-type impurity concentration distribution shown in FIG. 2 may be a three-stage impurity concentration distribution wherein the n-type surface region 4 (the first depth $d_0$), the n-type high concentration region 21 (the second depth $d_1$), and the n-type low concentration region 22 (the third depth $d_2$) exist in that order from the first main surface side to the second main surface side. In this case, the n-type high concentration region 21, including the n-type surface region 4, may have an impurity concentration 1.2 times or more, 3 times or less, preferably 2.5 times or less, that of the n-type low concentration region 22.

The p-type region 2 has an even impurity concentration distribution. That is, the impurity concentration of the n-type high concentration region 21 is an impurity concentration 1.2 times or more, 3 times or less, preferably 2.5 times or less, that of a region of the p-type region 2 adjoining the n-type high concentration region 21.

As heretofore described, according to Embodiment 1, by providing the n-type high concentration region 21 on the first main surface side of the n-type region 1, the first main surface side of the n-type region 1 is of a configuration wherein the amount of the n-type impurity is greater than on the second main surface side. Due to this, it is difficult for a depletion layer to spread on the first main surface side of the parallel p-n layer 20, and it is thus possible to prevent the parallel p-n layer 20 from being completely depleted with a low drain-to-source voltage. Therefore, it is possible to prevent the gate-to-drain capacitance from becoming extremely low, and thus possible to prevent turn-off dv/dt from becoming high. Consequently, as there is no longer any need to increase the size of a gate resistance in order to reduce the turn-off dv/dt, it is possible to prevent turn-off loss from increasing. That is, it is possible to improve a trade-off relationship between turn-off loss and turn-off dv/dt, compared with that heretofore known.

Embodiment 2

Figure 3:
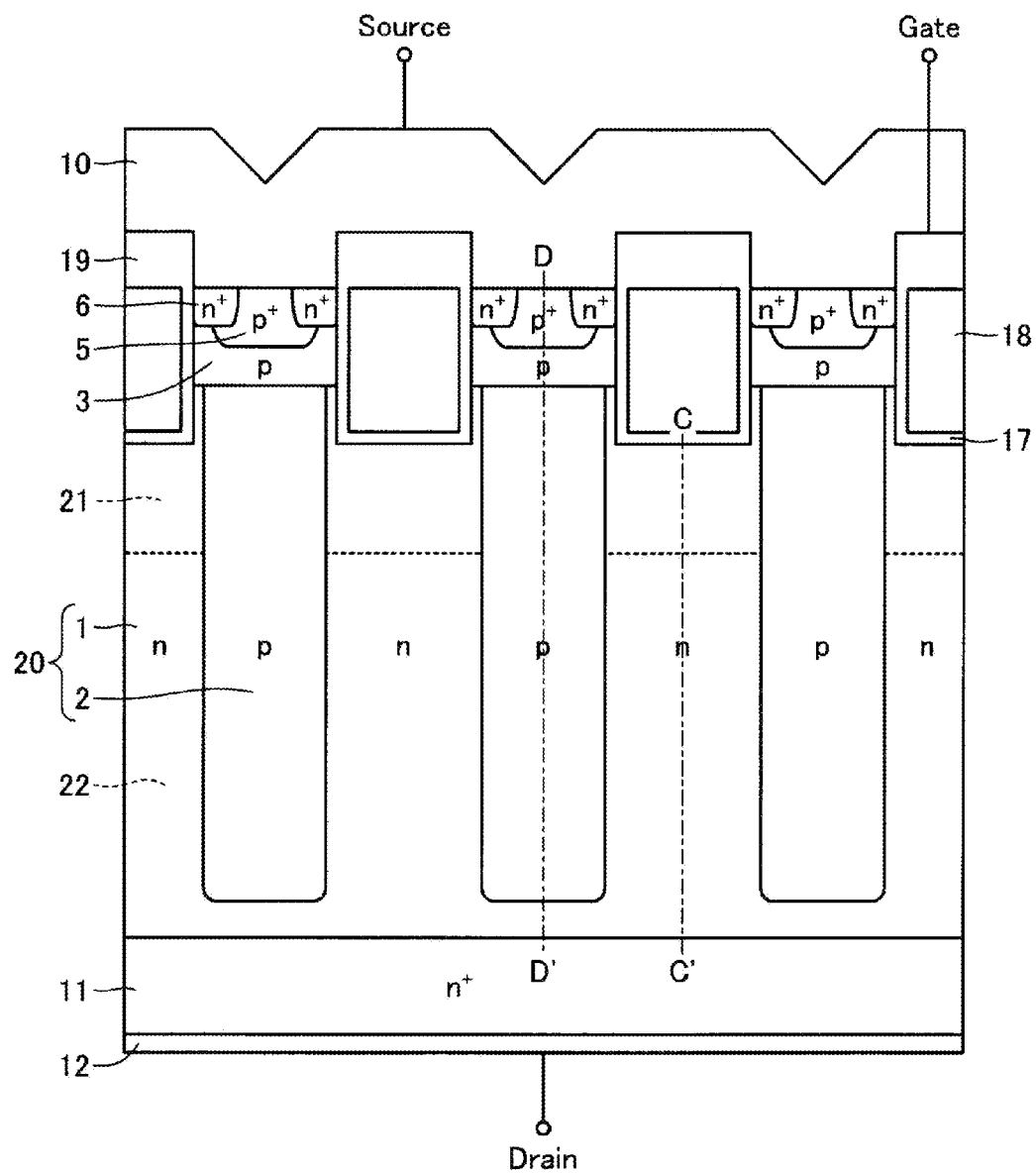
FIG. 3 is a sectional view showing a semiconductor device according to Embodiment 2.

FIG. 3 is a sectional view showing a semiconductor device according to Embodiment 2. A trench structure may also be applied in Embodiment 1.

In Embodiment 2, a trench structure, wherein a gate electrode 18 is provided across a gate insulating film 17 inside a trench, is configured on the upper end side of the n-type region 1. The p-base region 3 and source region 6 are in contact with the gate insulating film 17 provided on a trench side wall. The source electrode 10 is isolated from the gate electrode 18 by an interlayer insulating film 19. No n-type surface region is provided.

An n-type impurity concentration distribution of the n-type region 1 along the cut line of C-C' in FIG. 3 is the same as the n-type impurity concentration distribution of the n-type region 1 along the cut line of A-A' in Embodiment 1 (refer to FIG. 1 and FIG. 2). As no n-type surface region is provided in the semiconductor device shown in FIG. 3, the n-type impurity concentration distribution is only at the second depth $d_1$ and third depth $d_2$. Also, a p-type impurity concentration distribution of the p-type region 2 along the cut line of D-D' is the same as the p-type impurity concentration distribution of the p-type region 2 along the cut line of B-B' in Embodiment 1. Configurations other than these are the same as in Embodiment 1.

As heretofore described, according to Embodiment 2, it is also possible to obtain the same advantages as in Embodiment 1 with a semiconductor device having a trench gate structure.

Embodiment 3

Figure 4:
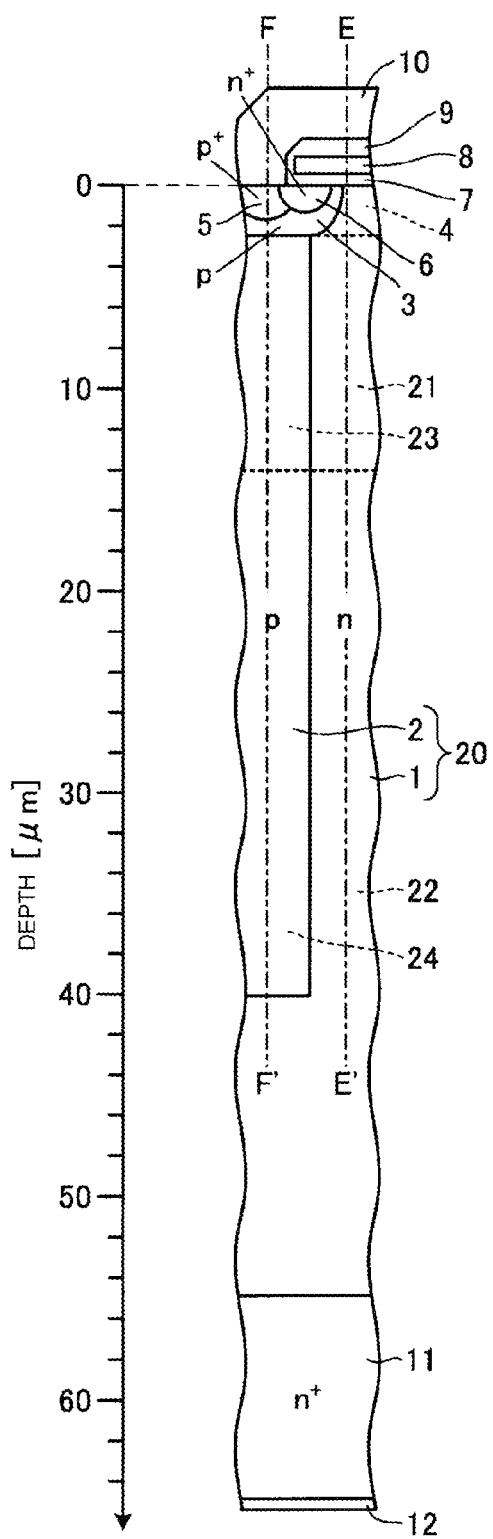
FIG. 4 is a sectional view showing a semiconductor device according to Embodiment 3.

FIG. 4 is a sectional view showing a semiconductor device according to Embodiment 3. In FIG. 4, only one p-n junction of the parallel p-n layer 20 is shown (hereafter, the same also applies in FIG. 6 and FIG. 8). In Embodiment 1, the impurity concentration of the first main surface side of the p-type region 2 may be higher than the impurity concentration of the second main surface side of the p-type region 2.

In Embodiment 3, a p-type high concentration region (a second conductivity type high concentration region) 23 is provided on the first main surface side of the p-type region 2. The p-type high concentration region 23 is in contact with the lower end of the p-base region 3. Also, the p-type high concentration region 23 has a higher impurity concentration than a region (hereafter referred to as a p-type low concentration region) 24 of the p-type region 2 excepting the p-type high concentration region 23.

Also, the p-type high concentration region 23 has the same thickness as that of the n-type high concentration region 21. Preferably, the p-type high concentration region 23 has one-eighth or more, one-half or less, the thickness of the p-type region 2. The thickness of the p-type high concentration region 23 may be, for example, 11 μm. The thickness of the p-type region 2 may be, for example, 37 μm. Also, it is preferable that the n-type high concentration region 21 has an impurity concentration 1.5 times or more, 3 times or less, preferably 2.5 times or less, that of the n-type low concentration region 22.

Figure 5:
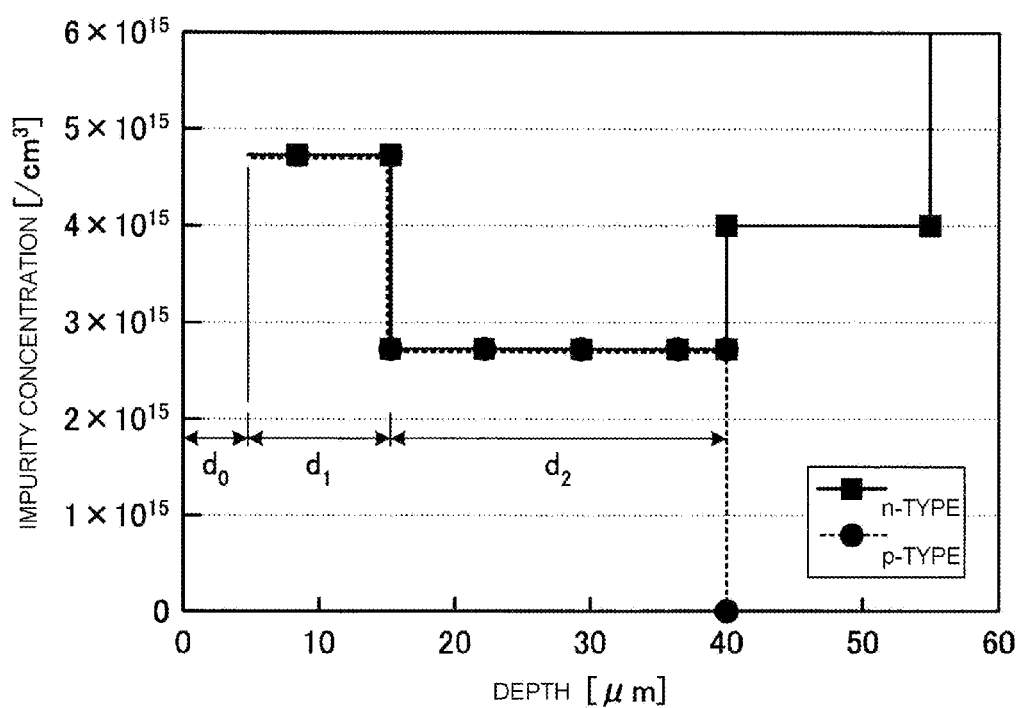
FIG. 5 is a diagram showing impurity concentration distributions of the semiconductor device according to Embodiment 3.

Next, a description will be given of impurity concentration distributions of the p-type region 2 and n-type region 1. FIG. 5 is a diagram showing impurity concentration distributions of the semiconductor device according to Embodiment 3. FIG. 5 shows an n-type impurity concentration distribution along the cut line of E-E' in FIG. 4 from the lower end of the first depth $d_0$ to the second main surface side, and a p-type impurity concentration distribution along the cut line of F-F' in FIG. 4. The n-type impurity concentration distribution of the n-type region 1 along the cut line of E-E' is the same as in Embodiment 1 (refer to FIG. 2). The p-type impurity concentration distribution shown in FIG. 5 indicates an impurity concentration distribution wherein the p-type high concentration region 23 (the second depth $d_1$) and the p-type low concentration region 24 (the third depth $d_2$) exist in that order from the lower end of the p-base region 3 (the first depth $d_0$) to the second main surface side.

As shown in FIG. 5, the p-type region 2 has two differing stages of impurity concentration distribution, formed of the p-type high concentration region 23 and p-type low concentration region 24. That is, the p-type region 2 is of a configuration wherein the amount of the p-type impurity is greater on the first main surface side. The p-type high concentration region 23 has virtually the same impurity concentration as the n-type high concentration region 21 at virtually the same depth. The p-type low concentration region 24 has virtually the same impurity concentration as the n-type low concentration region 22 at virtually the same depth. That is, the p-type impurity concentration distribution of the p-type region 2 is the same distribution form as the n-type impurity concentration distribution of the n-type region 1. The impurity concentration of the p-type high concentration region 23 may be, for example, $4.7 \times 10^{15}/cm^3$. The impurity concentration of the p-type low concentration region 24 may be, for example, $2.7 \times 10^{15}/cm^3$. Configurations other than these are the same as in Embodiment 1.

As heretofore described, according to Embodiment 3, it is possible to obtain the same advantages as in Embodiment 1. Also, by providing the p-type high concentration region 23 on the first main surface side of the p-type region 2, the first main surface side of the p-type region 2 is of a configuration wherein the amount of the p-type impurity is greater than on the second main surface side. Also, the p-type high concentration region 23 is provided at virtually the same depth as the n-type high concentration region 21, and with virtually the same impurity concentration as the n-type high concentration region 21. Due to this, it is possible to prevent the occurrence of a charge imbalance in a junction plane on the first main surface side of the parallel p-n layer 20. Therefore, it is possible to prevent a decrease in breakdown voltage.

Embodiment 4

Figure 6:
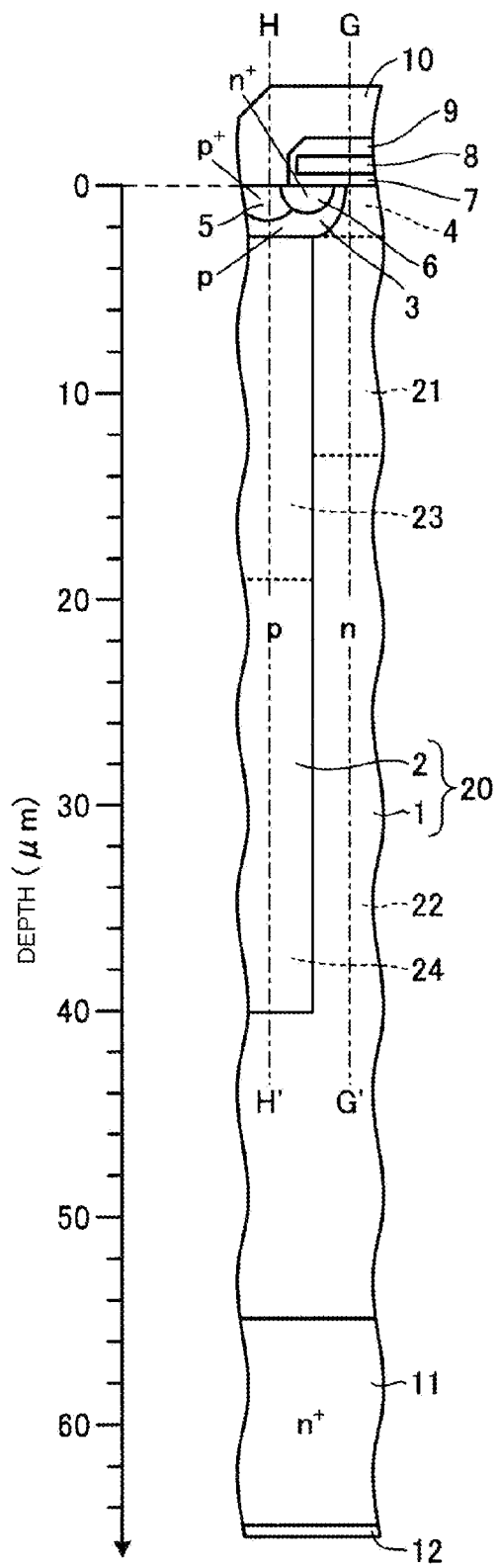
FIG. 6 is a sectional view showing a semiconductor device according to Embodiment 4.

FIG. 6 is a sectional view showing a semiconductor device according to Embodiment 4. In Embodiment 3, the p-type high concentration region 23 may be provided deeper on the second main surface side than the lower end of the n-type high concentration region 21.

In Embodiment 4, the p-type high concentration region 23 is provided with the same impurity concentration as the n-type high concentration region 21, and deeper on the second main surface side than the lower end of the n-type high concentration region 21. Due to this, it is possible to cause the amount of the p-type impurity on the first main surface side to be greater than the amount of the n-type impurity by an amount equivalent to the difference between the thickness of the p-type high concentration region 23 and the thickness of the n-type high concentration region 21. The thickness of the n-type high concentration region 21 may be, for example, 9 μm. The thickness of the p-type high concentration region 23 may be, for example, 16 μm. The thickness of the p-type region 2 may be, for example, 37 μm.

Figure 7:
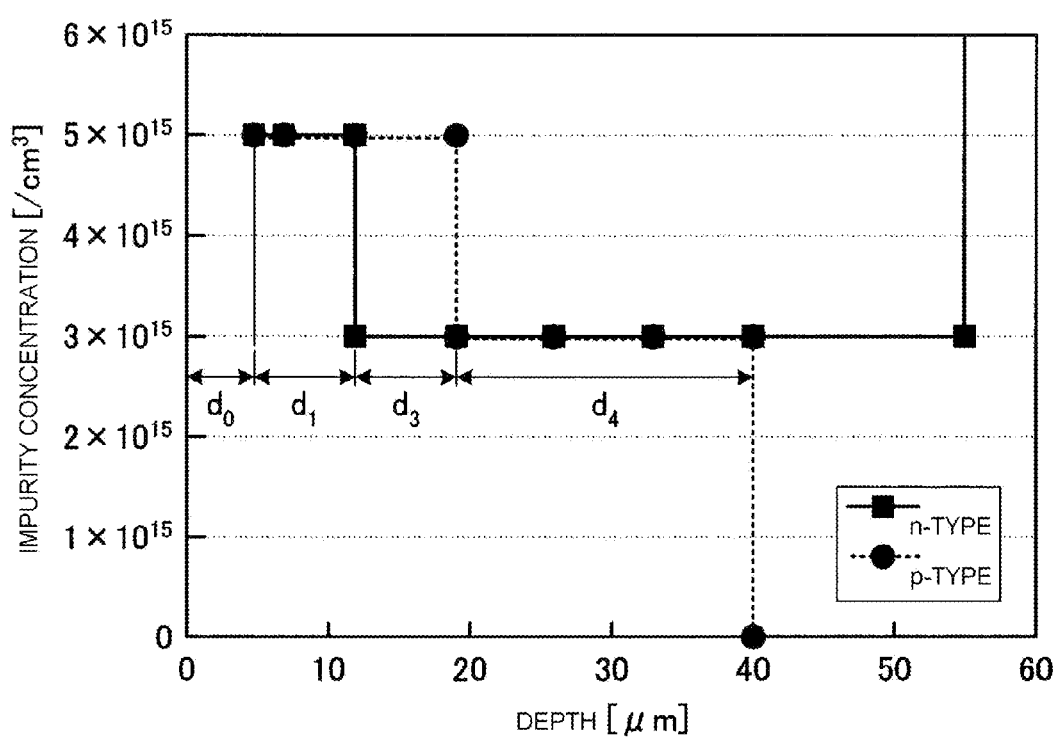
FIG. 7 is a diagram showing impurity concentration distributions of the semiconductor device according to Embodiment 4.

Next, a description will be given of an n-type impurity concentration distribution of the p-type region 2. FIG. 7 is a diagram showing impurity concentration distributions of the semiconductor device according to Embodiment 4. FIG. 7 shows an n-type impurity concentration distribution along a cut line of G-G' in FIG. 6 from the lower end of the first depth $d_0$ to the second main surface side, and a p-type impurity concentration distribution along a cut line of H-H' in FIG. 6. The n-type impurity concentration distribution of the n-type region 1 along the cut line of G-G' is the same as in Embodiment 1 (refer to FIG. 2). A fourth depth $d_3$ is a depth from the lower end of the n-type high concentration region 21 to the lower end of the p-type high concentration region 23. A fifth depth $d_4$ is a depth from the lower end of the p-type high concentration region 23 to the lower end of the p-type region 2.

As shown in FIG. 7, the p-type region 2 has two differing stages of impurity concentration distribution, formed of the p-type high concentration region 23 (the second depth $d_1$+the fourth depth $d_3$), provided deeper by the fourth depth $d_3$ from the lower end of the n-type high concentration region 21, and the p-type low concentration region 24 (the fifth depth $d_4$). That is, the p-type impurity concentration distribution of the p-type region 2 is of a distribution form differing from that of the n-type impurity concentration distribution of the n-type region 1. The impurity concentration of the p-type high concentration region 23 may be, for example, $5.0 \times 10^{15}/cm^3$. The impurity concentration of the p-type low concentration region 24 may be, for example, $3.0 \times 10^{15}/cm^3$. Also, the p-type high concentration region 23 has virtually the same impurity concentration as the n-type high concentration region 21. The p-type low concentration region 24 has virtually the same impurity concentration as the n-type low concentration region 22. Configurations other than these are the same as in Embodiment 3.

As heretofore described, according to Embodiment 4, it is possible to obtain the same advantages as in Embodiment 3. Also, by providing the p-type high concentration region 23 deeper on the second main surface side than the n-type high concentration region 21, a configuration is such that the amount of the p-type impurity on the first main surface side of the parallel p-n layer 20 is greater than the amount of the n-type impurity. Therefore, it is possible to make it difficult for negative resistance to occur when an avalanche generation occurs, and thus possible to improve avalanche withstanding capability. Consequently, it is possible to prevent a drop in drain-to-source voltage when a drain current increases.

Embodiment 5

Figure 8:
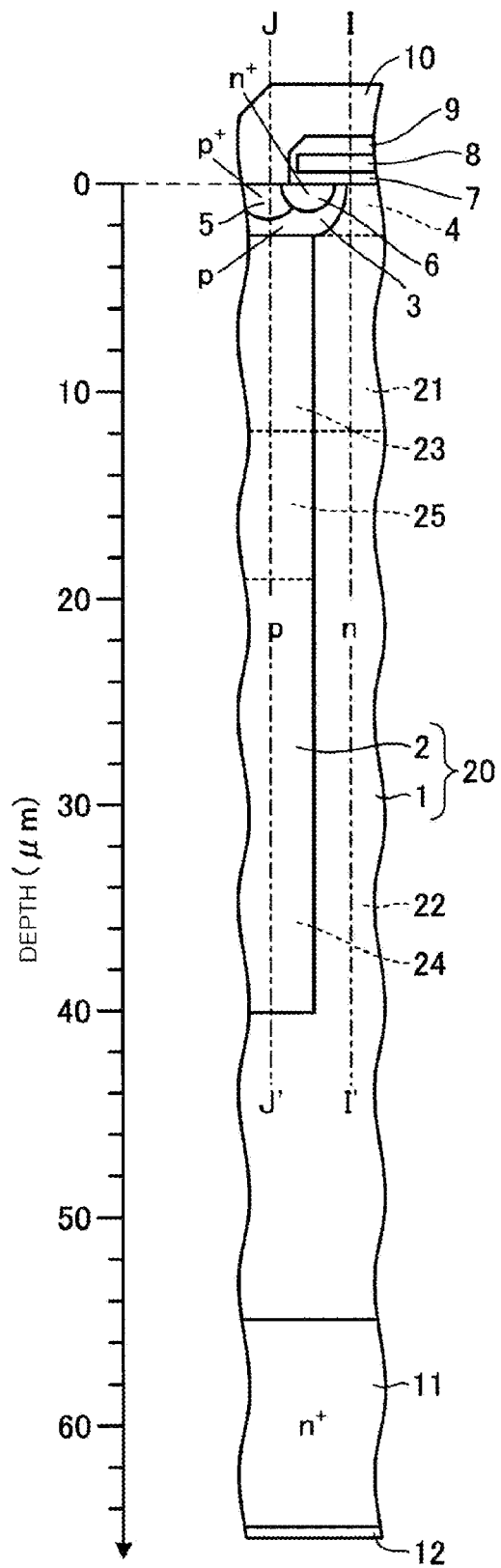
FIG. 8 is a sectional view showing a semiconductor device according to Embodiment 5.

FIG. 8 is a sectional view showing a semiconductor device according to Embodiment 5. In Embodiment 4, the region of the p-type high concentration region 23 provided deeper on the second main surface side than the lower end of the n-type high concentration region 21 may have a lower impurity concentration than that of the p-type high concentration region 23 on the first main surface side of the lower end of the n-type high concentration region 21.

In Embodiment 5, a region (hereafter, a p-type medium concentration region) 25 having a lower impurity concentration than that of the p-type high concentration region 23, and having a higher impurity concentration than that of the n-type low concentration region 22, is provided between the p-type high concentration region 23 and the p-type low concentration region 24. The p-type medium concentration region 25 is adjacent to the n-type low concentration region 22 on the first main surface side of the n-type low concentration region 22. The p-type high concentration region 23 is provided with the same thickness as the n-type high concentration region 21. The thickness of the p-type high concentration region 23 may be, for example, 9 µm. The thickness of the p-type medium concentration region 25 may be, for example, 7 µm.

Figure 9:
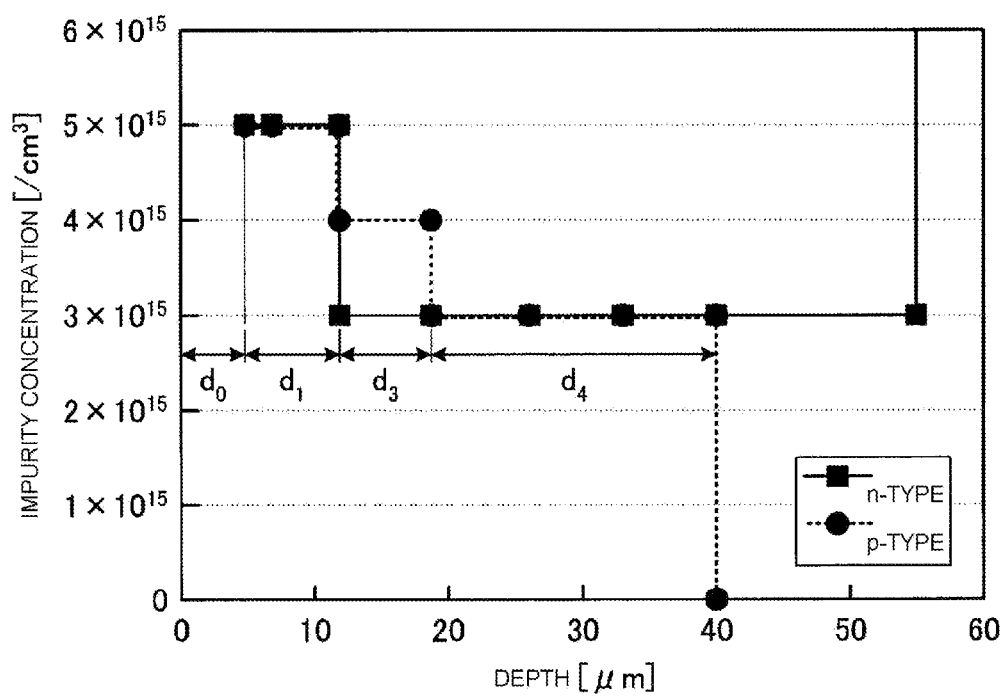
FIG. 9 is a diagram showing impurity concentration distributions of the semiconductor device according to Embodiment 5.

Next, a description will be given of an n-type impurity concentration distribution of the p-type region 2. FIG. 9 is a diagram showing impurity concentration distributions of the semiconductor device according to Embodiment 5. FIG. 9 shows an n-type impurity concentration distribution along a cut line of I-I' in FIG. 8 from the lower end of the first depth $d_0$ to the second main surface side, and a p-type impurity concentration distribution along a cut line of J-J' in FIG. 8. The n-type impurity concentration distribution of the n-type region 1 along the cut line of I-I' is the same as in Embodiment 1 (refer to FIG. 2). The fifth depth $d_4$ is a depth from the lower end of the p-type medium concentration region 25 to the lower end of the p-type region 2.

As shown in FIG. 9, the p-type region 2 has three differing stages of impurity concentration distribution, formed of the p-type high concentration region 23 (the second depth $d_1$), the p-type medium concentration region 25 (the fourth depth $d_3$), and the p-type low concentration region 24 (the fifth depth $d_4$). That is, the p-type impurity concentration distribution of the p-type region 2 is of a distribution form differing from that of the n-type impurity concentration distribution of the n-type region 1. Also, it is good when the p-type medium concentration region 25 has an impurity concentration 1.2 times or more that of the region of the n-type region adjacent to the p-type medium concentration region 25. The impurity concentration of the p-type medium concentration region 25 may be, for example, $4.0 \times 10^{15}/cm^3$. Configurations other than these are the same as in Embodiment 4.

As heretofore described, according to Embodiment 5, it is possible to obtain the same advantages as in Embodiment 4.

Embodiment 6

Figure 10:
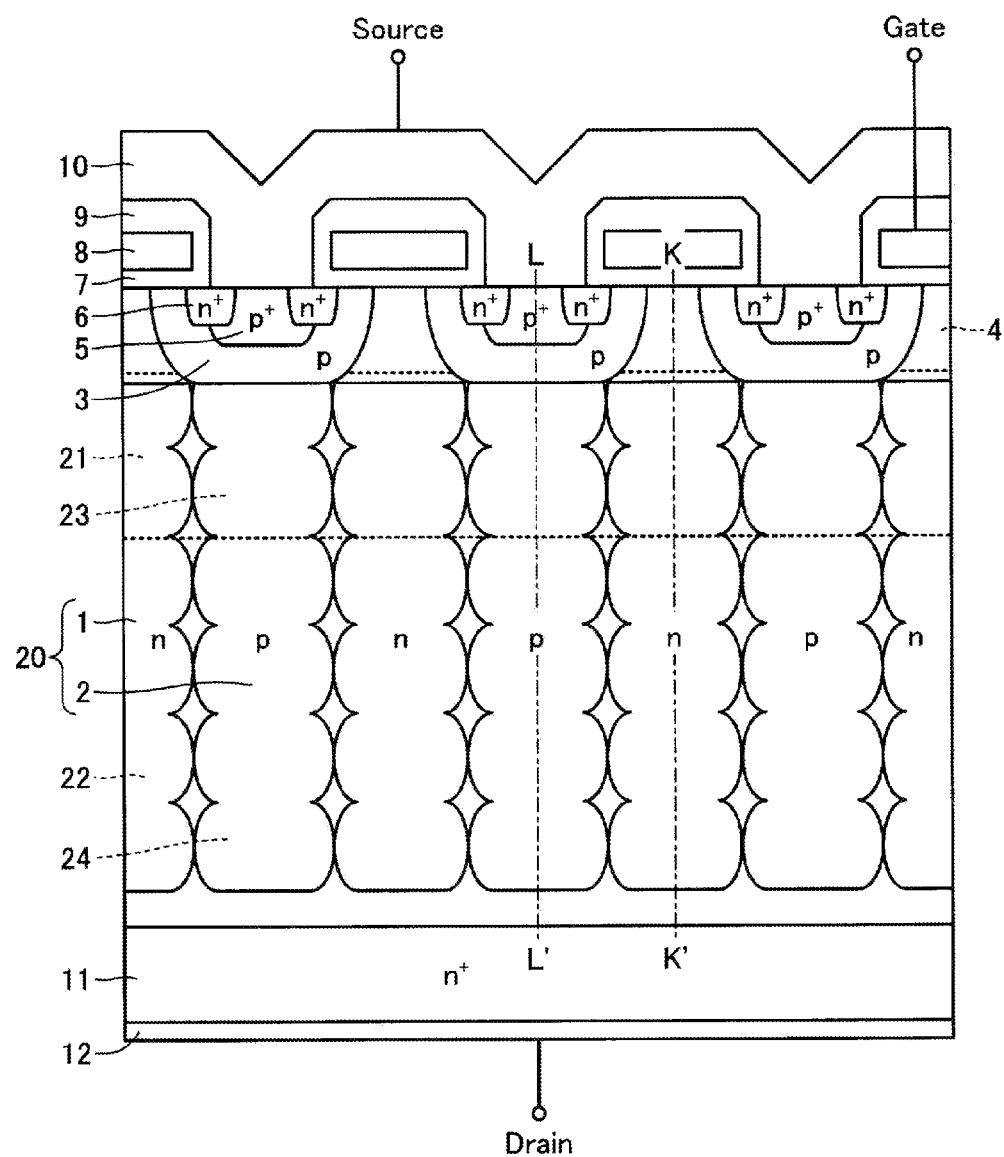
FIG. 10 is a sectional view showing a semiconductor device according to Embodiment 6.

FIG. 10 is a sectional view showing a semiconductor device according to Embodiment 6. In Embodiment 3, the p-type low concentration region 24 may have an impurity concentration distribution that gradually decreases from the first main surface side to the second main surface side.

In Embodiment 6, the parallel p-n layers 20 have a configuration wherein, for example, epitaxial layers are stacked. The n-type region 1 and p-type region 2 have waveform impurity concentration distributions (hereafter referred to as a waveform impurity concentration distribution) formed by a stacking of the parallel p-n layers 20, which have, for example, approximately arc-shaped p-n junction planes formed by the introduced impurities diffusing. Furthermore, the p-type low concentration region 24 has an impurity concentration distribution that gradually decreases from the first main surface side to the second main surface side. The total amount of impurity in the p-type low concentration region 24 is the same as the total amount of impurity in the n-type low concentration region 22.

Figure 11:
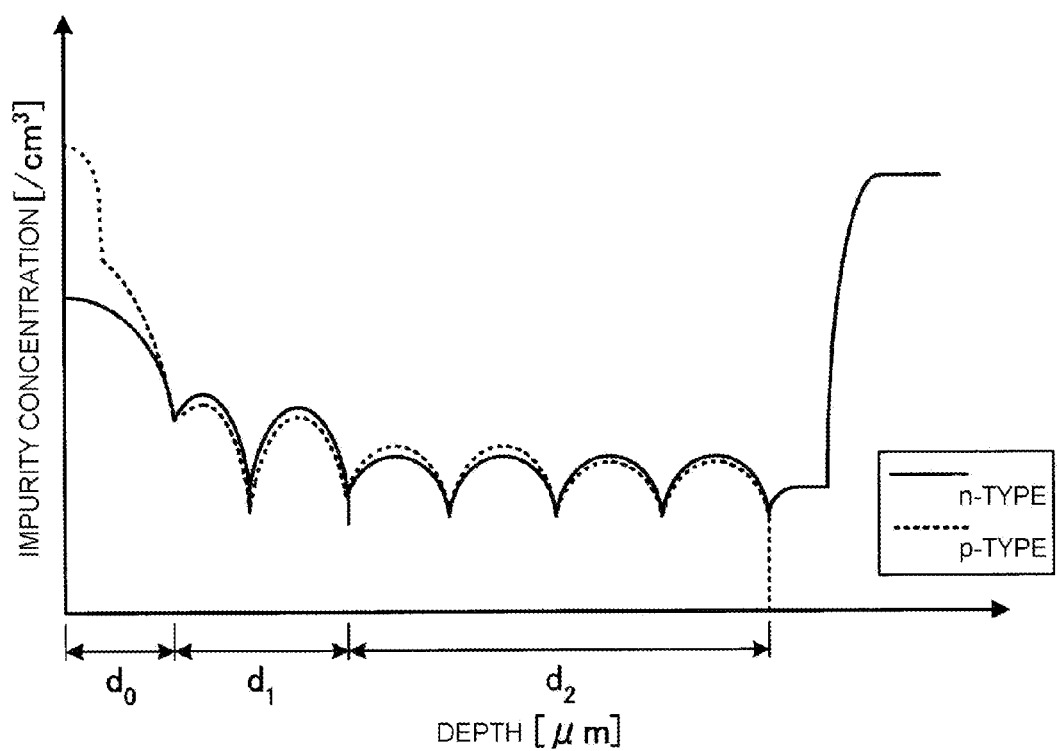
FIG. 11 is a diagram showing impurity concentration distributions of the semiconductor device according to Embodiment 6.

Next, a description will be given of an n-type impurity concentration distribution of the n-type region 1 and p-type region 2. FIG. 11 is a diagram showing impurity concentration distributions of the semiconductor device according to Embodiment 6. FIG. 11 shows an n-type impurity concentration distribution along a cut line of K-K' in FIG. 10, and a p-type impurity concentration distribution along a cut line of L-L' in FIG. 10. The n-type impurity concentration distribution of the n-type region 1 along the cut line of K-K' is the same as in Embodiment 1, except that it is a waveform impurity concentration distribution. That is, the n-type region 1 has two differing stages of impurity concentration distribution, formed of the n-type high concentration region 21 and the n-type low concentration region 22. Also, the p-type region 2 has two differing stages of impurity concentration distribution, formed of the p-type high concentration region 23 and the p-type low concentration region 24, which has an impurity concentration distribution that gradually decreases from the first main surface side to the second main surface side.

Next, a description will be given of a semiconductor device manufacturing method. Firstly, n-type epitaxial layers are stacked. Next, an n-type impurity is introduced throughout the epitaxial layers, and a thermal diffusion is carried out. Next, there is formed a mask in which a formation region of the p-type region 2 is opened. Next, a p-type impurity is introduced into the formation region of p-type region 2, and a thermal diffusion is carried out. By so doing, the p-type region 2 is formed. Herein, a region into which the p-type impurity is not introduced becomes the n-type region 1. By repeatedly carrying out this process, and stacking the epitaxial layers, the parallel p-n layers 20 are formed. At this time, the n-type impurity is introduced into the epitaxial layers forming the n-type high concentration region 21 in such a way that the n-type impurity concentration is higher than that on the second main surface side. Also, the p-type impurity is introduced into each epitaxial layer in such a way that the impurity concentration of the p-type low concentration region 24 formed in each epitaxial layer gradually increases from the second main surface side to the first main surface side. Also, the p-type impurity is introduced into the epitaxial layers forming the p-type high concentration region 23 in such a way that the p-type impurity concentration is higher than that on the second main surface side. Configurations other than these are the same as in Embodiment 3. A thermal diffusion may be carried out for each epitaxial layer, or a thermal diffusion may be carried out last by annealing, after repeatedly carrying out the formation of the epitaxial layers and introduction of the impurities.

As heretofore described, according to Embodiment 6, it is possible to obtain the same advantages as in Embodiment 3.

Working Example 1

Figure 12:
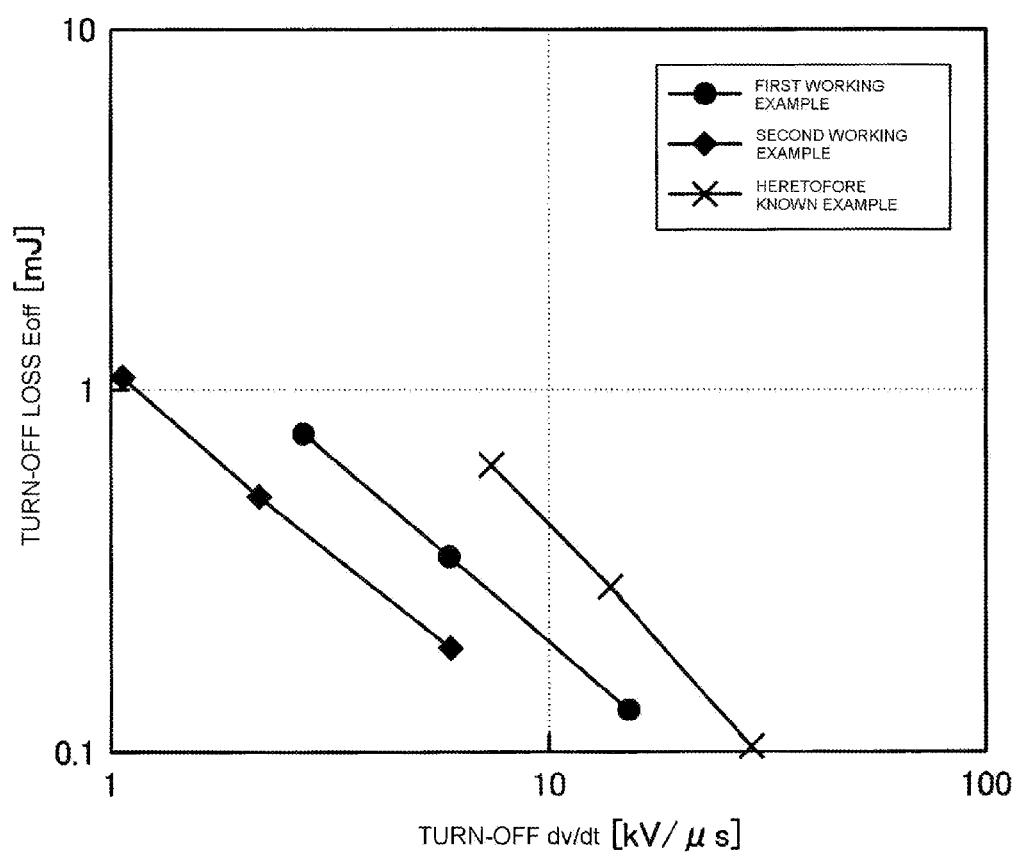
FIG. 12 is a diagram showing turn off characteristics in a semiconductor device of Working Example 1.

FIG. 12 is a diagram showing electrical characteristics of turn off in a semiconductor device of Working Example 1. FIG. 12 is a simulation result showing a trade-off relationship between turn-off loss and turn-off dv/dt (hereafter, the same applies in FIG. 14, FIG. 21, FIG. 24, FIG. 27-1, FIG. 27-2, FIG. 29-1, FIG. 29-2, and FIG. 30). In accordance with Embodiment 1, there is prepared a planar type MOSFET wherein the impurity concentration of the n-type high concentration region 21 is 1.2 times the impurity concentration of the n-type low concentration region 22 (hereafter referred to as a first working example). Also, there is prepared a planar type MOSFET wherein the impurity concentration of the n-type high concentration region 21 is 1.6 times the impurity concentration of the n-type low concentration region 22 (hereafter referred to as a second working example).

In the first working example, the thickness, and surface impurity concentration of the n-base region 3 are taken to be 3.0 μm and $3.0 \times 10^{17}$ cm$^{-3}$ respectively. The thickness and surface impurity concentration of the n-type surface region 4 are taken to be 2.5 μm and $2.0 \times 10^{16}$ cm$^{-3}$ respectively. The thickness and surface impurity concentration of the n$^+$ source region 6 are taken to be 0.5 μm and $3.0 \times 10^{20}$ cm$^{-3}$ respectively. The thickness and surface impurity concentration of the n drain region 11 are taken to be 300 μm and $2.0 \times 10^{16}$ cm$^{-3}$ respectively. The thickness of the drift layer is taken to be 53.0 μm. The width of the n-type region 1 is taken to be 6.0 μm. The thickness and impurity concentration of the n-type high concentration region 21 are taken to be 5.5 μm and $3.6 \times 10^{15}$ cm$^{-3}$ respectively.

The impurity concentration of the n-type low concentration region 22 is taken to be $3.0 \times 10^{15}$ cm$^{-3}$. The width, height, and impurity concentration of the o-type region 2 are taken to be 6.0 μm, 40.0 μm, and $3.0 \times 10^{15}$ cm$^{-3}$ respectively. Also, the breakdown voltage class is taken to be 600V. In the second working example, the impurity concentration of the n-type high concentration region 21 is taken to be $4.8 \times 10^{15}$ cm$^{-3}$. Configurations other than these are the same as in the first working example. As a comparison, there is prepared a planar type MOSFET wherein the impurity concentration of the n-type high concentration region 21 is 1 time the impurity concentration of the n-type low concentration region 22 (hereafter referred to as a heretofore known example). That is, the n-type region 1 of the heretofore known example has an even impurity concentration distribution. Other configurations of the heretofore known example are the same as in the first working example. Then, turn-off loss and turn-off dv/dt are measured for each sample.

From the results shown in FIG. 12, indicators determining the performance of the semiconductor device are that turn-off loss is low, and turn-off dv/dt is low. That is, the nearer the origin of the graph (bottom left), the higher the performance of the semiconductor device, and the more improved the trade-off relationship between turn-off loss and turn-off dv/dt. For this reason, it is possible to say that, when compared with the same turn-off dv/dt, the lower the turn-off loss, the more improved the trade-off relationship between turn-off loss and turn-off dv/dt. Therefore, the turn-off loss is compared when the turn-off dv/dt is, for example, 10 kV/μs, meeting power source high frequency regulations. Also, herein, no measurement value is shown for when the turn-off dv/dt is 10 kV/μs in the second working example. However, it is supposed that other measurement values in the second working example are on a line extending from an approximate value line joining measurement values of the second working example shown in the drawing (hereafter, the same applies in FIG. 14, FIG. 21, FIG. 24, FIG. 27-1, FIG. 27-2, FIG. 29-1, FIG. 29-2, and FIG. 30).

It can be seen from the results shown in FIG. 12 that the higher the impurity concentration of the n-type high concentration region 21 with respect to that of the n-type low concentration region 22, the lower the turn-off loss. That is, it can be seen that the trade-off relationship between turn-off loss and turn-off dv/dt is most improved in the second working example. Also, it can be seen that, by arranging so that the impurity concentration of the n-type high concentration region 21 is 1.2 times or more greater than the impurity concentration of the n-type low concentration region 22, it is possible to reduce the turn-off loss to one-half or less that in the heretofore known example.

Working Example 2

Figure 13:
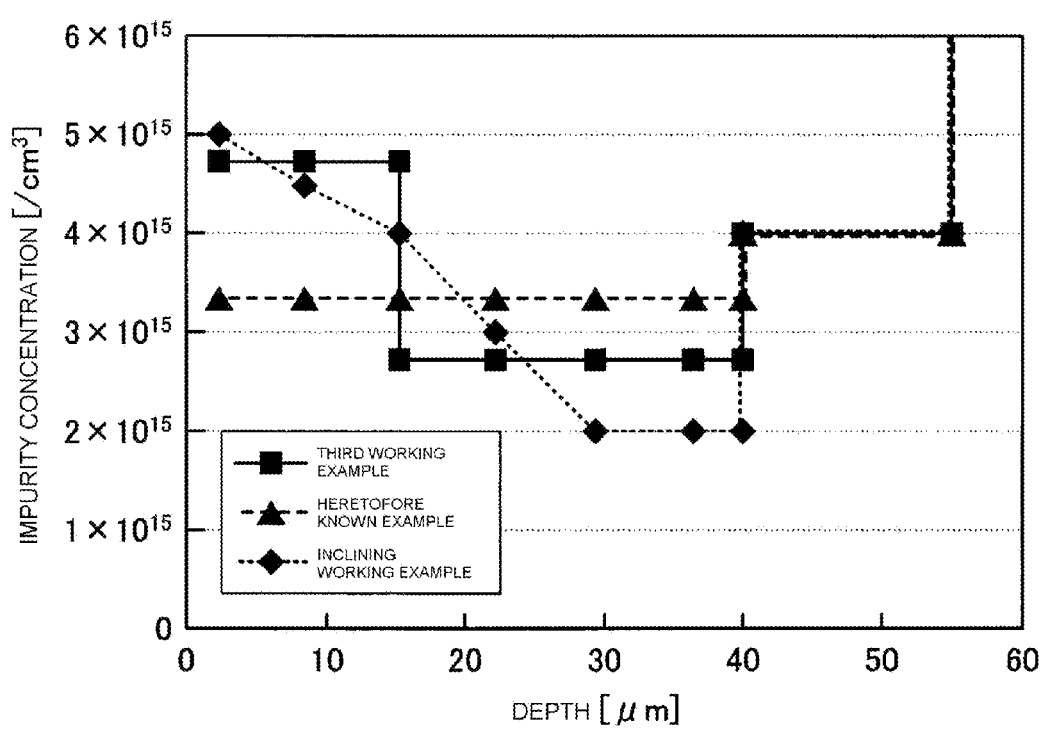
FIG. 13 is a diagram showing an n-type impurity concentration distribution of a semiconductor device according to Working Example 2.
Figure 14:
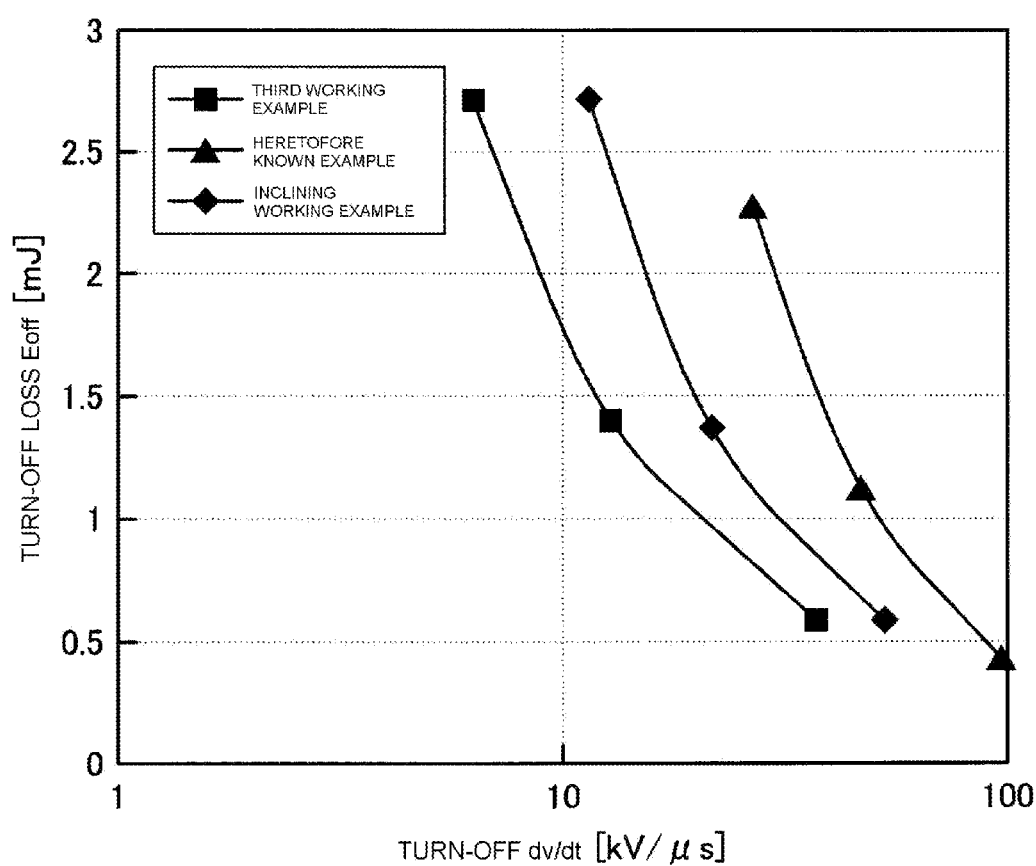
FIG. 14 is a diagram showing turn off characteristics in the semiconductor device of Working Example 2.

FIG. 13 is a diagram showing an n-type impurity concentration distribution of a semiconductor device according to Working Example 2. Also, FIG. 14 is a diagram showing electrical characteristics of turn off in the semiconductor device of Working Example 2. Firstly, as shown in FIG. 13, a planar type MOSFET is prepared in accordance with Embodiment 3 (hereafter referred to as a third working example). In the third working example, the thickness and impurity concentration of the n-type high concentration region 21 are taken to be 8.0 μm and $4.7 \times 10^{15}$ cm$^{-3}$ respectively. The impurity concentration of the n-type low concentration region 22 is taken to be, for example, $2.7 \times 10^{15}$ cm$^3$. The thickness of the p-type region 2 is taken to be 37 μm. The thickness and impurity concentration of the p-type high concentration region 23 are the same as those of the n-type high concentration region 21. The impurity concentration of the p-type low concentration region 24 is the same as that of the n-type low concentration region 22. As a comparison, a heretofore known example is prepared, as in Working Example 1. Also, there is prepared a planar type MOSFET (hereafter referred to as an inclining working example) wherein the n-type impurity concentration gradually decreases from the first main surface side to the second main surface side of the n-type region 1. In each of the third working example, heretofore known example, and inclining working example, the total amount of impurity in the n-type region 1 is the same. Then, turn-off loss and turn-Off dv/dt are measured for each sample.

It can be seen from the results shown in FIG. 14 that, comparing when turn-off dv/dt is, for example, 10 kV/μs, turn-Off loss is lowest in the third working example, and highest in the heretofore known example. Specifically, when the turn-off dv/dt is, for example, 10 kV/μs, the turn-off loss in the third working example is about 1.7 mJ. The turn-off loss in the heretofore known example is about 5.0 mJ (omitted from the drawing). That is, it can be seen that, in the third working example, it is possible to reduce turn-off loss to in the region of one-third of that in the heretofore known example. As a result, it can be seen that, in comparison with the heretofore known example, the trade-off relationship between turn-off loss and turn-off dv/dt is most improved in the third working example. The reason for this is as shown next. Also, it can be seen that, in comparison with the heretofore known example, the trade-off relationship between turn-off loss and turn-off dv/dt is also improved in the inclining working example.

Figure 15:
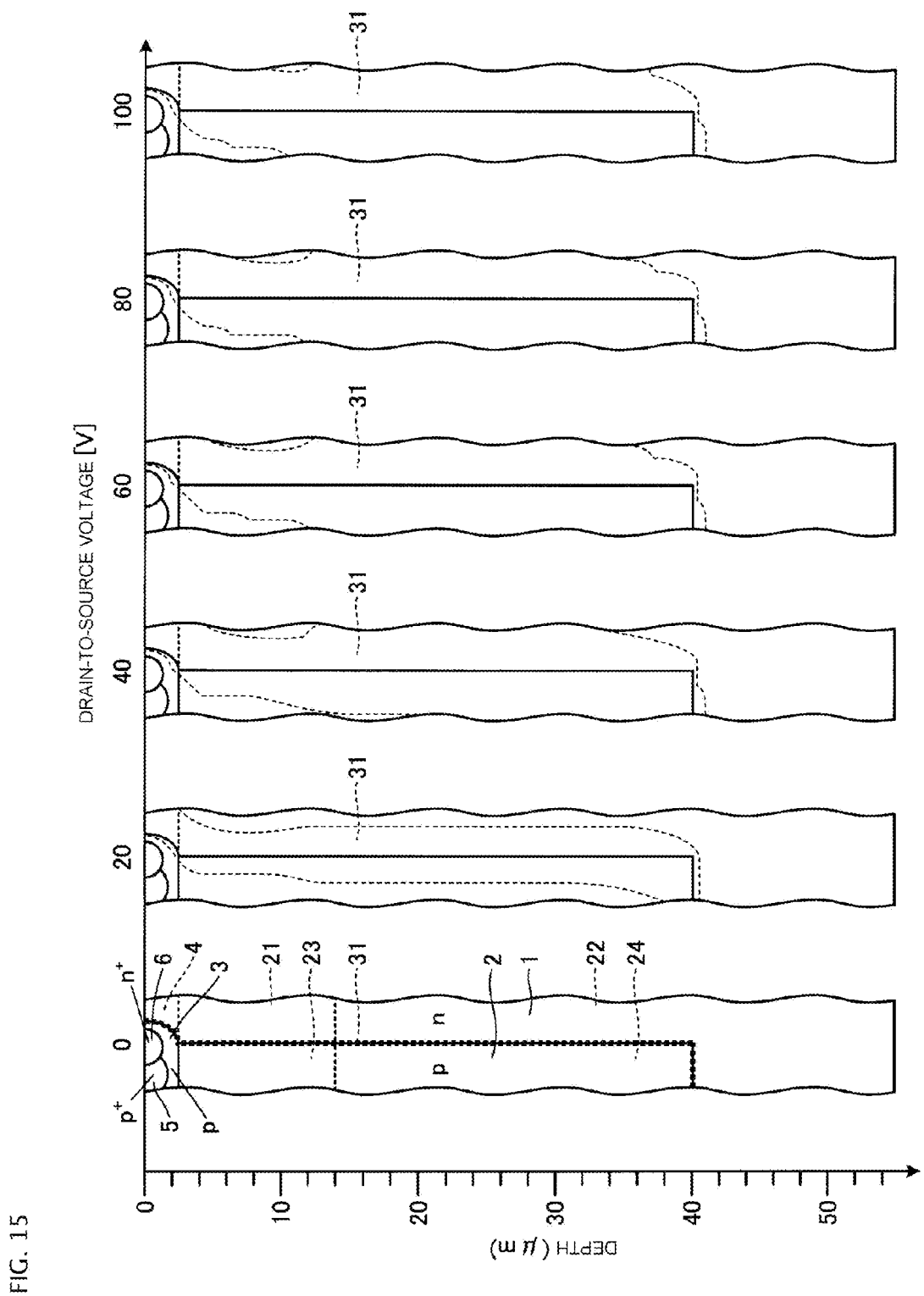
FIG. 15 is a schematic drawing showing the spread of a depletion layer in the semiconductor device according to Working Example 2.
Figure 16:
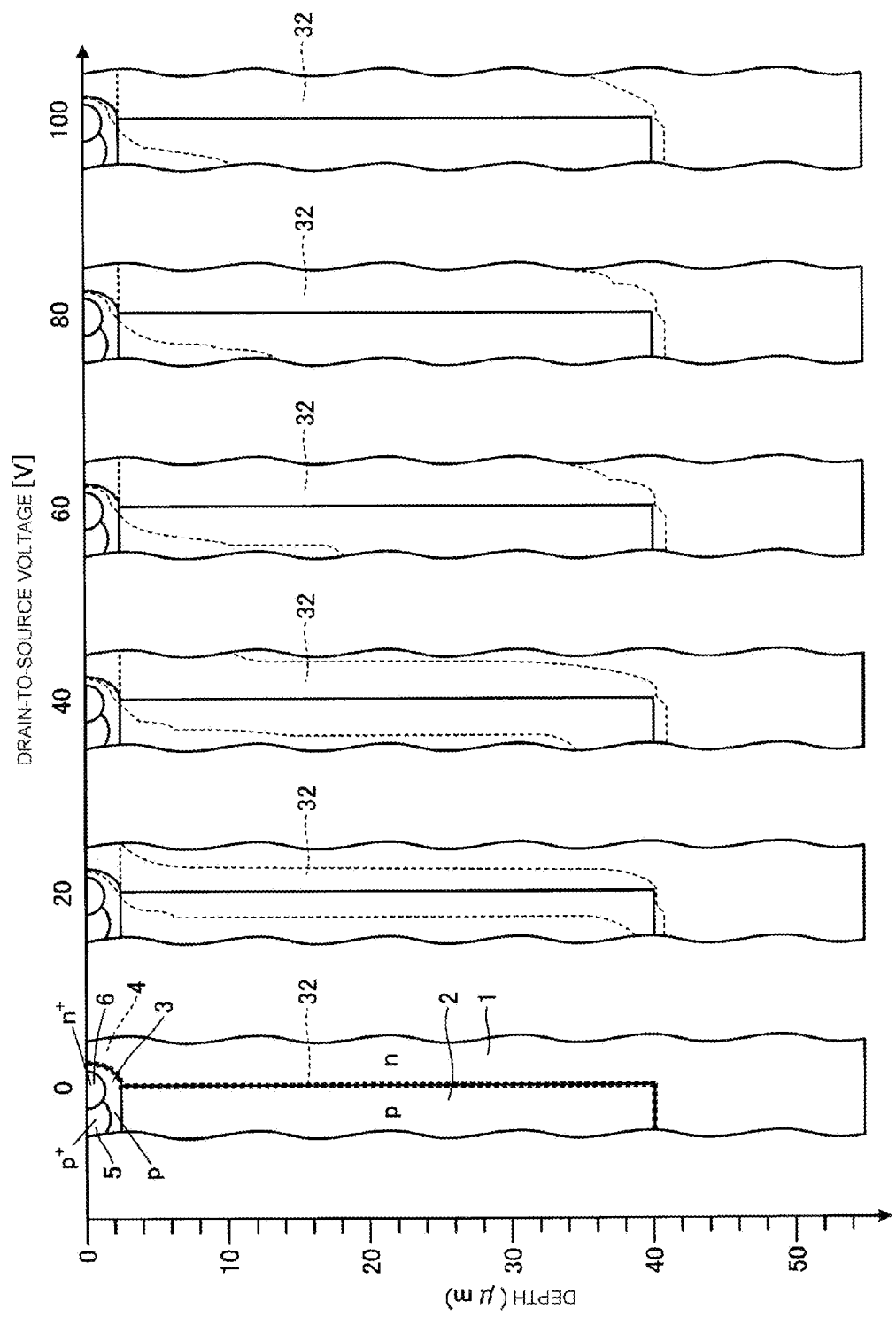
FIG. 16 is a schematic drawing showing the spread of a depletion layer in the semiconductor device according to Working Example 2.
Figure 17:
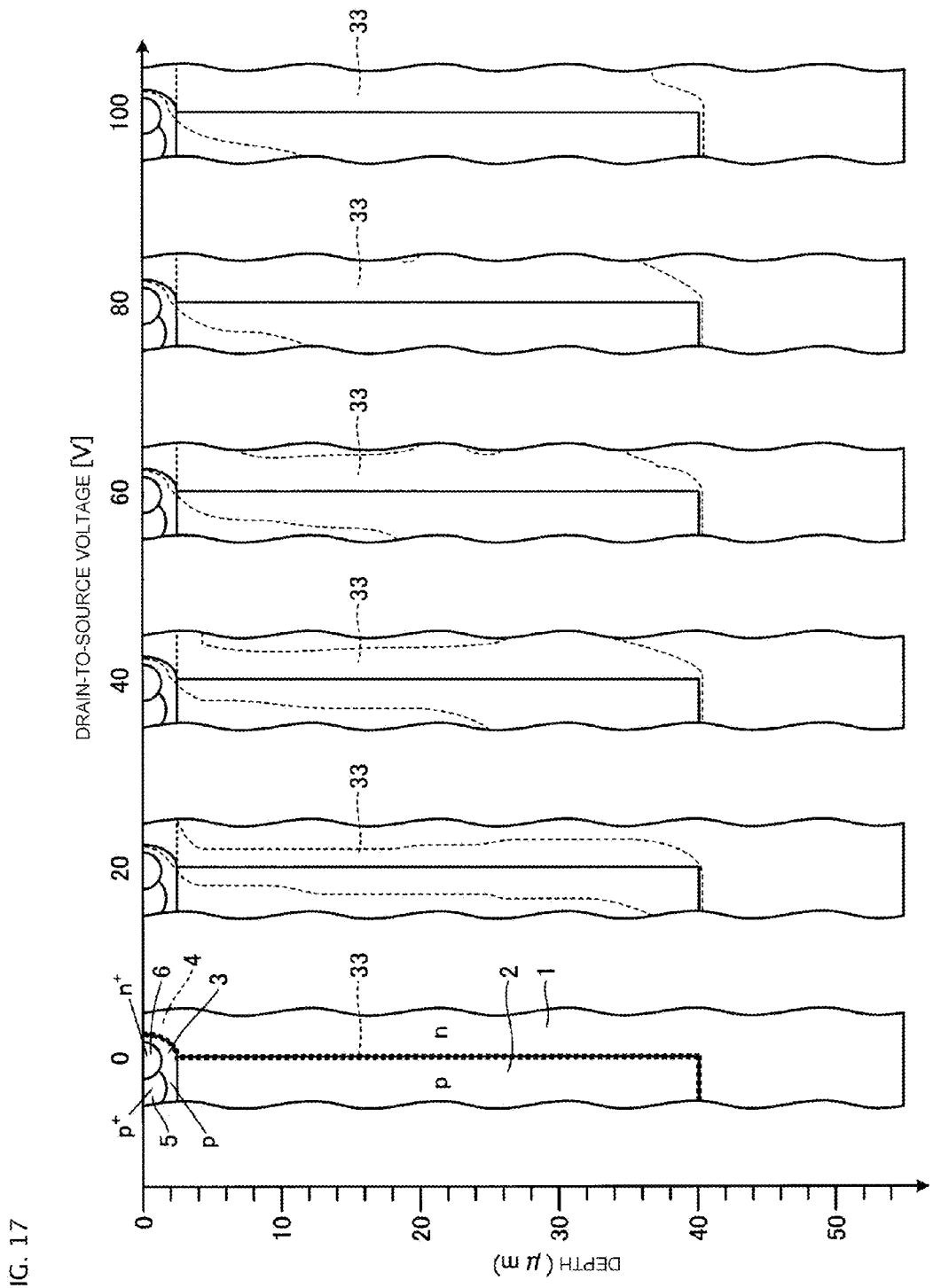
FIG. 17 is a schematic drawing showing the spread of a depletion layer in the semiconductor device according to Working Example 2.
Figure 18:
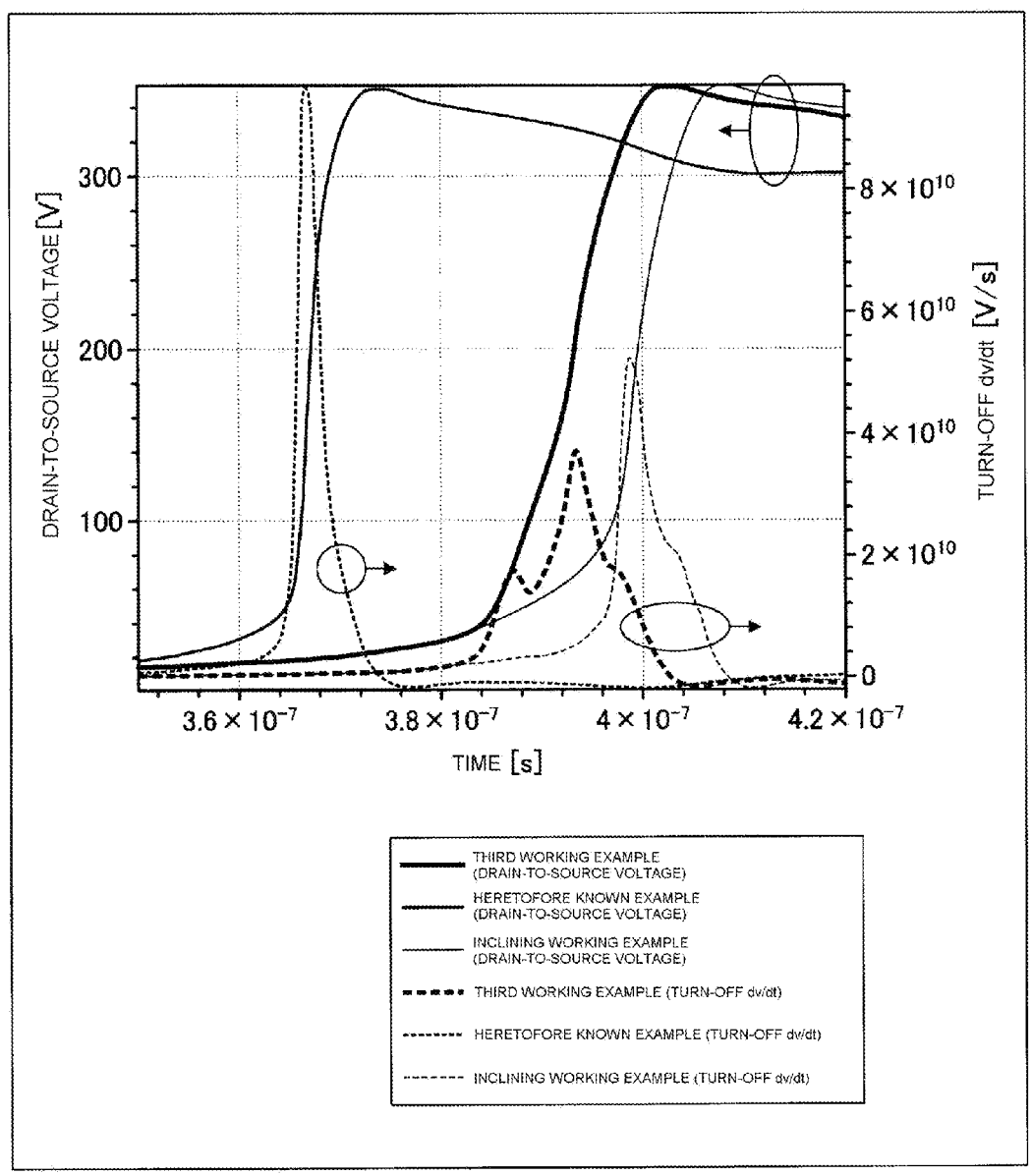
FIG. 18 is a diagram showing turn off characteristics in semiconductor device according to Working Example 2.

FIG. 15 to FIG. 17 are schematic drawings showing the spread of a depletion layer in the semiconductor device according to Working Example 2. Also, FIG. 18 is a diagram showing electrical characteristics of turn off in the semiconductor device according to Working Example 2. FIG. 15 to FIG. 17 show the spread of a depletion layer 31 in the third working example, the spread of a depletion layer 32 in the heretofore known example, and the spread of a depletion layer 33 in the inclining working example, when drain-to-source voltage is raised. FIG. 18 is a simulation result showing turn-off dv/dt in the third working example, heretofore known example, and inclining working example when the drain-to-source voltage is raised.

As shown in FIG. 16, the depletion layer 32 in the heretofore known example spreads parallel to the junction plane of the n-type region 1 and p-type region 2. Then, the parallel p-n layers are completely depleted at a drain-to-source voltage of 80V. Also, as shown in FIG. 17, when the drain-to-source voltage is applied, the depletion layer 33 in the inclining working example spreads quickly on the second main surface side of the parallel p-n layers, which has a low impurity concentration, and spreads slowly on the first main surface side of the parallel p-n layers, which has a high impurity concentration. Then, the parallel p-n layers are completely depleted at a drain-to-source voltage of 100V.

Meanwhile, as shown in FIG. 15, when the drain-to-source voltage is applied, the depletion layer 31 in the third working example spreads quickly on the second main surface side (the n-type low concentration region 22 and p-type low concentration region 24) of the parallel p-n layers, which has a low impurity concentration, and spreads slowly on the first main surface side (the n-type high concentration region 21 and p-type high concentration region 23) of the parallel p-n layers, which has a high impurity concentration. Then, in the third working example, a non-depleted region (hereafter referred to as a neutral region) remains on the first main surface side of the parallel p-n layers, even when the drain-to-source voltage reaches 100V.

Also, it can be seen from the results shown in FIG. 18 that, in the heretofore known example, the drain-to-source voltage rises sharply, as a result of which the turn-off dv/dt increases sharply. The reason for this is that, in the heretofore known example, the parallel P-n layers are completely depleted easily (refer to FIG. 16). Also, in the inclining working example, the time from the drain-to-source voltage being applied to the drain-to-source voltage starting to rise is longer than in the heretofore known example. Also, the drain-to-source voltage overall rises slowly, and the turn-off dv/dt also rises slowly. The reason for this is that in the inclining working example, as the impurity concentrations in the n-type region 1 and p-type region 2 increase gently from the second main surface side to the first main surface side, the depletion layer gradually spreads from the second main surface side to the first main surface side (refer to FIG. 17).

Meanwhile, in the third working example, the time from the drain-to-source voltage being applied to the drain-to-source voltage starting to rise is shorter than in the inclining working example. However, in the third working example, the turn-off dv/dt is lower than in the inclining working example. The reason for this is that in the third working example, as there is a portion in which the impurity concentration changes sharply in the n-type region 1 and p-type region 2, it is more difficult, in comparison with the inclining working example, for the depletion layer to spread on the first main surface side of the parallel p-n layers (refer to FIG. 15), and more difficult for the drain-to-source voltage to rise.

As heretofore described, it can be seen that in the third working example and inclining working example, it is possible to reduce turn-off loss in virtually the same way in comparison with the heretofore known example (refer to FIG. 14). Also, it can be seen that in the third working example, it is possible to reduce turn-off dv/dt in comparison with the inclining working example (refer to FIG. 18). Therefore, it can be seen that, in the third working example, it is possible to improve the trade-off relationship between turn-off loss and turn-off dv/dt in comparison with the heretofore known example.

Working Example 3

Figure 19:
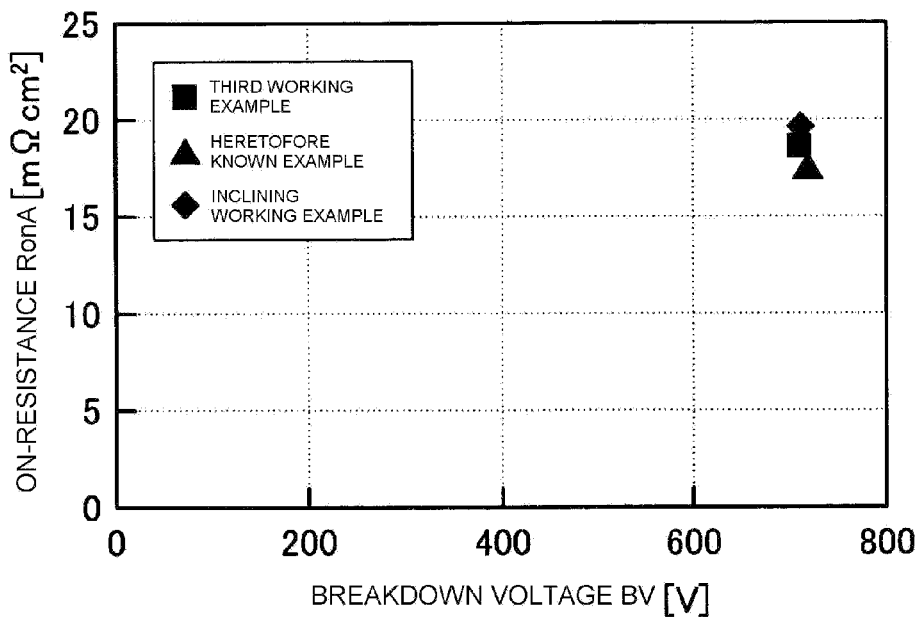
FIG. 19 is a diagram showing a relationship between breakdown voltage and on-resistance in a semiconductor device according to Working Example 3.

FIG. 19 is a simulation result showing a relationship between breakdown voltage and on-resistance in the semiconductor device according to Working Example 3. FIG. 19 is a simulation result showing a trade-off relationship between breakdown voltage and on-resistance. Firstly, the third working example is prepared, as in Working Example 2. As a comparison, the heretofore known example is prepared, as in Working Example 1. The inclining working example is prepared, as in Working Example 2. Then, breakdown voltage and on-resistance are measured for each sample. From the results shown in FIG. 19, indicators determining the performance of the semiconductor device are that breakdown voltage is high, and on-resistance is low. That is, the nearer the bottom right of the graph, the higher the performance of the semiconductor device, and the more improved the trade-off relationship between on-resistance and breakdown voltage (hereafter, the same applies in FIG. 26 and FIG. 28-1).

From the results shown in FIG. 19, the breakdown voltages of the third working example, heretofore known example, and inclining working example are of virtually the same value. The on-resistance is lowest in the heretofore known example. The reason for this is that the impurity concentration distribution in the n-type region 1 is even. Due to this, the trade-off relationship between on-resistance and breakdown voltage is most improved in the heretofore known example. Meanwhile, when comparing the third working example and inclining working example, the on-resistance of the third working example is low in comparison with the on-resistance of the inclining working example. The reason for this is supposed to be as follows. As it is possible to see an SJ-MOSFET as a JFET (junction field effect transistor) structure with a long channel length, the on-resistance is determined by the impurity concentration of the n-type region 1. In particular, when the impurity concentration on the second main surface side is low, a depletion layer spreads in the n-type region 1 due to a voltage drop caused by the current flowing through the n-type region 1 and the resistance of the n-type region 1, narrowing the current path. As a result of this, the on-resistance is increased. As the impurity concentration in the n-type region 1 on the second main surface side in the heretofore known example, third working example, and inclining working example decreases in the order of the heretofore known example, third working example, and inclining working example, the result is that the on-resistance of the heretofore known example is the lowest, while that of the inclining working example is the highest. Also, as the difference between the on-resistances of the third working example and heretofore known example is in the range of 5%, it is possible to say that the trade-off relationship between on-resistance and breakdown voltage can be improved in the third working example in virtually the same way as in the heretofore known example. Furthermore, as heretofore described, it is possible to reduce the turn-off loss in the third working example (refer to Working Example 2). Therefore, it can be seen that the third working example has a high performance in comparison with the heretofore known example.

Working Example 4

Figure 20:
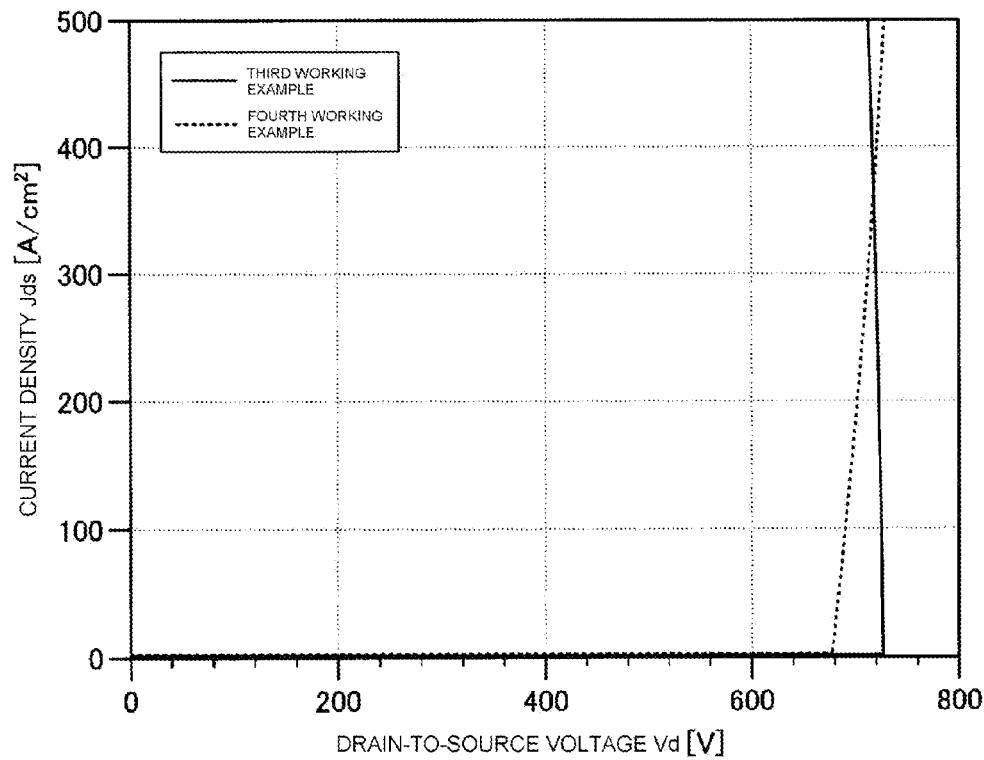
FIG. 20 is a diagram showing electrical characteristics in a semiconductor device according to Working Example 4.

FIG. 20 is a diagram showing electrical characteristics in a semiconductor device according to Working Example 4.

Figure 21:
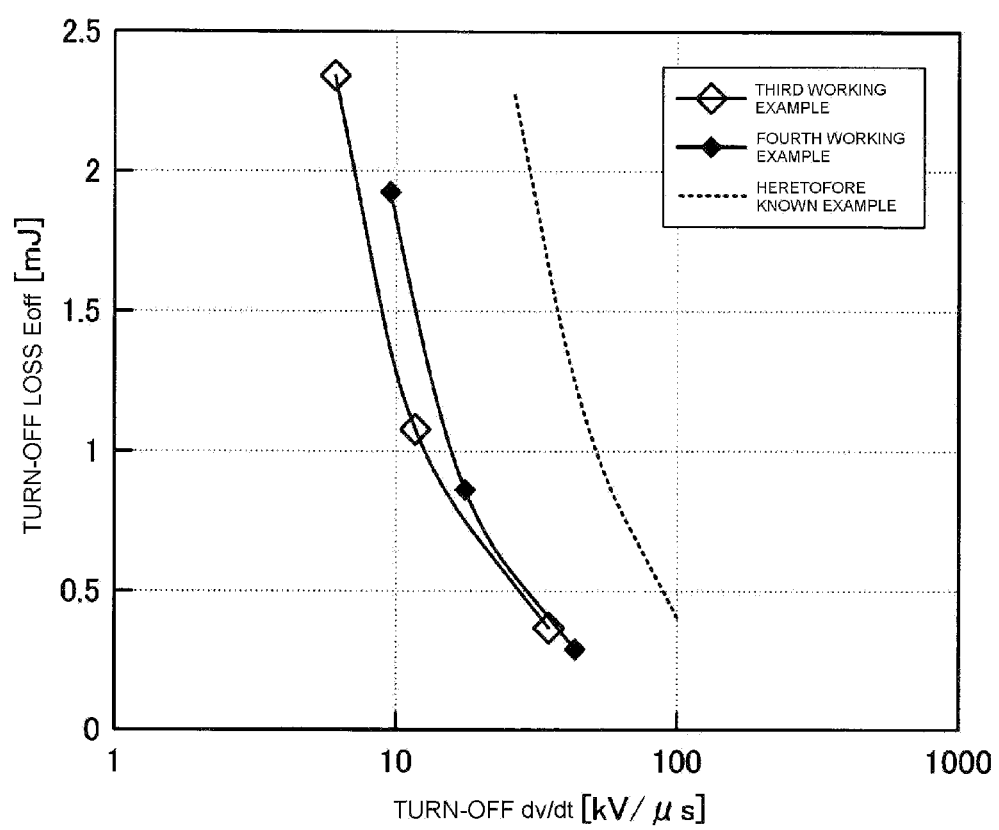
FIG. 21 is a diagram showing turn off characteristics in the semiconductor device according to Working Example 4.

Also, FIG. 21 is a diagram showing electrical characteristics of turn off in the semiconductor device according to Working Example 4. FIG. 20 is a simulation result showing current-voltage characteristics after an avalanche breakdown (hereafter, the same applies in FIG. 23). Firstly, the third working example is prepared, as in Working Example 2. Also, in accordance with Embodiment 4, a planar type MOSFET is prepared (hereafter referred to as a fourth working example). In the fourth working example, the thickness of the n-type high concentration region 21 is taken to be 9 μm. The thickness of the p-type high concentration region 23 is taken to be 16 μm. The impurity concentration of the n-type high concentration region 21 and p-type high concentration region 23 is taken to be $5.0 \times 10^{15}$ cm$^3$. The impurity concentration of the n-type low concentration region 22 and p-type low concentration region 24 is taken to be $3.0 \times 10^{15}$ cm$^3$. Configurations other than these are the same as in the third working example. Then, in the third working example and fourth working example, a current-voltage waveform after an avalanche breakdown is measured. Also, turn-off loss and turn-off dv/dt are measured for each sample.

From the results shown in FIG. 20, in the third working example, the drain-to-source voltage drops when the drain current increases. The reason for this is that in the third working example, as the n-type region 1 and p-type region 2 have virtually the same impurity concentration distribution in the depth direction, negative resistance occurs after an avalanche breakdown. Meanwhile, in the fourth working example, the drain-to-source voltage rises when the drain current increases. The reason for this is that in the fourth working example, as the amount of p-type impurity is greater than the amount of n-type impurity in the portion of the p-type high concentration region 23 provided deeper on the second main surface side than the n-type high concentration region 21, the negative resistance is suppressed. As it is possible in this way to make it difficult for negative resistance to occur in the fourth working example, it is possible to improve avalanche withstanding capability.

Also, from the results shown in FIG. 21, it can be seen that it is possible to considerably improve the trade-off relationship between turn-off loss and turn-off dv/dt in the fourth working example in comparison with the heretofore known example, in virtually the same way as in the third working example. Specifically, comparing when the turn-off dv/dt is, for example, 10 kV/μs, it is possible to reduce the turn-off loss in the fourth working example to one-half in comparison with the turn-off loss in the heretofore known example, which is omitted from the drawing. That is, it can be seen that, in the fourth working example, it is possible to improve the trade-off relationship between turn-off loss and turn-off dv/dt more than in the heretofore known example, and to improve avalanche withstanding capability.

Working Example 5

Figure 22:
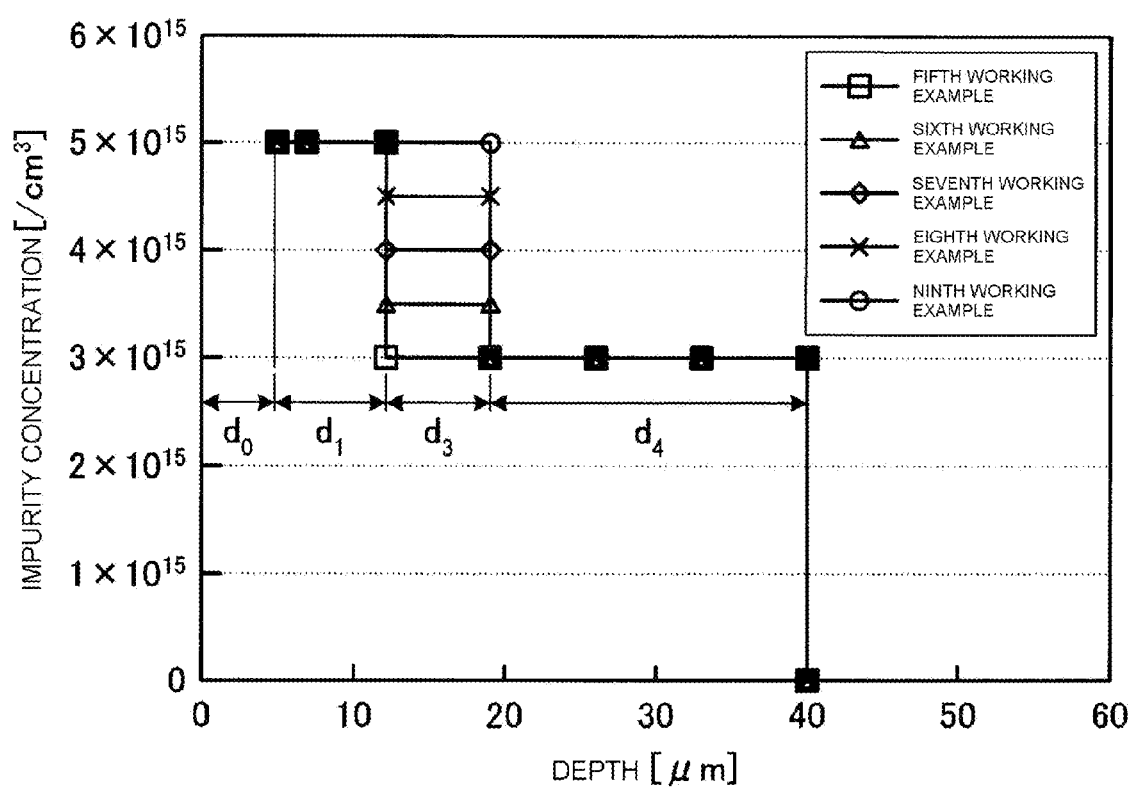
FIG. 22 is a diagram showing p-type impurity concentration distributions of a semiconductor device according to Working Example 5.
Figure 23:
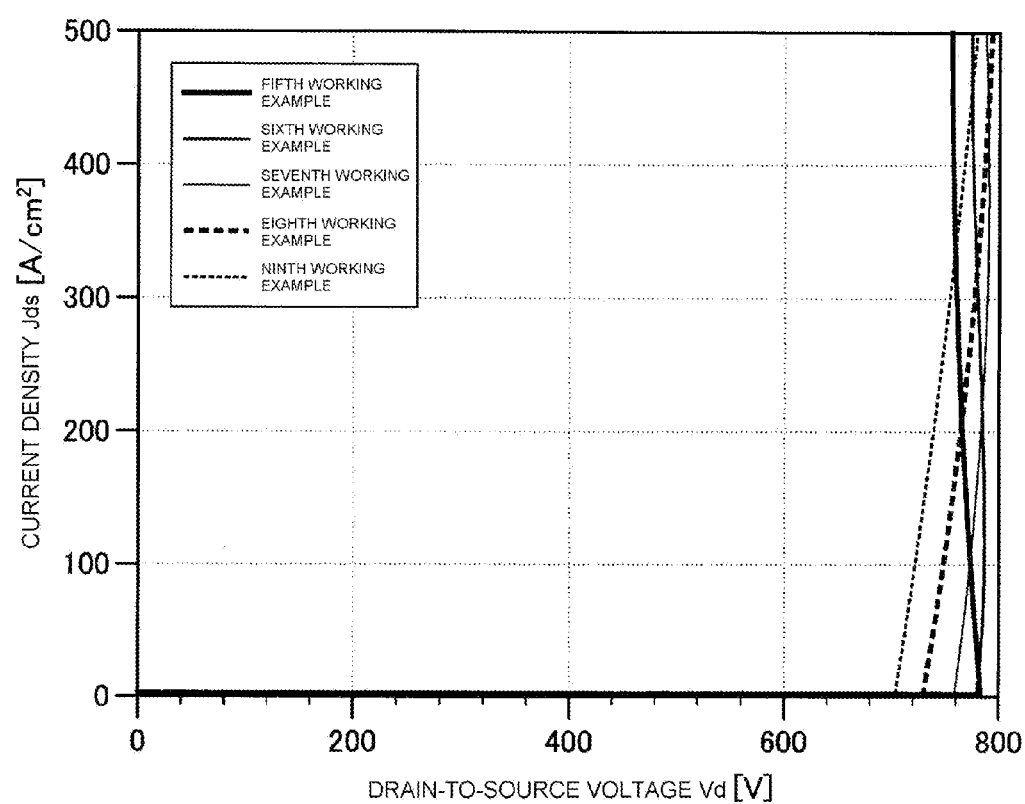
FIG. 23 is a diagram showing electrical characteristics in the semiconductor device according to Working Example 5.
Figure 24:
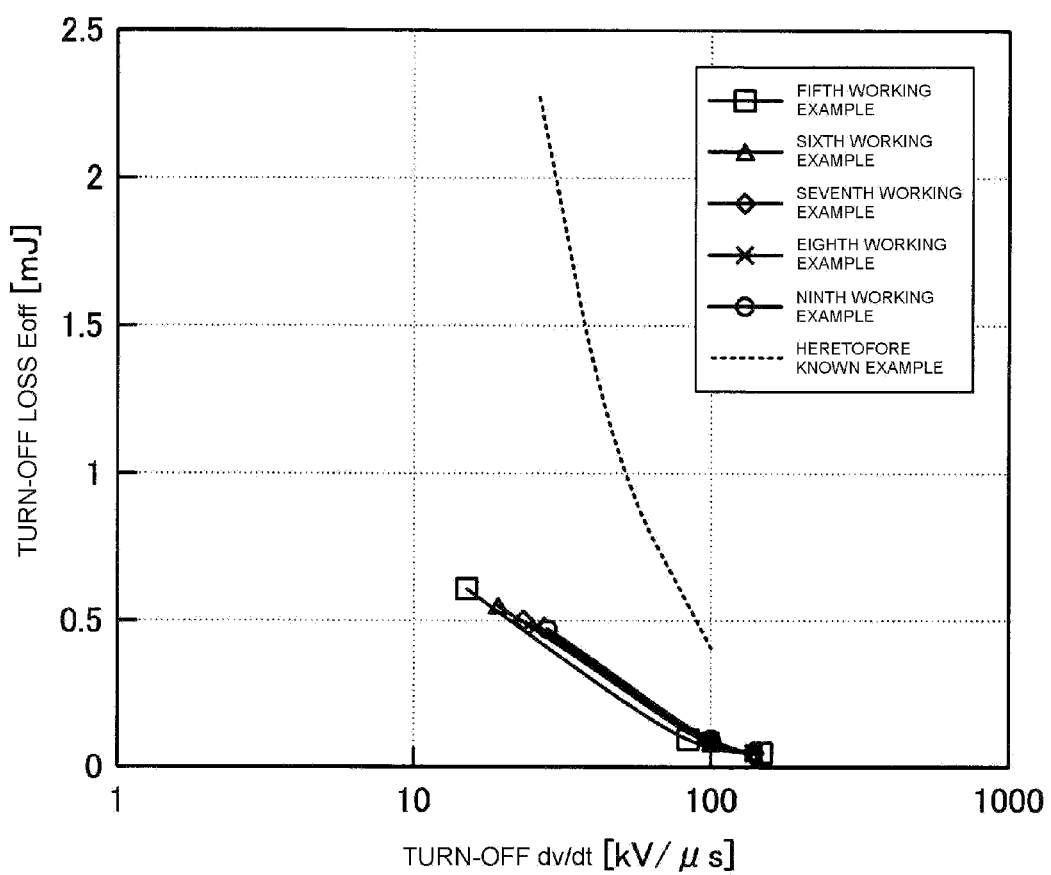
FIG. 24 is a diagram showing turn off characteristics in the semiconductor device according to Working Example 5.

FIG. 22 is a diagram showing p-type impurity concentration distributions of a semiconductor device according to Working Example 5. Also, FIG. 23 is a diagram showing electrical characteristics in the semiconductor device according to Working Example 5. Also, FIG. 24 is a diagram showing electrical characteristics of turn off in the semiconductor device according to Working Example 5. Firstly, in accordance with Embodiment 5, there are prepared five planar type MOSFETs (hereafter referred to as a fifth working example to a ninth working example) wherein the impurity concentration of the p-type medium concentration region 25 (the fourth depth d$_3$) from the lower end of the first depth d$_0$ to the second main surface side is taken to be $3.0 \times 10^{15}$ cm$^3$, $3.5 \times 10^{15}$ cm$^3$, $4.0 \times 10^{15}$ cm$^3$, $4.5 \times 10^{15}$ cm$^3$, and $5.0 \times 10^{15}$ cm$^3$, as shown in FIG. 22. Also, in the fifth working example to ninth working example, the thickness of the p-type high concentration region 23 (the second depth d$_1$) is taken to be 9 μm. The thickness of the p-type medium concentration region 25 (the fourth depth d$_3$) is taken to be 7 μm. Configurations other than these are the same as in the fourth working example. Also, as a comparison, the heretofore known example is prepared, as in Working Example 1. Then, in the fifth working example to ninth working example, a current-voltage waveform after an avalanche breakdown is measured. Also, in the fifth working example to ninth working example and heretofore known example, turn-off loss and turn-off dv/dt are measured.

From the results shown in FIG. 23, it can be seen that, when the impurity concentration of the p-type medium concentration region 25 is high, the drain-to-source voltage rises when the drain current increases. Specifically, although the drain-to-source voltage drops when the drain current increases in the fifth working example and sixth working example, the drain-to-source voltage rises in the seventh working example to ninth working example. That is, it can be seen that, in the seventh working example to ninth working example, it is difficult for negative resistance to occur, and avalanche withstanding capability improves. At this time, it is possible to secure a breakdown voltage of 640V. Also, in order to secure an avalanche withstanding capability at a rated current density of 130 Å/cm$^2$, it is preferable that the impurity concentration of the p-type medium concentration region 25 is in the region of $3.5 \times 10^{15}$ cm$^3$ (the sixth working example). Consequently, it is preferable that the impurity concentration of the p-type medium concentration region 25 is 1.2 times or more greater than the impurity concentration of the n-type low concentration region 22 adjacent to the p-type medium concentration region 25.

Also, from the results shown in FIG. 24, it can be seen that the higher the impurity concentration of the p-type medium concentration region 25, the worse the trade-off relationship between turn-off loss and turn-off dv/dt becomes. However, the turn-off loss in the fifth working example to ninth working example can be suppressed to 10% increase of the turn-off loss in the third working example (omitted from the drawing). Therefore, it can be seen that the trade-off relationship between turn-off loss and turn-off dv/dt can be improved in the fifth working example to ninth working example too, in the same way as in Working Example 3.

Also, in the fifth working example to ninth working example, it is possible, by providing the p-type medium concentration region 25, to gently change the impurity concentration distribution in the p-type region 2 from the first main surface side to the second main surface side. Due to this, it is supposed that ft is possible to lengthen the time from the drain-to-source voltage being applied to the drain-to-source voltage starting to rise (refer to the inclining working example of FIG. 18). Therefore, as it becomes still more difficult for a depletion layer to spread, and still more difficult for the drain-to-source voltage to rise, it is supposed that it is possible to further reduce the turn-off dv/dt.

Working Example 6

Figure 25:
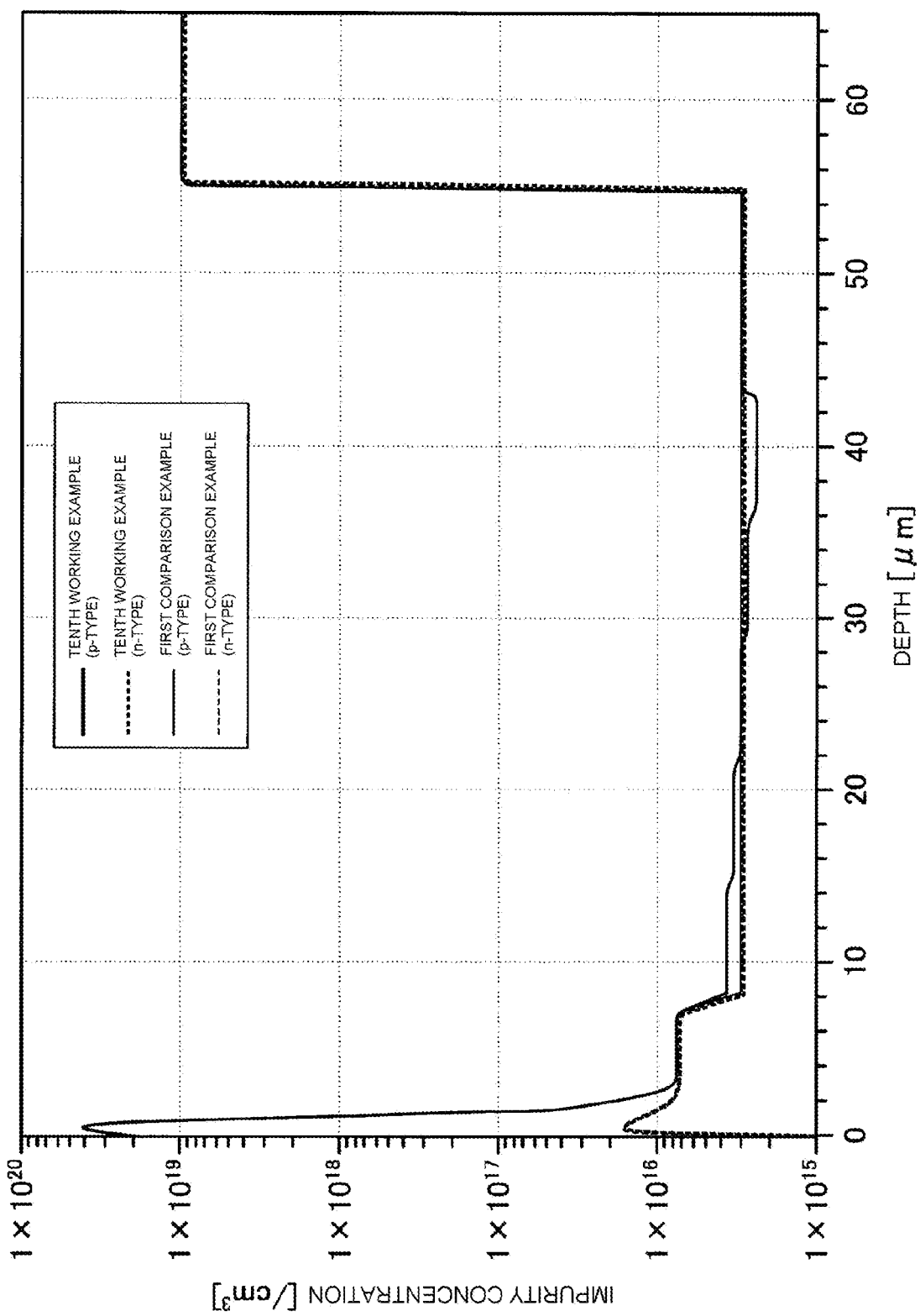
FIG. 25 is a diagram showing impurity concentration distributions of a semiconductor device according to Working Example 6.
Figure 26:
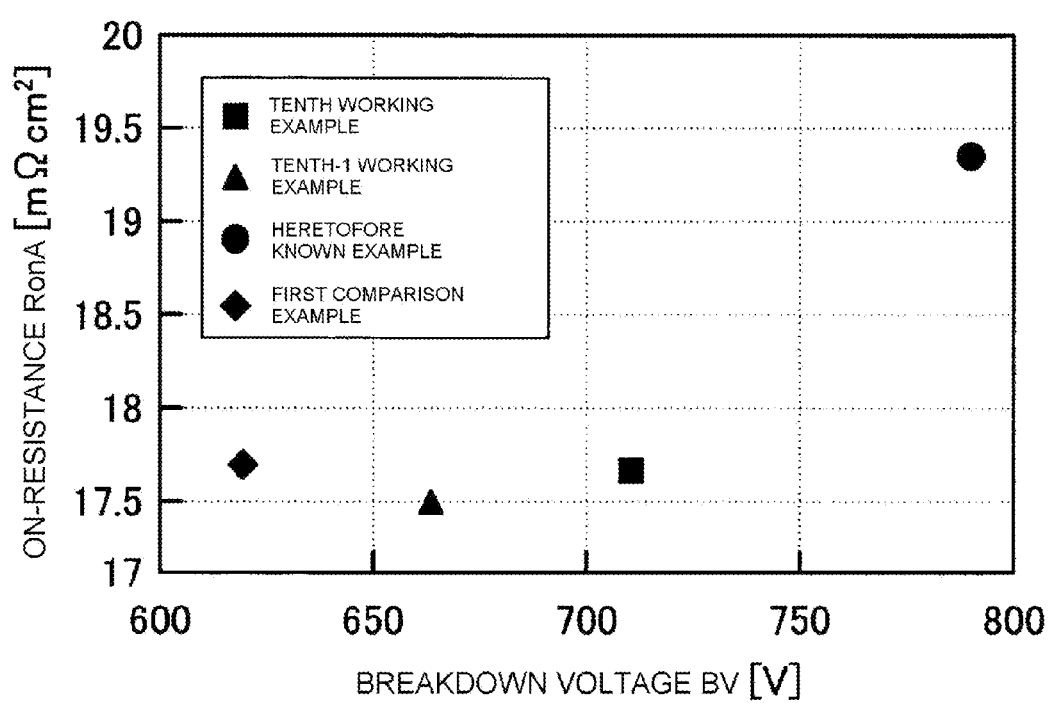
FIG. 26 is a diagram showing electrical characteristics in the semiconductor device according to Working Example 6.
Figures 1, 27:
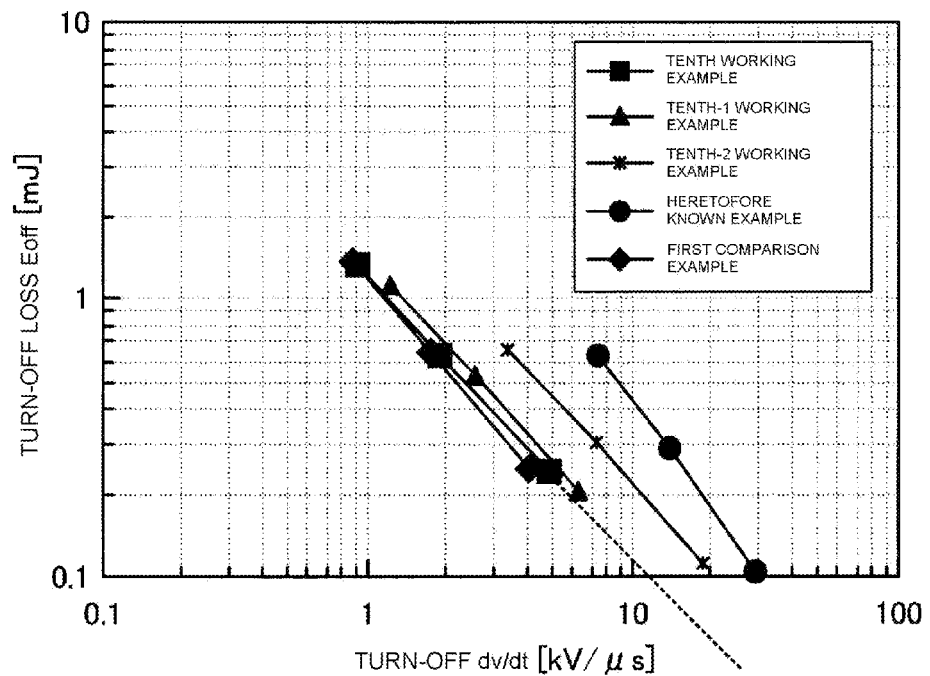
Figures 2, 27:
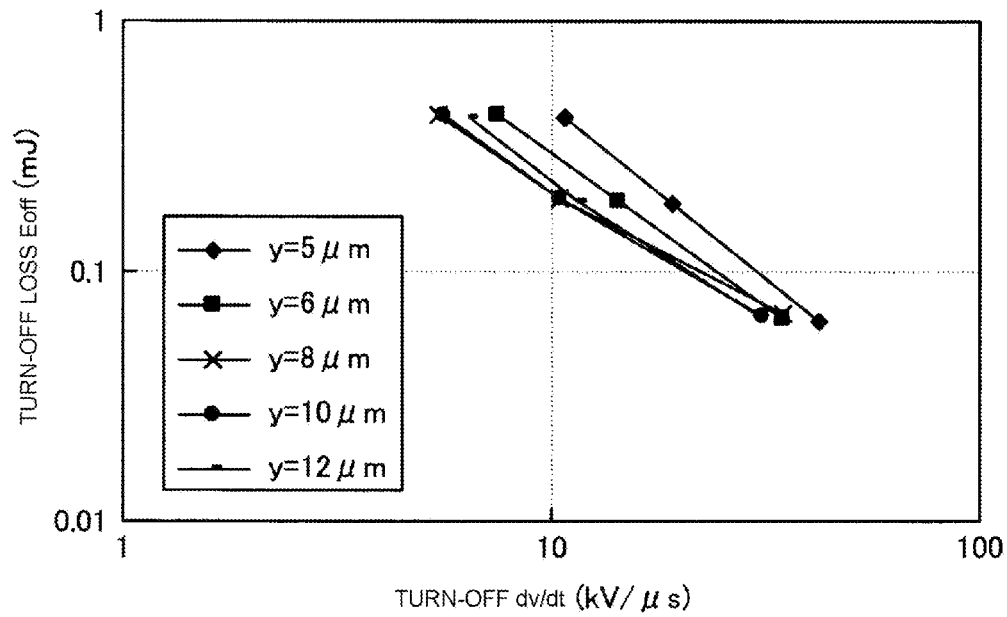

FIG. 25 is a diagram showing impurity concentration distributions of a semiconductor device according to Working Example 6. Also, FIG. 26 is a diagram showing electrical characteristics in the semiconductor device according to Working Example 6. Also, FIG. 27-1 and FIG. 27-2 are diagrams showing electrical characteristics of turn off in the semiconductor device according to Working Example 6. Firstly, in accordance with Embodiment 6, there is prepared a planar type MOSFET (hereafter referred to as a tenth working example) wherein the impurity concentration of the p-type low concentration region 24 is gradually reduced from the first main surface side to the second main surface side, as shown in FIG. 25. In the tenth working example, the impurity concentration of the n-type high concentration region 21 is taken to be $7.5 \times 10^{15}$ cm$^3$. The impurity concentration of the n-type low concentration region 22 is taken to be $3.0 \times 10^{15}$ cm$^3$. That is, the impurity concentration of the n-type high concentration region 21 is 2.5 times greater than the impurity concentration of the n-type low concentration region 22. The impurity concentration of the p-type high concentration region 23 is taken to be $1.5 \times 10^{16}$ cm$^3$. The impurity concentration of the p-type low concentration region 24 is taken to be $6.6 \times 10^{15}$ cm$^3$ on the first main surface side and $5.4 \times 10^{15}$ cm$^3$ on the second main surface side, an impurity concentration distribution that decreases in increments of $0.3 \times 10^{15}$ cm$^3$ from the first main surface side to the second main surface side. The depth from the upper end of the p-type region 2 at which the impurity concentration in the p-type region 2 changes (hereafter referred to as the concentration change depth), that is, the thickness of the p-type high concentration region 23, is taken to be 5 µm. Also, there is also prepared a tenth-1 working example wherein the impurity concentration of the p-type low concentration region 24 is taken to be $7.2 \times 10^{15}$ on the first main surface side and $4.8 \times 10^{15}$ cm$^3$ on the second main surface side, an impurity concentration distribution that decreases in increments of $0.6 \times 10^{15}$ cm$^3$ from the first main surface side to the second main surface side, and configurations other than these are the same as in the tenth working example. Furthermore, there is also prepared a tenth-2 working example wherein the impurity concentration of the n-type high concentration region 21 is taken to be $3.6 \times 10^{15}$ cm$^3$, the impurity concentration of the n-type low concentration region 22 is taken to be $3.0 \times 10^{15}$ cm$^3$, the impurity concentration of the n-type high concentration region 21 is 1.2 times greater than the impurity concentration of the n-type low concentration region 22, the impurity concentration of the p-type high concentration region 23 is taken to be $7.2 \times 10^{15}$ cm$^3$, the impurity concentration of the p-type low concentration region 24 is taken to be $6.0 \times 10^{15}$ cm$^3$, the impurity concentration of the p-type high concentration region 23 is 1.2 times greater than the impurity concentration of the p-type low concentration region 24, and configurations other than these are the same as in the tenth working example. As a comparison, the heretofore known example is prepared, as in Working Example 1. Also, there is prepared a planar type MOSFET wherein the impurity concentration distribution of the p-type low concentration region 24 is even (hereafter referred to as a first comparison example). In the first comparison example, the impurity concentration of the p-type low concentration region 24 is taken to be $6.0 \times 10^{15}$ cm$^3$ Configurations other than this are the same as in the tenth working example. Then, breakdown voltage and on-resistance are measured for each sample. Also, turn-off loss and turn-off dv/dt are measured for each sample. Results are shown as a net doping (net carrier concentration) in FIG. 25. That is, as an n-type region is formed by phosphorus over the whole of a semiconductor substrate, and a p-type region formed by introducing boron, the net doping of the p-type region in FIG. 25 is a value wherein the phosphorus concentration is subtracted from the boron concentration.

From the results shown in FIG. 26, on-resistance is low in the tenth working example and tenth-1 working example in comparison with the heretofore known example. Also, breakdown voltage is high in the tenth working example and tenth-1 working example in comparison with the first comparison example. Therefore, it can be seen that the trade-off relationship between on-resistance and breakdown voltage is most improved in the tenth working example. Also, from the results shown in FIG. 27-1, it can be seen that turn-off loss decreases more in the tenth working example, tenth-1 working example, and tenth-2 working example than in the heretofore known example. Specifically, when turn-off dv/dt is, for example, 10 kV/µs, the turn-off loss in the tenth working example is about 0.1 mJ. The turn-off loss in the heretofore known example is about 0.4 mJ. That is, in the tenth working example, it is possible to reduce the turn-off loss to one-fourth of that in the heretofore known example. It can be seen that, it is possible to better improve both the trade-off relationship between on-resistance and breakdown voltage and the trade-off relationship between turn-off loss and turn-off dv/dt in the tenth working example than in the heretofore known example. Also, it can be seen that the turn-off loss is reduced more in both the tenth-1 working example and tenth-2 working example than in the heretofore known example, and both the trade-off relationship between on-resistance and breakdown voltage and the trade-off relationship between turn-off loss and turn-off dv/dt can be improved more than in the heretofore known example.

FIG. 27-2 is a diagram showing the trade-off relationship between turn-off loss and turn-off dv/dt when the point of a depth y at which the two p-type and n-type high concentration regions change to a low concentration region is changed between 5 µm and 12 µm. In FIG. 27-2, although the trade-off relationship between turn-off loss and turn-off dv/dt improves when y is deeper than 5 µm, the trade-off relationship is not as good at 12 µm as at 10 µm.

Working Example 7

Figures 1, 28:
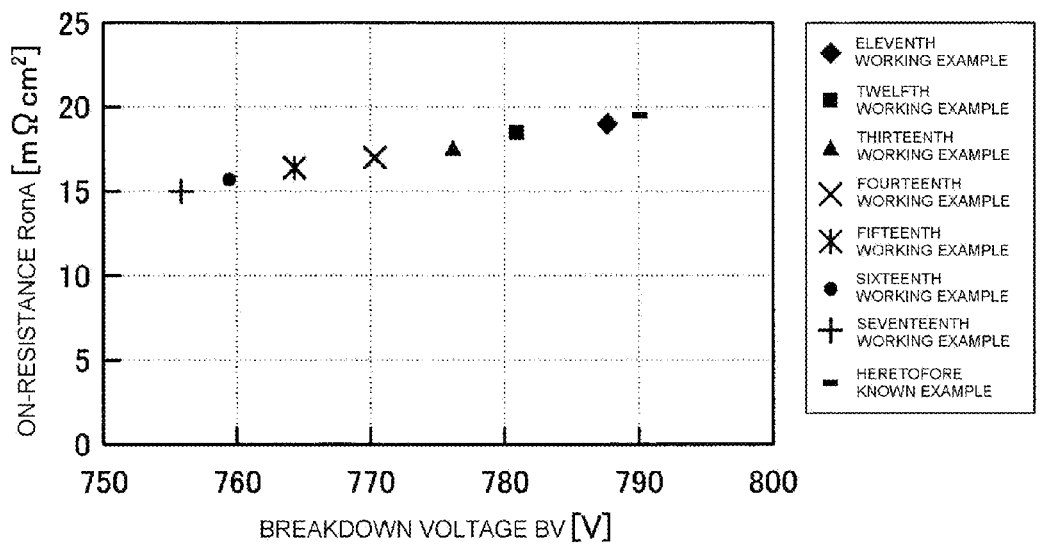
Figures 2, 28:
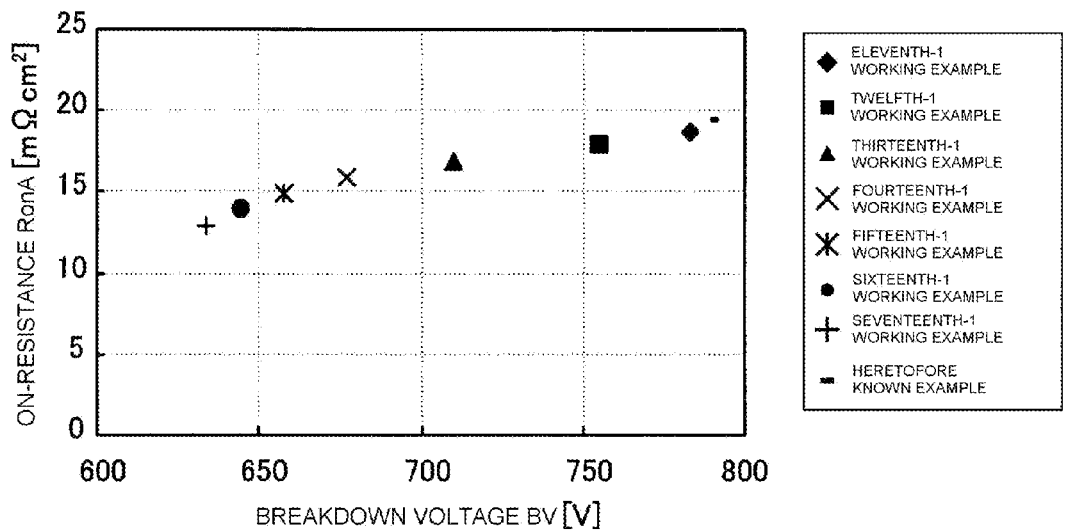
Figures 1, 29:
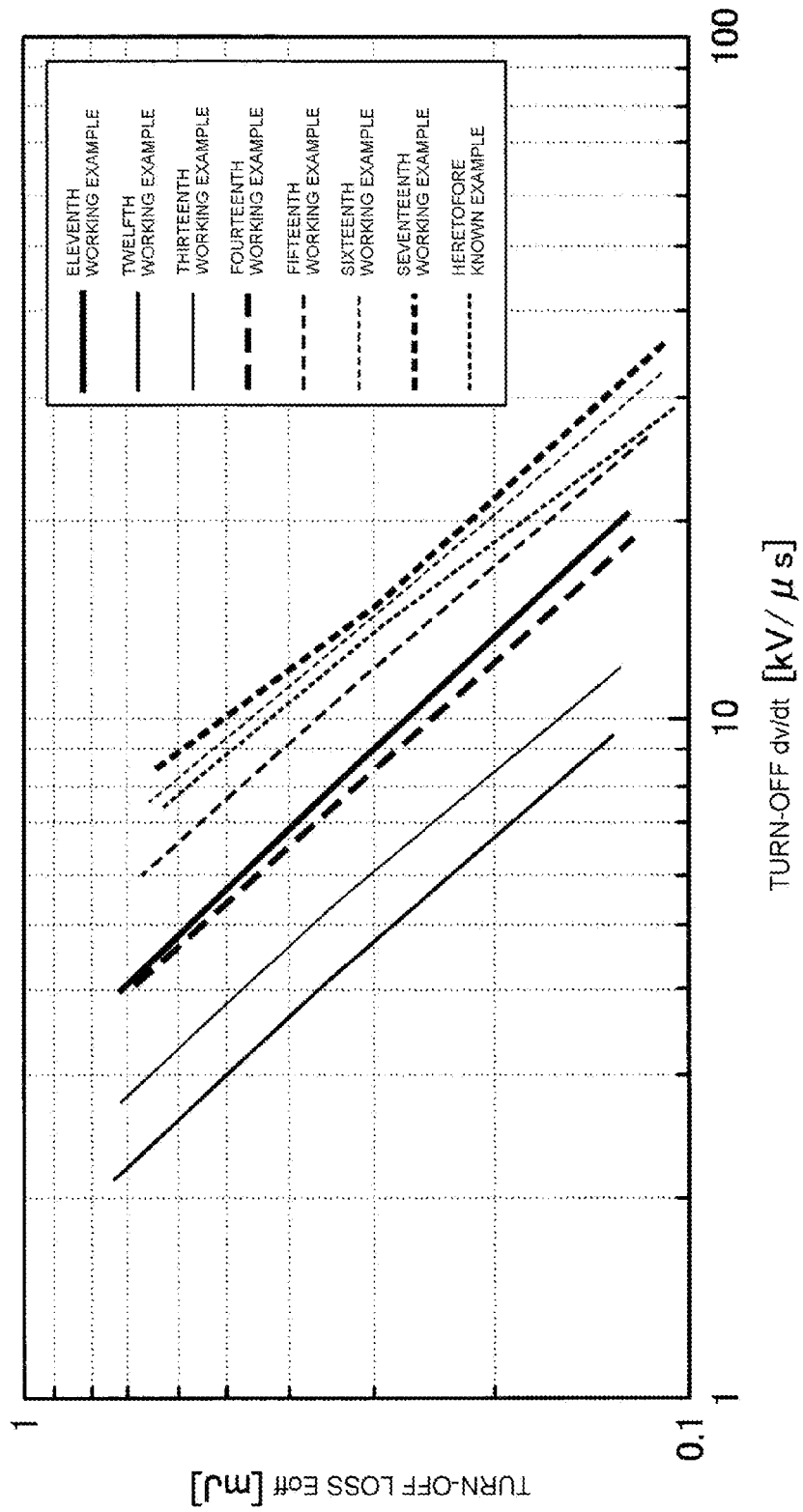
Figures 2, 29:
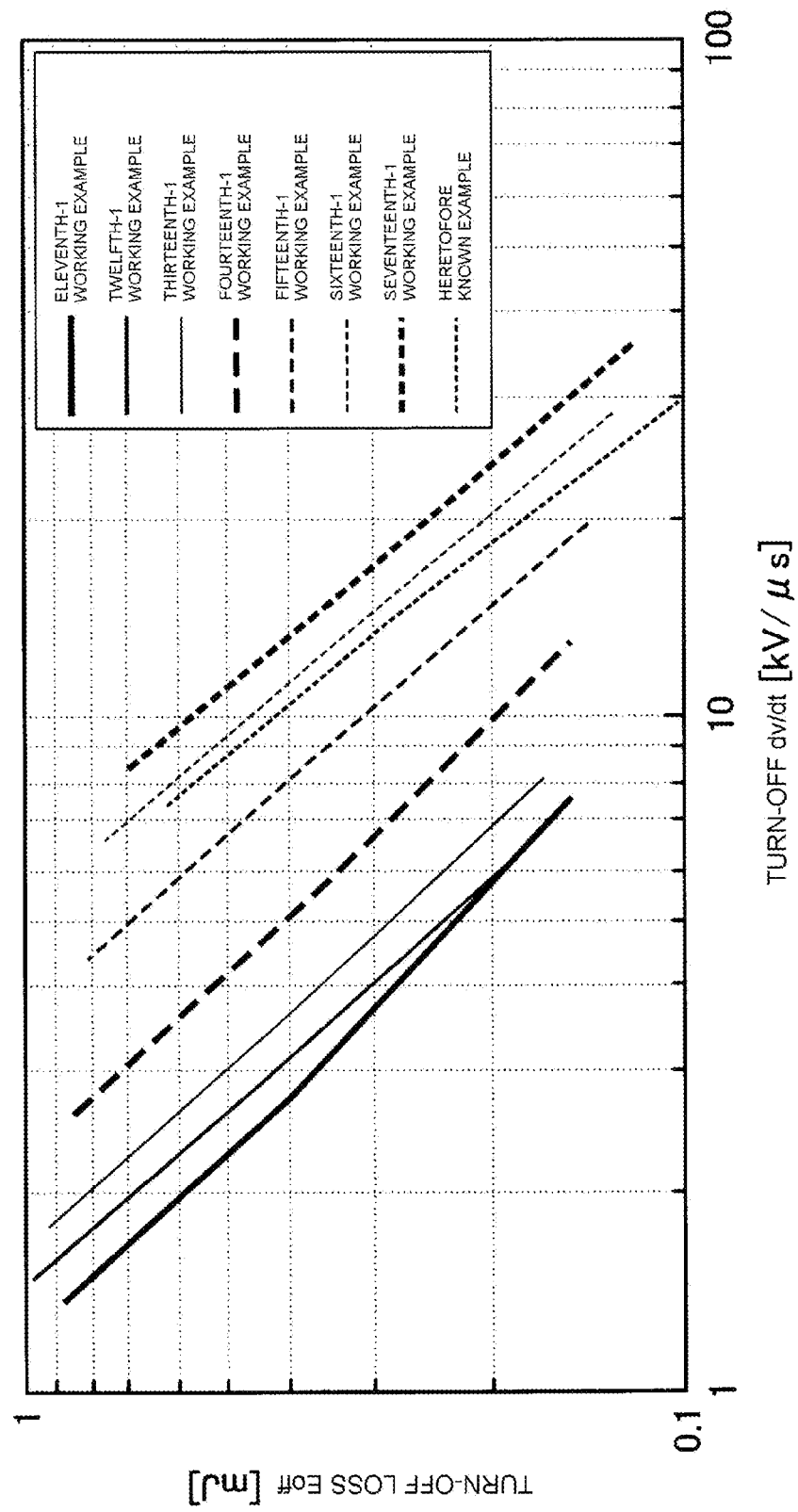

FIG. 28-1 and FIG. 28-2 are diagrams showing electrical characteristics in a semiconductor device according to Working Example 7. Also, FIG. 29-1 and FIG. 29-2 are diagrams showing electrical characteristics of turn off in the semiconductor device according to Working Example 7. Firstly, in accordance with Embodiment 6, there are prepared seven planar type MOSFETs (hereafter referred to as an eleventh working example to a seventeenth working example) wherein the concentration change depth (the thickness of the n-type high concentration region 21) is 1 µm, 5 µm, 10 µm, 15 µm, 20 µm, 25 µm, and 30 µm. In the eleventh working example to seventeenth working example, the thickness of the p-type high concentration region 23 is the same as that of the n-type high concentration region 21 in each case. The impurity concentration of the n-type high concentration region 21 is taken to be $4.5 \times 10^{15}$ cm$^3$. The impurity concentration on the first main surface side of the n-type region 1 is taken to be $3.0 \times 10^{15}$ cm$^3$. The impurity concentration of the p-type high concentration region 23 is taken to be $9.0 \times 10^{15}$ cm$^3$, and the impurity concentration of the p-type low concentration region 24 is taken to be $6.0 \times 10^{15}$ cm$^3$. Configurations other than these are the same as in Working Example 6. Also, as modification examples of the eleventh working example to seventeenth working example, there are prepared seven planar type MOSFETs (hereafter referred to as an eleventh-1 working example to a seventeenth-1 working example) with two times the concentration difference, wherein the concentration change depth (the thickness of the n-type high concentration region 21) is 1 µm, 5 µm, 10 µm, 15 µm, 20 µm, 25 µm, and 30 µm, the impurity concentration of the n-type high concentration region 21 is taken to be $7.5 \times 10^{15}$ cm$^3$, the impurity concentration on the first main surface side of the n-type region 1 is taken to be $3.0\times10^{15}$ cm$^3$, the impurity concentration of the p-type high concentration region 23 is taken to be $1.5\times10^{16}$ cm$^3$, and the impurity concentration of the p-type low concentration region 24 is taken to be $6.0\times10^{15}$ cm$^3$. As a comparison, the heretofore known example is prepared, as in Working Example 1. Then, breakdown voltage and on-resistance are measured for each sample. Also, turn-off loss and turn-off dv/dt are measured for each sample.

From the results shown FIG. 28-1 and FIG. 28-2, it can be seen that it is possible to reduce on-resistance in the eleventh working example to seventeenth working example, and eleventh-1 working example to seventeenth-1 working example, in comparison with the heretofore known example. Also, it can be seen that the greater the concentration change depth, the more it is possible to reduce the on-resistance. As opposed to this, it can be seen that breakdown voltage decreases in the eleventh working example to seventeenth working example, and eleventh-1 working example to seventeenth-1 working example, in comparison with the heretofore known example. Also, it can be seen that the greater the concentration change depth, the more the breakdown voltage decreases. Also, from the results shown in FIG. 29-1 and FIG. 29-2, it can be seen that the greater the concentration change depth, the more it is possible to improve the trade-off relationship between turn-off loss and turn-off dv/dt. However, it can be seen that, when the concentration change depth is too great, the trade-off relationship between turn-off loss and turn-off dv/dt is worse than in the heretofore known example. Specifically, it can be seen that in the case of the fifteenth working example and fifteenth-1 working example, the trade-off relationship between turn-off loss and turn-off dv/dt is realized to the same extent as in the heretofore known example, and is not made worse than in the heretofore known example. From this result, it can be seen that it is necessary for the concentration change depth to be one-half or less of the thickness of the p-type region 2. Also, from the results shown in FIG. 28-1 and FIG. 28-2 and FIG. 29-1 and FIG. 29-2, it can be seen that it is possible to better improve both the trade-off relationship between on-resistance and breakdown voltage and the trade-off relationship between turn-off loss and turn-off dv/dt in the case of the twelfth working example and twelfth-1 working example, and the thirteenth working example and thirteenth-1 working example, than in the heretofore known example. From this result, it is good when the concentration change depth is one-third or less of the thickness of the p-type region 2 (refer to the thirteenth working example and thirteenth-1 working example). Preferably, it is good when the concentration change depth is one-eighth or more, one-fourth or less, of the thickness of the p-type region 2 (refer to the twelfth working example and twelfth-1 working example).

Working Example 8

Figure 30:
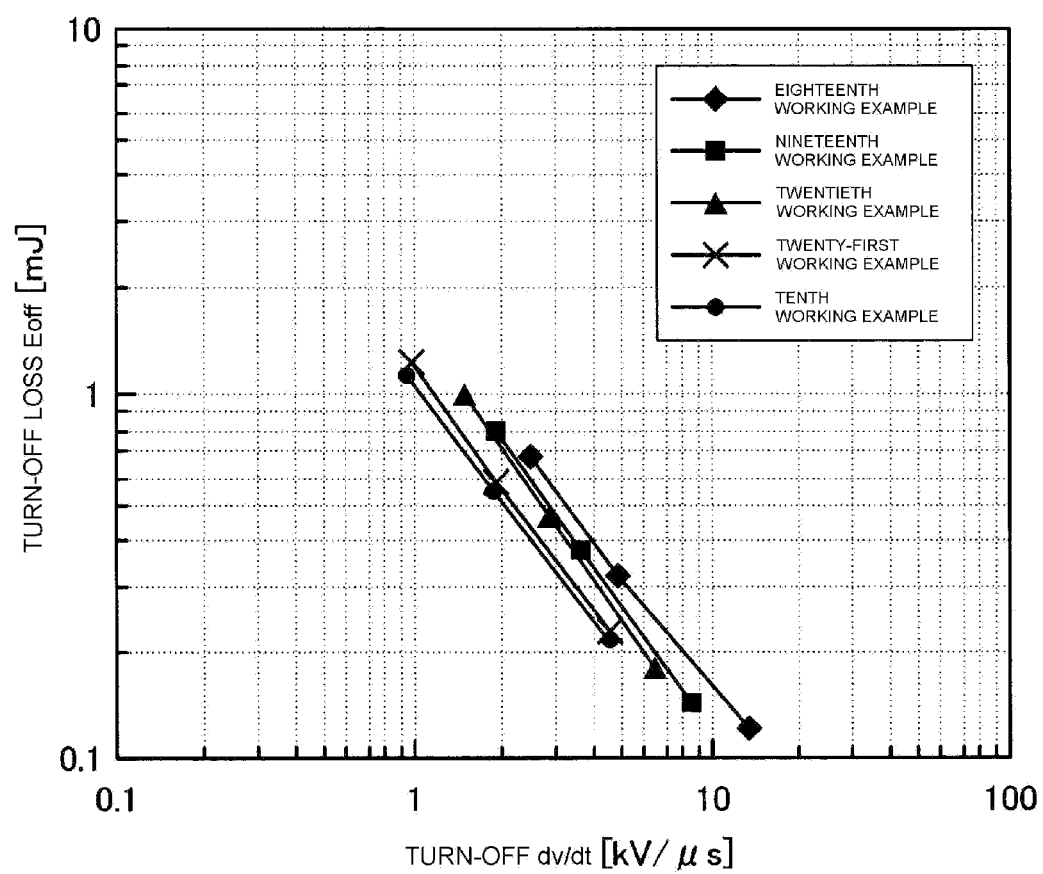
FIG. 30 is a diagram showing turn off characteristics in a semiconductor device according to Working Example 8.

FIG. 30 is a diagram showing electrical characteristics of turn off in a semiconductor device according to Working Example 8. Firstly, in accordance with Embodiment 6, there are prepared four planar type MOSFETs (hereafter referred to as an eighteenth working example to a twenty-first working example) wherein the impurity concentration of the n-type high concentration region 21 is 1.33 times, 1.67 times, 2 times, and 2.33 times greater than the impurity concentration of the n-type low concentration region 22. Also, as in Working Example 6, the tenth working example, wherein the impurity concentration of the n-type high concentration region 21 is 2.5 times greater than the impurity concentration of the n-type low concentration region 22, is prepared. Then, turn-off loss and turn-off dv/dt are measured for each sample. From the results shown in FIG. 30, it can be seen that the higher the ratio of the impurity concentration of the n-type high concentration region 21 with respect to the impurity concentration of the n-type low concentration region 22, the more it is possible to improve the trade-off relationship between turn-off loss and turn-off dv/dt. Also, it is possible to improve the trade-off relationship between turn-off loss and turn-off dv/dt in virtually the same way in the eighteenth working example to twenty-first working example. Also, in the tenth working example, a breakdown voltage of 600V is confirmed in a working example wherein there is an impurity concentration ratio of 3 times, and the impurity concentration of the p-type low concentration region 24 is an impurity concentration distribution that decreases in increments of $0.45\times10^{15}$ cm$^3$ from the first main surface side to the second main surface side. Because of this, it can be seen that it is good when the ratio of the impurity concentration of the n-type high concentration region 21 with respect to the impurity concentration of the n-type low concentration region 22 is 1.2 times or more, 3 times or less, and preferably 2.5 times or less.

Embodiment 7

As main methods of manufacturing an SJ-MOSFET, there are a multi epitaxial method and a trench filling method. As it is possible with the trench filling method to make a parallel p-n structure simply by once forming a deep trench in an n-epitaxial layer and filling in with a p-type epitaxial layer, this method is easier than the multi epitaxial method.

However, as a parallel p-n portion is swiftly depleted when the SJ-MOSFET changes from an on-state to an off-state, the drain-to-source voltage time change rate (dv/dt) increases when the SJ-MOSFET is turned off. That is, there is further room for improvement in a trade-off between Eoff and turn off dv/dt in comparison with a heretofore known MOSFET.

Also, as the current-voltage characteristics are negative when an avalanche generation occurs under charge balance conditions such that breakdown voltage peaks, avalanche withstanding capability is negative. These problems are common to both the multi epitaxial and trench filling manufacturing methods.

Using the manufacturing steps of the following embodiments, it is possible to make a device wherein an Eoff-turn off dv/dt trade-off can be improved using the trench filling method, which is easier than the multi epitaxial method.

Figure 31:
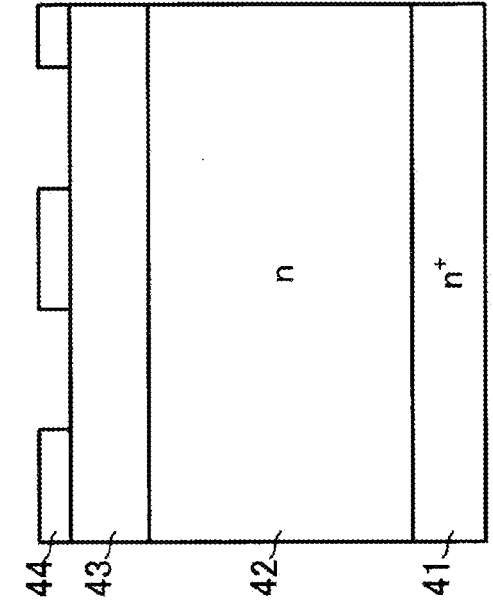
FIG. 31 is sectional views showing manufacturing steps (stage 1) of a semiconductor device according to Embodiment 7.
Figure 31:
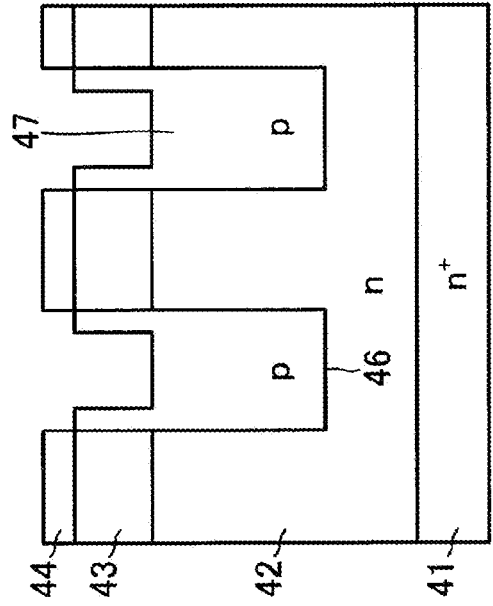
Figure 31:
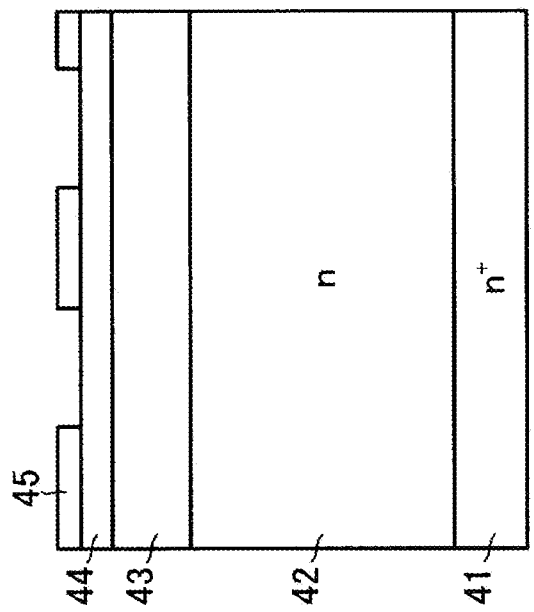
Figure 31:
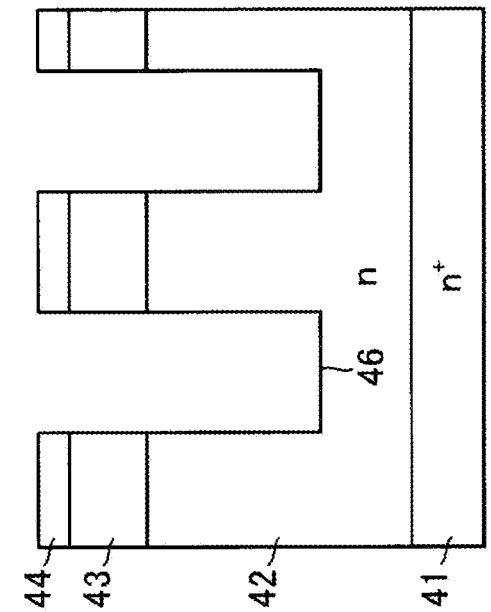

FIG. 31 and FIG. 32 are sectional views showing, in order, manufacturing steps of a semiconductor device according to Embodiment 7. Firstly, as shown in FIG. 31(a), an n-type low concentration region 42 and a high concentration n-type surface region 43 are deposited in order on an n$^+$ drain region 41, and a patterning is performed on a resist 95 on a surface mask oxide film 44. Next, as shown in FIG. 31(b), the mask oxide film 44 is etched, revealing the surface of the n-type surface region 43, and furthermore, as shown in FIG. 31(c), a deep trench etching is carried out, forming a deep trench 46. Next, as shown in FIG. 31(d), a low concentration p-epitaxial layer 47 is epitaxially grown and embedded inside the deep trench 46.

Continuing, in the step of FIG. 32(a), the surface of the low concentration p-epitaxial layer 47 is etched back using a plasma etching, or the like, so that the heights of the low concentration p-epitaxial layer 47 and n-type low concentration region 42 are approximately equal. Furthermore, as shown in FIG. 32(b), a high concentration p-epitaxial layer 48 is epitaxially grown and embedded inside the deep trench 46, forming the high concentration p-epitaxial layer 48 on the surface of the low concentration p-epitaxial layer 47. Next, as shown in FIG. 32(c), a planarization of the surface is carried out using chemical-mechanical polishing (CMP), or the like. In FIG. 32 (d), which is a subsequent step, a final device form is obtained in accordance with a step the same as the step forming the planar MOS structure of Embodiment 1. 49 is a p-base region, 50 an n$^+$ source region, 51 a gate insulating film, 52 a gate electrode, 53 an interlayer insulating film, and 54 a source electrode. In the structure of FIG. 32(d), the low concentration p-epitaxial layer 47 and n-type low concentration region 42 have approximate charge balance, and the n-type surface region 43 and high concentration p-layer 48 have approximate charge balance. With a first main surface as a reference, the depth of the n-type surface region 43 and high concentration p-epitaxial layer 48 is one-eighth or more, one-half or less, the depth of a whole parallel p-n layer portion.

As heretofore described, as it is possible according to Embodiment 7, to make a device wherein an Eoff-turn off dv/dt trade-off can be improved using the filling epitaxial method, it is possible to make the process simpler than when manufacturing the same kind of device using the multi epitaxial method.

Embodiment 8

Figure 33:
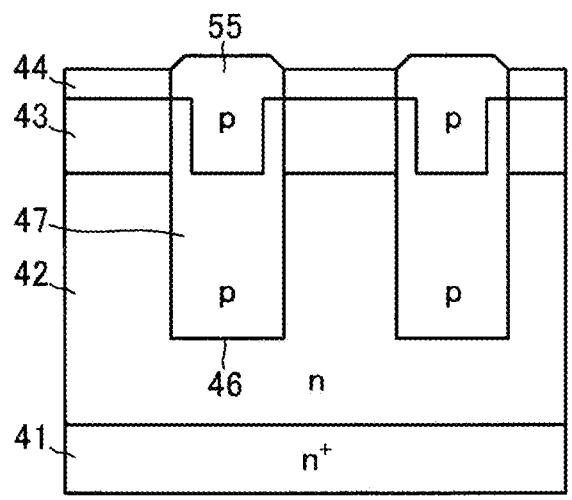
FIG. 33 is sectional views showing manufacturing steps of a semiconductor device according to Embodiment 8.
Figure 33:
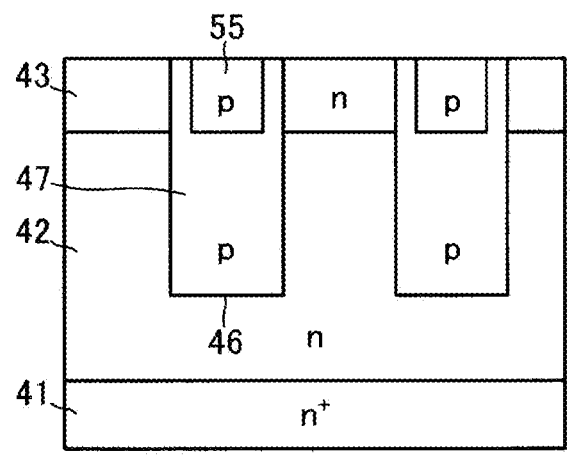
Figure 33:
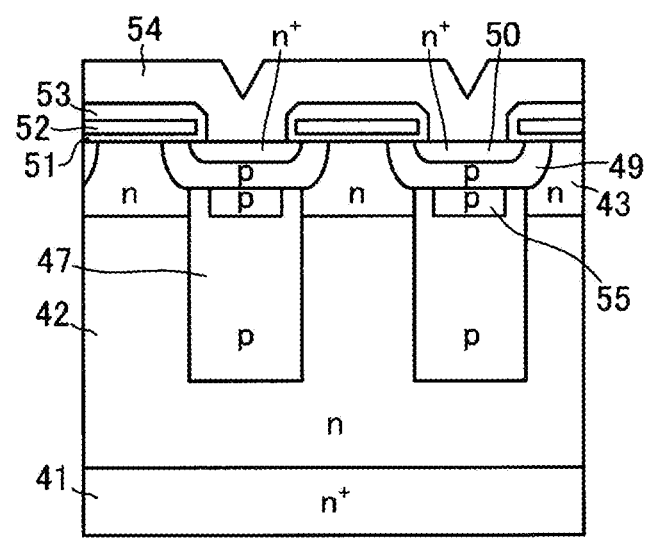

FIG. 33 is sectional views showing, in order, manufacturing steps of a semiconductor device according to Embodiment 8. Firstly, manufacturing is carried out using the same procedure as in FIGS. 31 (a) to (d). In a subsequent step, however, firstly, a high concentration p-layer 55 is formed on the low concentration p-epitaxial layer 47 embedded inside the deep trench 46, as shown in FIG. 33 (a), without the surface of the low concentration p-epitaxial layer 47 being etched back. Continuing, as shown in FIG. 33 (b), a planarization of the surface is carried out using chemical-mechanical polishing (CMP), or the like. In FIG. 33 (c), which is a subsequent step, a final device form is obtained in accordance with a step the same as the step forming the planar MOS structure of Embodiment 1. That is, as Embodiment 8 is a manufacturing method whereby the etching back of the low concentration p-epitaxial layer 47 shown in FIG. 32 (a) in Embodiment 7 is omitted, it is possible to simplify the steps more than in Embodiment 7.

In the structure of FIG. 33 (c), the low concentration p-epitaxial layer 47 and n-type low concentration region 42 have approximate charge balance, and the n-type surface region 43 and high concentration p-layer 55 have approximate charge balance. With a first main surface as a reference, the depth of the n-type surface region 43 and high concentration p-layer 55 is one-eighth or more, one-half or less, the depth of a whole parallel p-n layer portion.

As heretofore described, as it is possible according to Embodiment 8, to make a device wherein an Eoff-turn off dv/dt trade-off can be improved using the filling epitaxial method, it is possible to make the process simpler than when manufacturing the same kind of device using the multi epitaxial method.

Embodiment 9

In Embodiment 7 and Embodiment 8, the depths of the n-type surface region 43 and high concentration p-layers 48 and 55 are approximately equal but, in order to increase avalanche withstanding capability, it is sufficient that the high concentration p-layers 48 and 55 are formed so as to be deeper than the n-type surface region 43.

FIG. 34 is sectional views showing, in order, manufacturing steps of a semiconductor device according to Embodiment 9. Firstly, manufacturing is carried out using the same procedure as in FIGS. 31(a) to (c). In a subsequent step, firstly, the low concentration p-epitaxial layer 47 is epitaxially grown and embedded inside the deep trench 46, as shown in FIG. 34(a). It is preferable that the amount of the low concentration p-epitaxial layer 47 embedded is reduced in comparison with FIG. 31(d). This is because it is possible to reduce the amount of etch back in a subsequent step. Although the surface of the low concentration p-epitaxial layer 47 is etched back using a plasma etching, or the like, in the following FIG. 34(b), a deep etch back is carried out so that the height of the low concentration p-epitaxial layer 47 is lower than the lower end of the n-type surface region 43. In the following FIG. 34(c), the high concentration p-layer 48 is epitaxially grown and embedded inside the deep trench 46, forming the high concentration p-layer 48 on the surface of the low concentration p-epitaxial layer 47. Subsequently, as shown in FIG. 34(d), a planarization of the surface is carried out using CMP, or the like. The structure of FIG. 34 (e) is obtained as a final device form.

As heretofore described, in Embodiment 9, the low concentration p-epitaxial layer 47 and n-type low concentration region 42 have approximate charge balance, and the n-type surface region 43 has approximate charge balance with the opposing high concentration p-layer 48. However, as the lower end of the high concentration p-layer 48 is formed deeper than the lower end of the n-type surface region 43, unlike in Embodiment 7, a portion in which the high concentration p-layer 48 and n-type low concentration region 42 are opposed becomes p-rich. With a first main surface as a reference, the depths of the n-type surface region 43 and high concentration p-layer 48 are one-eighth or more, one-half or less, the depth of a whole parallel p-n layer portion, By so doing, it is possible to make a device, using the filling epitaxial method, wherein it is possible to achieve not only the same kind of Eoff-turn off dv/dt trade-off improvement as in Embodiment 7, but also, by providing a p-rich region, an improvement in avalanche withstanding capability. Herein, a region that is opposed to a certain region refers to a portion positioned at approximately the same depth as the certain region, and to which the certain region is adjacent (hereafter, the same applies in Embodiments 10 to 12).

Embodiment 10

Sectional views of manufacturing steps when applying the manufacturing steps of the semiconductor device according to Embodiment 9 to a manufacturing method for fabricating the semiconductor device according to Embodiment 2 are as in FIG. 35. FIG. 35 is sectional views showing, in order, manufacturing steps of a semiconductor device according to Embodiment 10. Firstly, manufacturing is carried out using the same procedure as in FIGS. 31(a) to (c). Next, in FIG. 35(a), the low concentration p-epitaxial layer 47 is epitaxially grown and embedded inside the deep trench 46, in the same way as in FIG. 34(a). In the following step of FIG. 35(b), the high concentration p-layer 55 is formed on the low concentration p-epitaxial layer 47, without the low concentration p-epitaxial layer 47 being etched back. Subsequently, as shown in FIG. 35(c), a planarization of the surface is carried out using CMP, or the like. A final device form is as in FIG. 35 (d).

As heretofore described, in Embodiment 10, unlike in Embodiment 9, the n-type surface region 43 on a first main surface side has approximate charge balance with the average concentration of the opposing low concentration p-epitaxial layer 47, but other configurations are the same as in Embodiment 9. In Embodiment 10, the depths of the n-type surface region 43 and high concentration p-layer 55 are one-eighth or more, one-half or less, the depth of a whole parallel p-n layer portion having the first main surface as a reference.

Embodiment 11

In Embodiment 9, instead of deepening the high concentration p-layer 48, a medium concentration p-layer 56 may be provided between a high concentration p-layer 57 and the low concentration p-epitaxial layer 47 so that the depths of the n-type surface region 43 and high concentration p-layer 57 are approximately the same. Embodiment 11 has this kind of structure.

Figure 36:
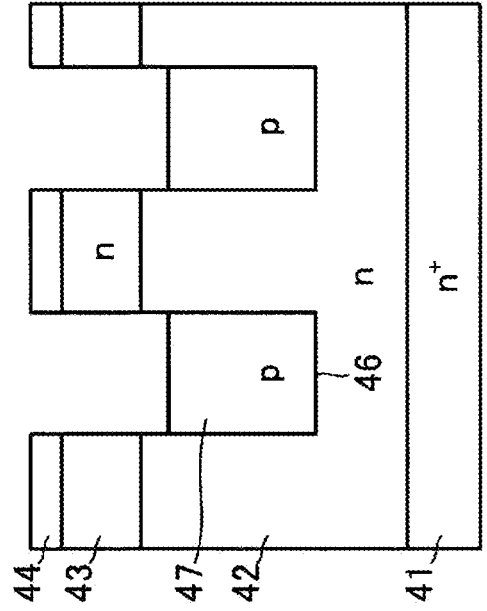
FIG. 36 is sectional views showing manufacturing steps (stage 1) of a semiconductor device according to Embodiment 11.
Figure 36:
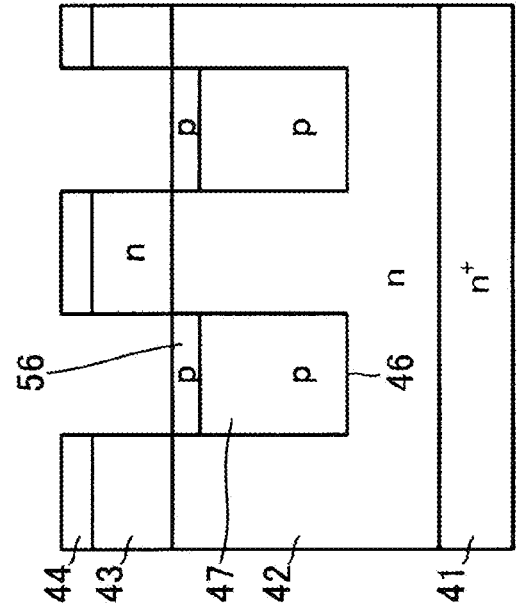
Figure 36:
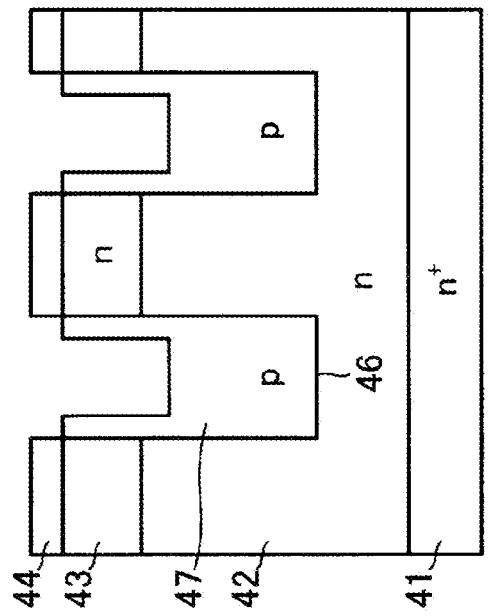
Figure 36:
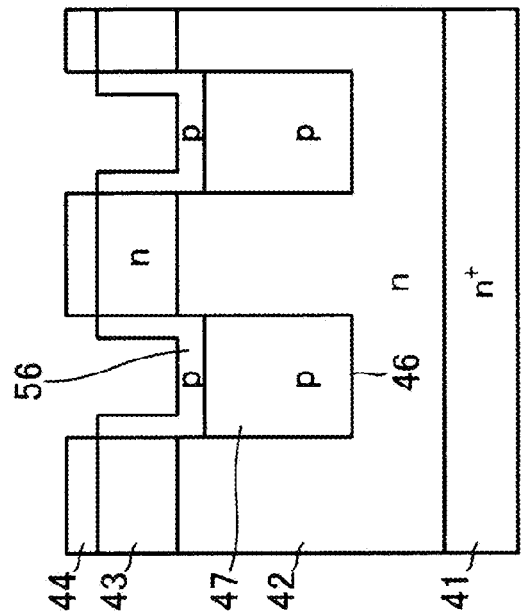
Figure 37:
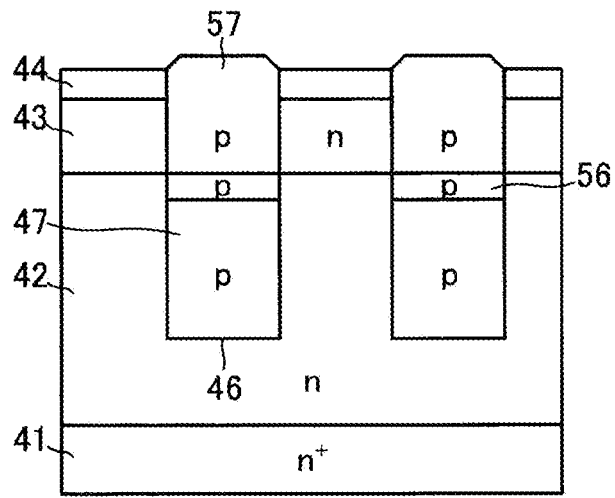
FIG. 37 is sectional views showing manufacturing steps (stage 2) of the semiconductor device according to Embodiment 11.
Figure 37:
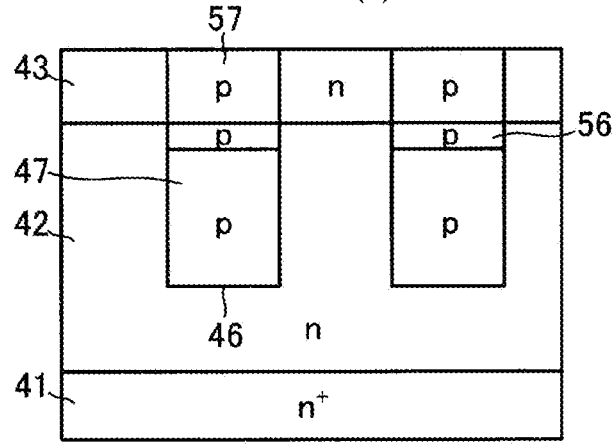
Figure 37:
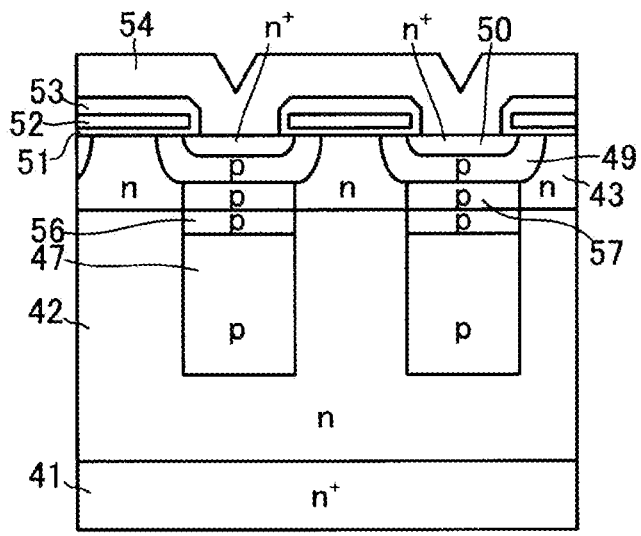

FIG. 36 and FIG. 37 are sectional views, showing, in order, manufacturing steps of a semiconductor device according to Embodiment 11. Firstly, manufacturing is carried out using the same procedure as in FIGS. 31(a) to (c). Next, in FIG. 36(a), the low concentration p-epitaxial layer 47 is epitaxially grown and embedded inside the deep trench 46, in the same way as in FIG. 35(a). After carrying out an etch back of the low concentration p-epitaxial layer 47, as shown in the following FIG. 36(b), the medium concentration p-layer 56 is epitaxially grown and embedded, as in FIG. 36(c). Then, the medium concentration p-layer 56 is etched back, as shown in FIG. 36(d), so that the heights of the upper surface of the medium concentration p-layer 56 and the upper surface of the n-type low concentration region 42 are approximately the same. Subsequently, as shown in FIG. 37(a), the high concentration p-layer 57 is epitaxially grown and embedded inside the deep trench 46, forming the high concentration p-layer 57 on the surface of the medium concentration p-layer 56. Then, as shown in FIG. 37(b), a planarization of the surface is carried out using CMP, or the like. A final device form is as in FIG. 37 (c).

In the final device structure of FIG. 37(c), the low concentration p-epitaxial layer 47 and the opposing n-type low concentration region 42 have approximate charge balance, and on the first main surface side, the n-type surface region 43 has approximate charge balance with the high concentration p-layer 57. However, as a portion in which the medium concentration p-layer 56 and the opposing n-type low concentration region 42 are opposed becomes p-rich, thus preventing negative resistance, it is possible to improve avalanche withstanding capability. The depth of the n-type surface region 43 is one-eighth or more, one-half or less, the depth of a whole parallel p-n layer portion having the first main surface as a reference. Also, the depths of the high concentration p-layer 57 and medium concentration p-layer 56 are one-eighth or more, one-half or less, the depth of the whole parallel p-n layer portion. As the portion in which the high concentration p-layer 48 and n-type low concentration region 42 are opposed in Embodiment 9 is replaced in Embodiment 11 with the portion in which the medium concentration p-layer 56 and n-type low concentration region 42 are opposed, the extent of p-richness in Embodiment 11 is lower than in Embodiment 9, thus improving the Eoff-turn off dv/dt trade-off.

As heretofore described, with the manufacturing method of Embodiment 11, it is possible to easily manufacture a device wherein improvements in Eoff-turn off dv/dt trade-off and avalanche withstanding capability are simultaneously achieved.

Embodiment 12

Figure 38:
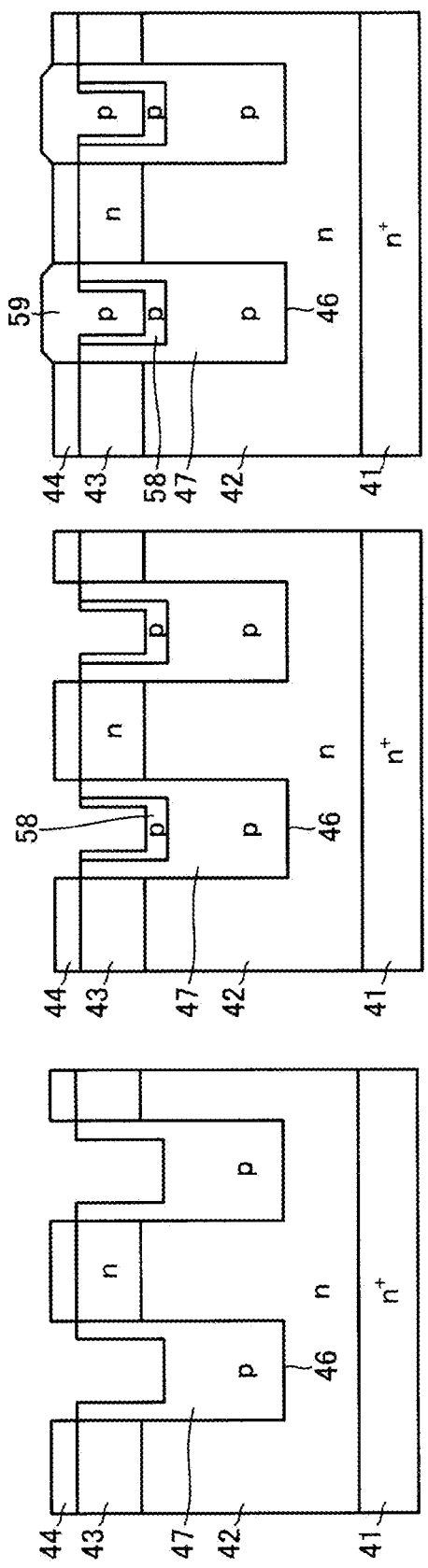
FIG. 38 is sectional views showing manufacturing steps of a semiconductor device according to Embodiment 12.
Figure 39:
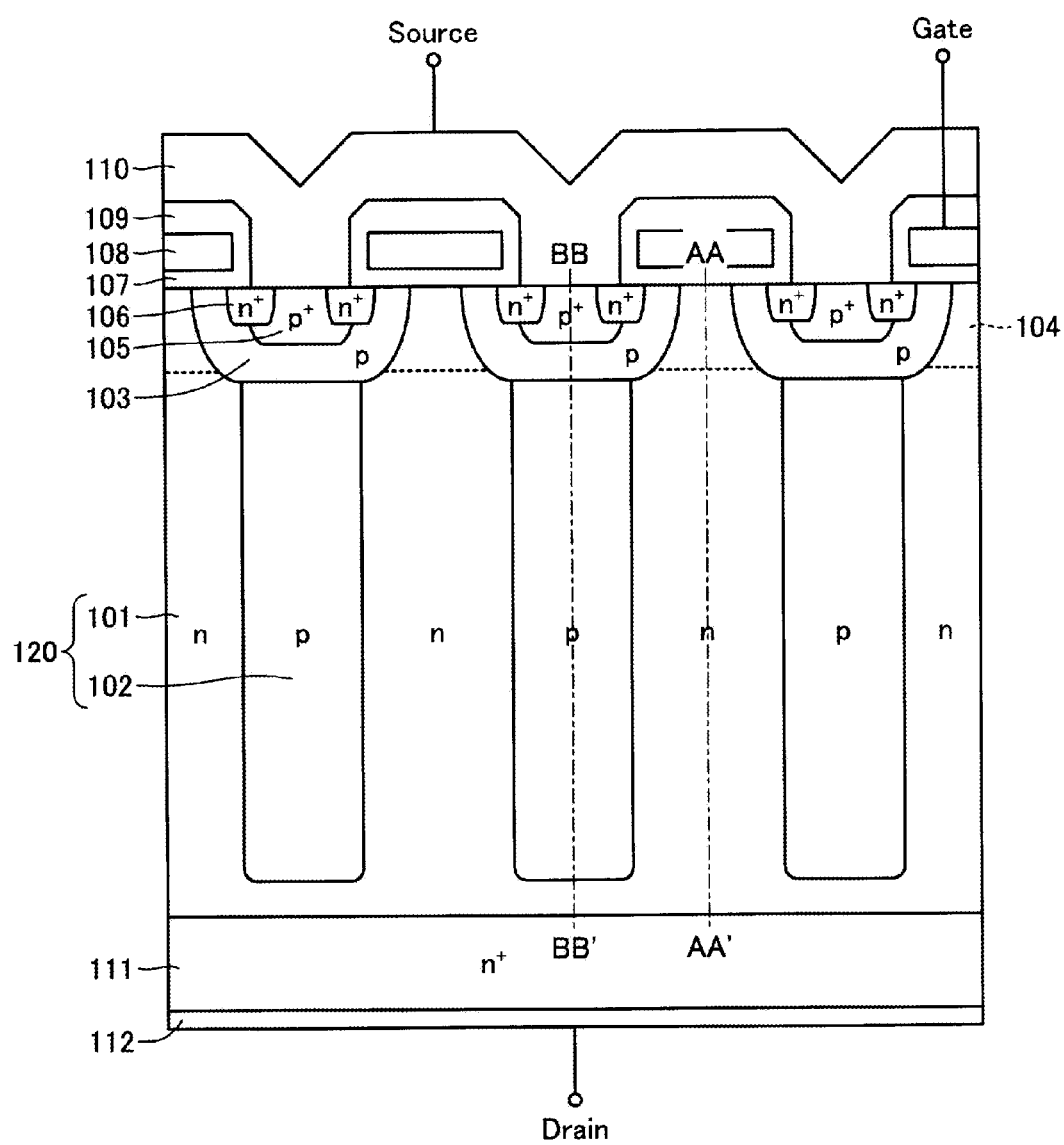
FIG. 39 is a sectional view showing a heretofore known superjunction semiconductor device.
Figure 40:
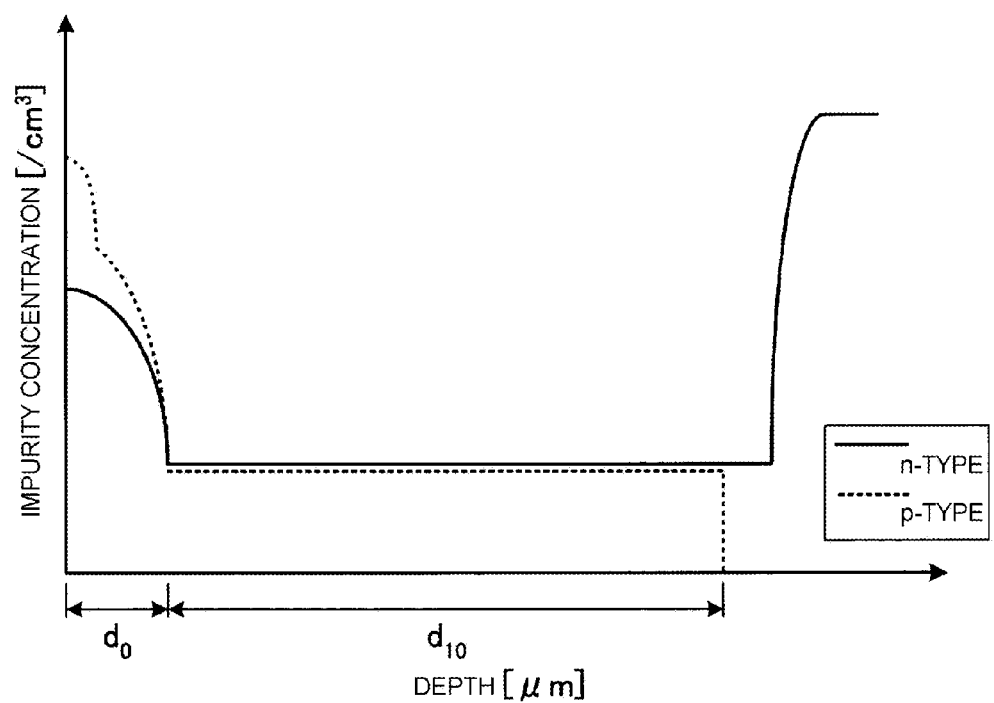
FIG. 40 is a diagram showing impurity concentration distributions of the superjunction semiconductor device shown in FIG. 39.
Figure 41:
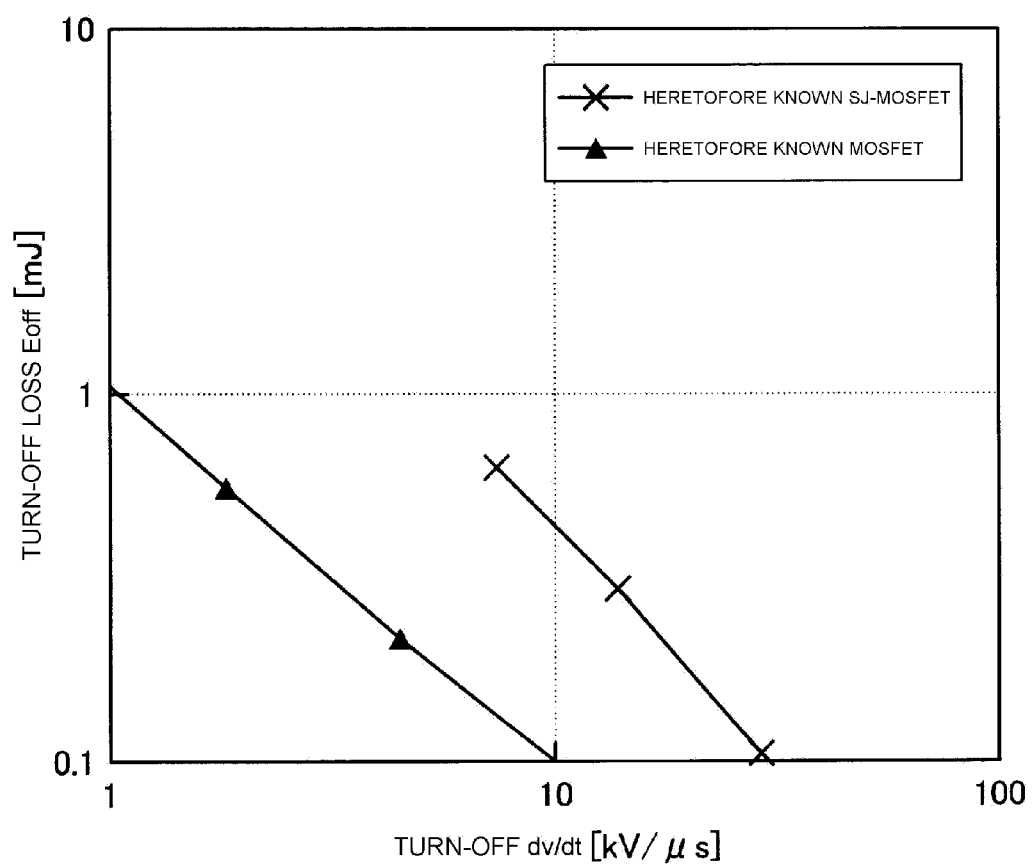
FIG. 41 is a diagram showing turn off characteristics in the heretofore known superjunction semiconductor device.

Main sectional views of manufacturing steps when using the manufacturing steps of the semiconductor device according to Embodiment 10 for the manufacturing steps of the semiconductor device according to Embodiment 8 are as in FIG. 38. FIG. 38 is sectional views showing, in order, manufacturing steps of a semiconductor device according to Embodiment 12. Firstly, manufacturing is carried out using the same procedure as in FIGS. 31(a) to (c). Next, the low concentration p-epitaxial layer 47 is epitaxially grown and embedded inside the deep trench 46, as in FIG. 38(a). Furthermore, as shown in FIG. 38(b), a medium concentration p-layer 58 is epitaxially grown and embedded inside the low concentration p-epitaxial layer 47. Continuing, as shown in FIG. 38(c), a high concentration p-layer 59 is epitaxially grown and embedded inside the low concentration p-epitaxial layer 47. Subsequently, as shown in FIG. 38(d), a planarization of the surface is carried out using CMP, or the like. A final device form is as in FIG. 38 (e).

The invention not being limited to the heretofore described embodiments, various changes are possible. For example, the dimensions, concentrations, and the like, shown in the embodiments being examples, the invention is not limited to these values. Also, in each embodiment, the first conductivity type is taken to be the n-type and the second conductivity type taken to be the p-type, but the invention is established in the same way even when taking the first conductivity type to be the p-type and the second conductivity type to be the n-type. Also, the invention, not being limited to a MOSFET, can also be applied to an IGBT, a bipolar transistor, an FWD (free wheeling diode), a Schottky diode, or the like. Also, in Embodiment 3 to Embodiment 12, in the same way as in Embodiment 2, a configuration having a trench gate structure instead of a planar gate structure may be adopted.

INDUSTRIAL APPLICABILITY

As heretofore described, the semiconductor device according to the invention is useful as a high-power semiconductor device, and in particular, is suitable as a semiconductor device such as a MOSFET, IGBT, bipolar transistor, FWD, or Schottky diode, having a parallel p-n structure in a drift portion, wherein it is possible to balance an increase in breakdown voltage and an increase in current capacitance.

DESCRIPTION OF REFERENCE NUMERALS AND SIGNS 1 n-type region
2 p-type region
3 p-base region
4 n-type surface region
5 p$^+$ contact region
6 n$^+$ source region
7 Gate insulating film
8 Gate electrode
9 Interlayer insulating film
10 Source electrode
11 n$^+$ drain region
12 Drain electrode
20 Parallel p-n layer
21 n-type high concentration region
22 n-type low concentration region

The invention claimed is:
1. A semiconductor device, characterized by comprising:
an active portion provided on a first main surface side;
a low resistance layer provided on a second main surface side;

a parallel p-n layer, provided between the active portion and low resistance layer, wherein a first conductivity type region and second conductivity type region are disposed alternately;

a second conductivity type base region, provided on the first main surface side of the second conductivity type region, that has an impurity concentration higher than that of the second conductivity type region; and a first conductivity type high concentration region, provided on the first main surface side of the first conductivity type region, that is positioned farther to the second main surface side than an end portion on the second main surface side of the second conductivity type base region, and has an impurity concentration higher than an impurity concentration on the second main surface side of the first conductivity type region wherein the first conductivity type high concentration region has one-eighth or more and one-fourth or less the thickness of the first conductivity type region positioned at a depth from the end portion on the second main surface side of the second conductivity type base region to the end portion on the second main surface side of the second conductivity type region.

2. The semiconductor device according to claim 1, characterized in that the first conductivity type high concentration region has an impurity concentration 1.2 times or more, 3 times or less, greater than that of a region, excluding the first conductivity type high concentration region, of the first conductivity type region positioned at a depth from the end portion on the second main surface side of the second conductivity type base region to an end portion on the second main surface side of the second conductivity type region.

3. The semiconductor device according to claim 1, characterized by further comprising: a first conductivity type surface region, provided on the first main surface side of the first conductivity type region, that is in contact with an end portion on the first main surface side of the first conductivity type high concentration region, wherein a first conductivity type surface region is provided between adjacent second conductivity type base regions and is adjacent to the second conductivity type base region.

4. The semiconductor device according to claim 3, characterized in that the first conductivity type surface region is provided to the same depth as the second conductivity type base region, or shallower on the first main surface side than the second conductivity type base region.

5. The semiconductor device according to claim 3, characterized in that the first conductivity type surface region has an impurity concentration higher than that of the first conductivity type high concentration region.

6. The semiconductor device according to claim 3, characterized in that the first conductivity type high concentration region, including also the first conductivity type surface region, has an impurity concentration 1.2 times or more, 3 times or less, greater than that of a region, excluding the first conductivity type high concentration region, of the first conductivity type region positioned at a depth from the end portion on the second main surface side of the second conductivity type base region to the end portion on the second main surface side of the second conductivity type region.

7. The semiconductor device according to claim 1, characterized in that the first conductivity type high concentration region has an impurity concentration 1.2 times or more, 3 times or less, greater than that of a region of the second conductivity type region adjacent to the first conductivity type high concentration region.

8. The semiconductor device according to claim 1, characterized by further comprising: a second conductivity type high concentration region on the first main surface side that has an impurity concentration higher than the impurity concentration on the second main surface side of the second conductivity type region.

9. The semiconductor device according to claim 8, characterized in that the first conductivity type high concentration region has an impurity concentration 1.5 times or more, 3 times or less, greater than that of a region, excluding the first conductivity type high concentration region, of the first conductivity type region positioned at a depth from the end portion on the second main surface side of the second conductivity type base region to the end portion on the second main surface side of the second conductivity type region.

10. The semiconductor device according to claim 8, characterized in that the second conductivity type high concentration region has one-eighth or more, one-half or less, the thickness of the second conductivity type region.

11. The semiconductor device according to claim 8, characterized in that the second conductivity type high concentration region has the same thickness as the first conductivity type high concentration region.

12. The semiconductor device according to claim 8, characterized in that a region of the second conductivity type region excluding the second conductivity type high concentration region has the same impurity concentration as a region of the first conductivity type region excluding the first conductivity type high concentration region.

13. The semiconductor device according to claim 8, characterized in that a region of the second conductivity type region excluding the second conductivity type high concentration region is such that the impurity concentration gradually decreases from the first main surface side to the second main surface side.

14. The semiconductor device according to claim 8, characterized in that the first conductivity type high concentration region and second conductivity type high concentration region are such that the impurity concentration gradually decreases from the first main surface side to the second main surface side.

15. The semiconductor device according to claim 8, characterized in that the second conductivity type high concentration region is provided deeper on the second main surface side than the end portion on the second main surface side of the first conductivity type high concentration region.

16. The semiconductor device according to claim 15, characterized in that the region of the second conductivity type high concentration region provided deeper on the second main surface side than the end portion on the second main surface side of the first conductivity type high concentration region has an impurity concentration higher than that of the first conductivity type region adjacent to the region, and has an impurity concentration lower than that of the second conductivity type high concentration region.

17. The semiconductor device according to claim 15, characterized in that the region of the second conductivity type high concentration region provided deeper on the second main surface side than the end portion on the second main surface side of the first conductivity type high concentration region has an impurity concentration 1.2 times or more greater than that of the first conductivity type region adjacent to the region.

18. The semiconductor device according to claim 1, characterized in that the planar form of the first conductivity type region and second conductivity type region is a striped form, a hexagonal lattice form, or a square form.

19. The semiconductor device according to claim 18, characterized in that the first conductivity type high concentration region and the second the conductivity type high concentration region are equal to each other in the depths from the end on the second main surface side of the second conductivity type base region to the end on the second surface side of the second conductivity type region, and that a second conductivity type medium concentration region adjacent to the first conductivity type region is provided between the second conductivity type region and the second conductivity type high concentration, wherein the second conductivity type medium concentration region has a lower impurity concentration than that of the second conductivity type high concentration region.

* * * * *